United States Patent
Okamoto et al.

(10) Patent No.: US 10,163,967 B2
(45) Date of Patent: Dec. 25, 2018

(54) IMAGING DEVICE, METHOD FOR OPERATING THE SAME, AND ELECTRONIC DEVICE

(71) Applicant: Semiconductor Energy Laboratory Co., Ltd., Atsugi-shi, Kanagawa-ken (JP)

(72) Inventors: Yuki Okamoto, Kanagawa (JP); Seiichi Yoneda, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 15 days.

(21) Appl. No.: 15/178,801

(22) Filed: Jun. 10, 2016

(65) Prior Publication Data

US 2016/0366360 A1 Dec. 15, 2016

(30) Foreign Application Priority Data

Jun. 12, 2015 (JP) .................................. 2015-118829

(51) Int. Cl.
*H04N 5/378* (2011.01)
*H01L 27/146* (2006.01)
(Continued)

(52) U.S. Cl.
CPC .. *H01L 27/14645* (2013.01); *H01L 27/14616* (2013.01); *H01L 27/14632* (2013.01);
(Continued)

(58) Field of Classification Search
None
See application file for complete search history.

(56) References Cited

U.S. PATENT DOCUMENTS 5,594,391 A 1/1997 Yoshizawa
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Twyler L Haskins
*Assistant Examiner* — Wesley J Chiu
(74) *Attorney, Agent, or Firm* — Fish & Richardson P.C.

(57) ABSTRACT

An imaging device with low power consumption. The imaging device includes a plurality of pixels arranged in a matrix, a first circuit, a second circuit, a third circuit, and a fourth circuit. The first circuit has a function of converting an analog signal into a digital signal. The second circuit has a function of detecting a difference between image data of a first frame and image data of a second frame. The third circuit has a function of controlling the frequency of a clock signal. The fourth circuit has a function of generating clock signals of a plurality of frequencies.

12 Claims, 54 Drawing Sheets

(51) Int. Cl.
*H01L 31/0272* (2006.01)
*H01L 31/032* (2006.01)
*H04N 5/14* (2006.01)
*H04N 5/335* (2011.01)
*H04N 5/3745* (2011.01)

(52) U.S. Cl.
CPC .. *H01L 27/14636* (2013.01); *H01L 27/14665* (2013.01); *H01L 27/14696* (2013.01); *H01L 31/0272* (2013.01); *H01L 31/0322* (2013.01); *H04N 5/147* (2013.01); *H04N 5/335* (2013.01); *H04N 5/3745* (2013.01)

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,771,202 B2 | 8/2004 | Watanabe et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,836,626 B2 | 9/2014 | Ikeda | |
| 8,854,286 B2 | 10/2014 | Yamazaki et al. | |
| 8,921,853 B2 | 12/2014 | Yamazaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0025800 A1* | 2/2003 | Hunter | G08B 13/19608 348/208.13 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0062864 A1* | 3/2005 | Mabuchi | H04N 3/155 348/294 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0132868 A1* | 6/2007 | Lee | H03M 1/1019 348/308 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0090204 A1 | 4/2011 | Yamazaki et al. | |
| 2011/0102696 A1 | 5/2011 | Yamazaki et al. | |
| 2011/0115839 A1 | 5/2011 | Takahashi et al. | |
| 2011/0220889 A1* | 9/2011 | Kurokawa | G02F 1/1362 257/43 |
| 2013/0063627 A1* | 3/2013 | Hashimoto | H04N 5/378 348/241 |
| 2013/0222584 A1 | 8/2013 | Aoki et al. | |
| 2014/0232932 A1* | 8/2014 | LiKamWa | H04N 5/341 348/372 |
| 2014/0347536 A1* | 11/2014 | Senda | H04N 5/3741 348/308 |
| 2014/0361296 A1 | 12/2014 | Ikeda | |
| 2014/0368417 A1 | 12/2014 | Yamazaki et al. | |
| 2015/0172595 A1* | 6/2015 | Furumochi | H04N 5/23245 348/216.1 |
| 2015/0256161 A1 | 9/2015 | Okamoto et al. | |
| 2015/0332568 A1 | 11/2015 | Kurokawa | |
| 2016/0021314 A1 | 1/2016 | Kurokawa et al. | |
| 2016/0028347 A1 | 1/2016 | Okamoto et al. | |
| 2016/0329024 A1 | 11/2016 | Maeda | |

FOREIGN PATENT DOCUMENTS

| | | | |
|---|---|---|---|
| JP | 56-086509 A | 7/1981 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |

(56) References Cited

FOREIGN PATENT DOCUMENTS

| | | |
|---|---|---|
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-119711 A | 6/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5) InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th Internatioanl Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW'02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Gao.X et al., "Jitter Analysis and a Benchmarking Figure-of-Merit for Phase-Locked Loops", IEEE Transactions on Circuits and Systems, Feb. 1, 2009, vol. 56, No. 2, pp. 117-121.

Funatsu.R et al., "133Mpixel 60fps CMOS Image Sensor with 32-Column Shared High-Speed Column-Parallel SAR ADCs", ISSCC 2015 (Digest of Technical Papers. IEEE International Solid-State Circuits Conference), Feb. 23, 2015, pp. 112-113.

\* cited by examiner

25

FIG. 5
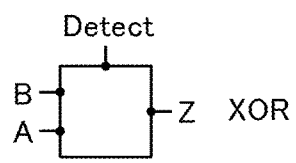
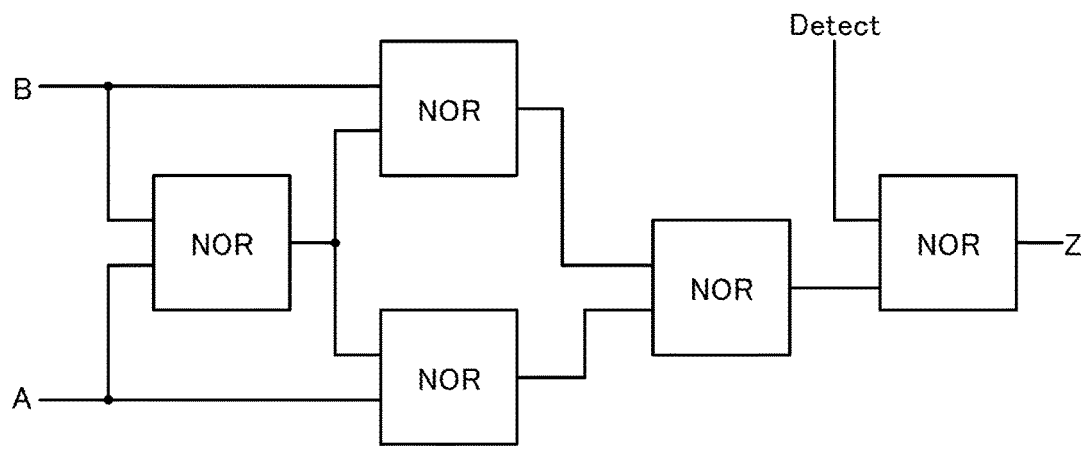

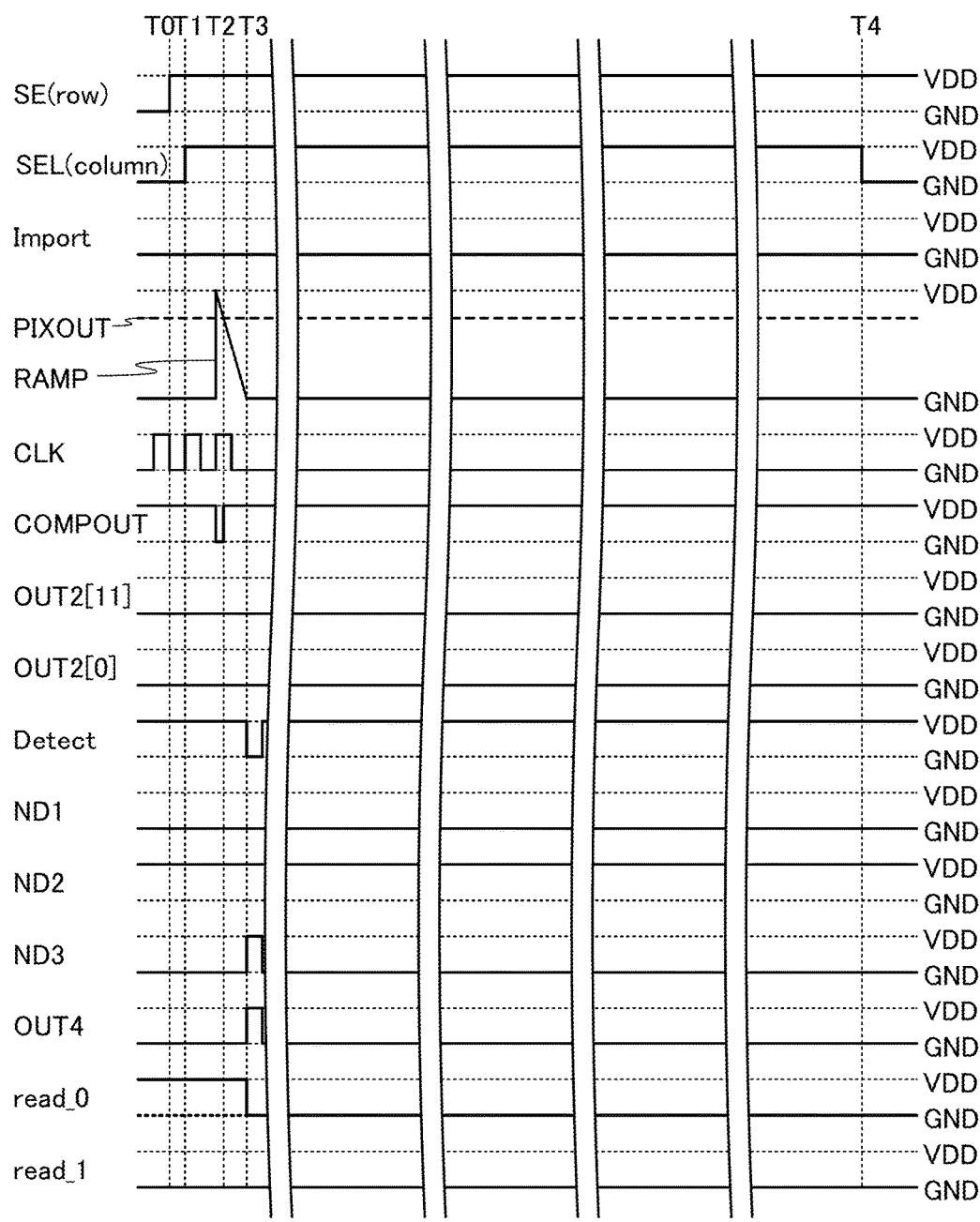

FIG. 34A1
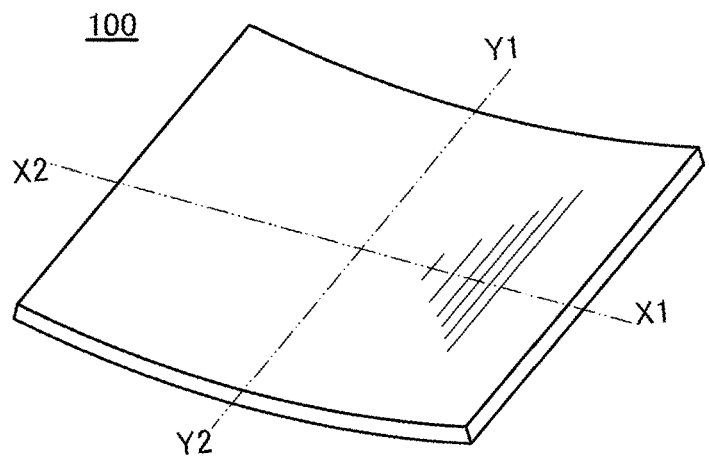
FIG. 34A2
FIG. 34A3
FIG. 34B1
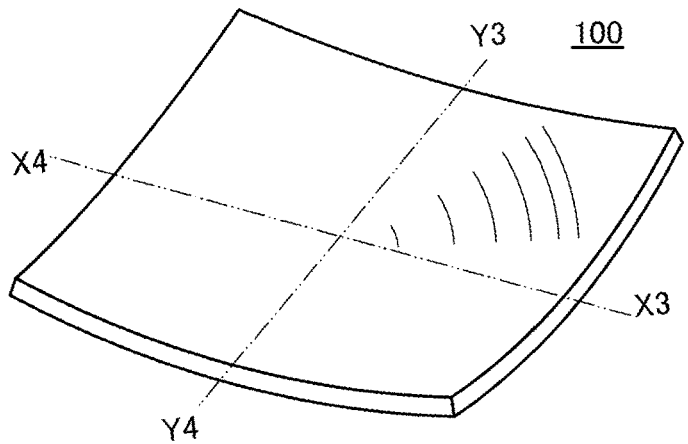
FIG. 34B2
FIG. 34B3
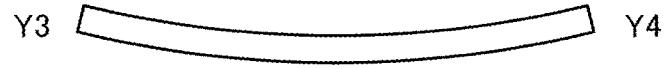

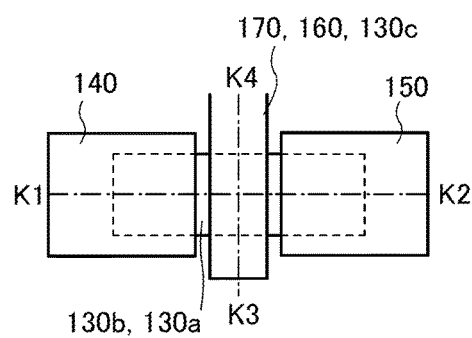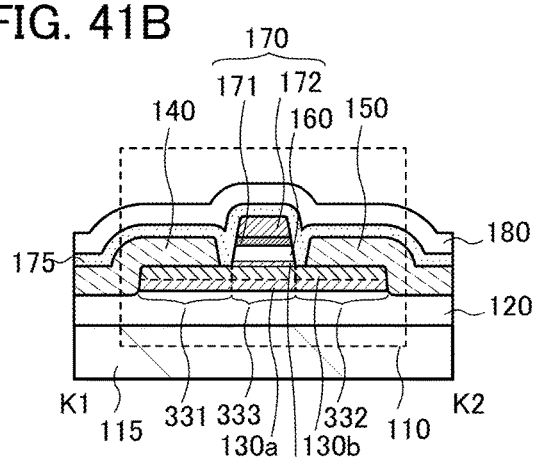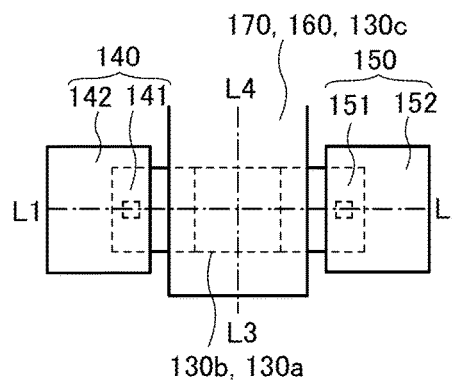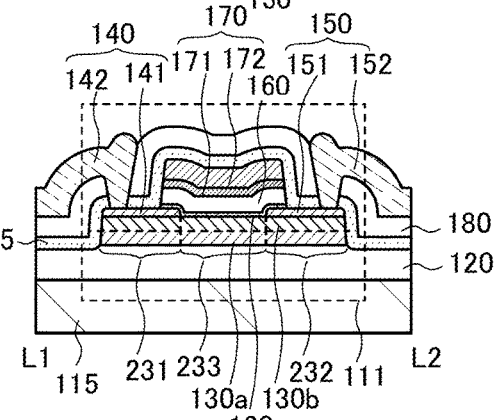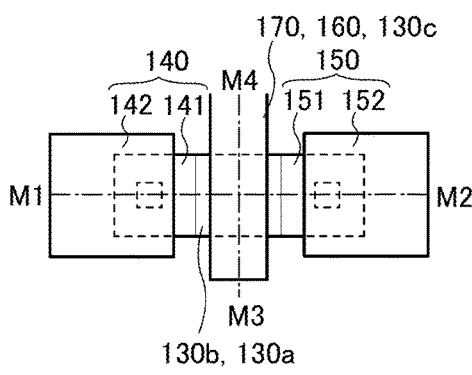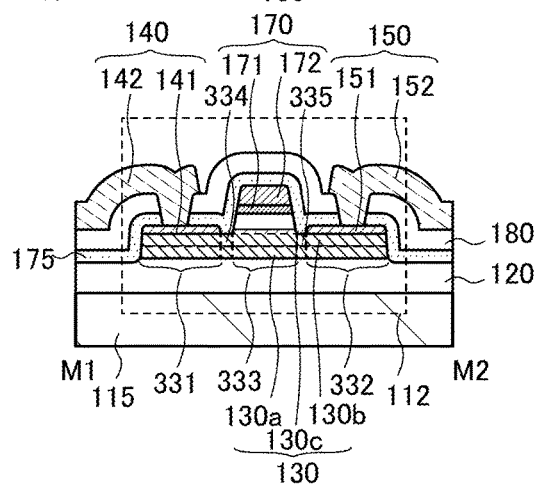

FIG. 46A  out-of-plane method CAAC-OS
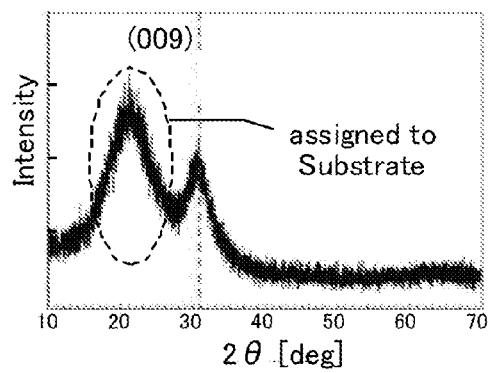
FIG. 46B
in-plane method φ scan
CAAC-OS
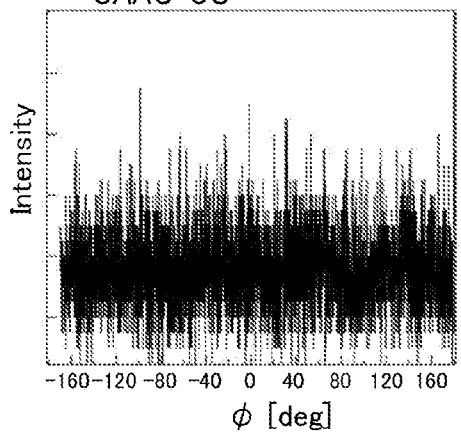
FIG. 46C
in-plane method φ scan
single crystal OS
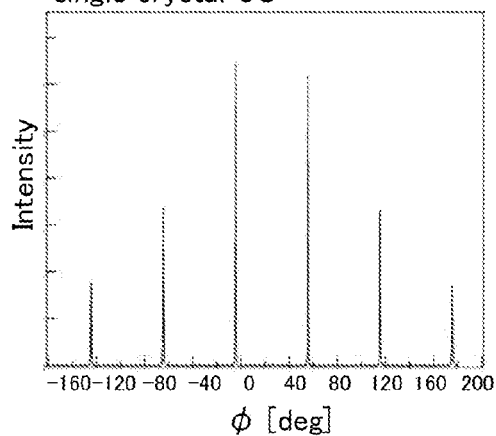
FIG. 46D
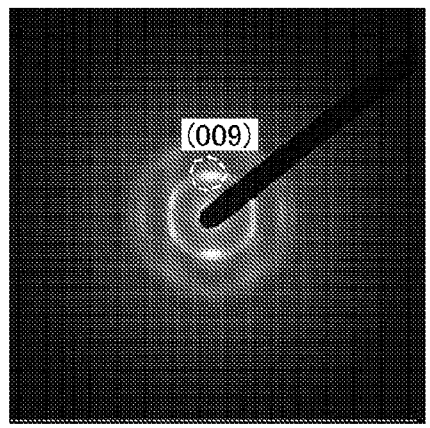
FIG. 46E
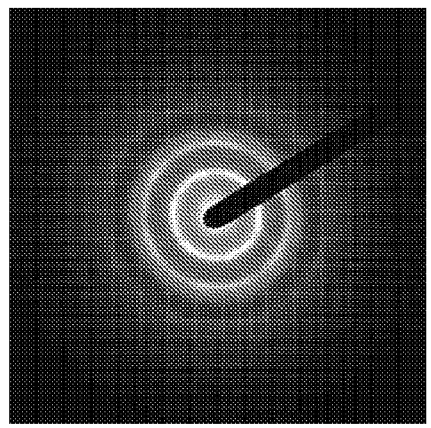

FIG. 49A
FIG. 49B
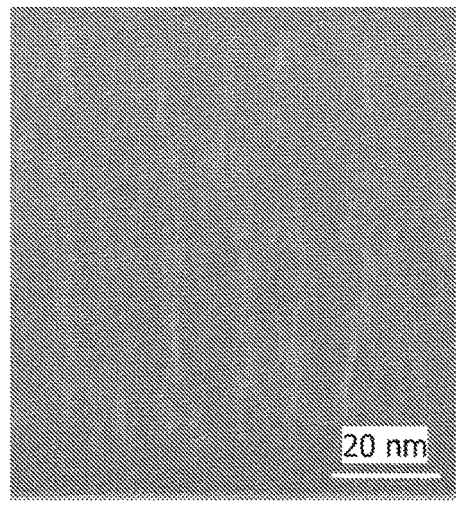
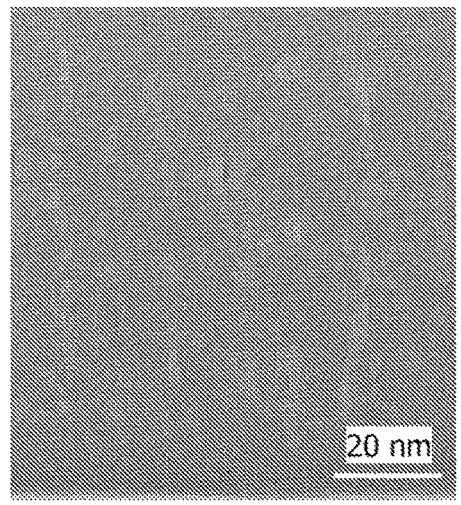

FIG. 52A
FIG. 52B
FIG. 52C
FIG. 52D
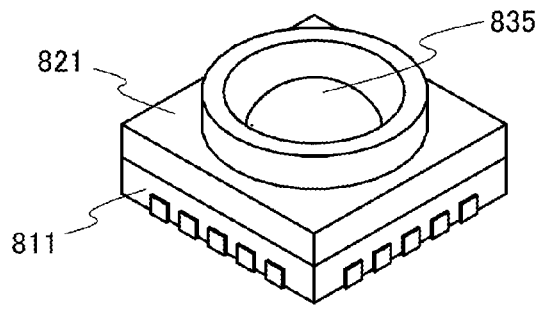
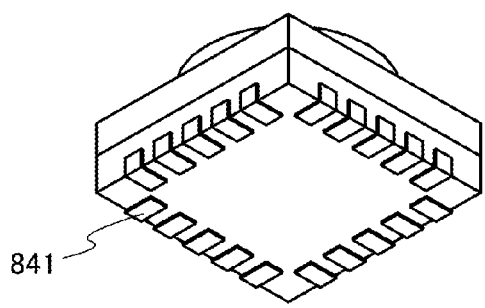
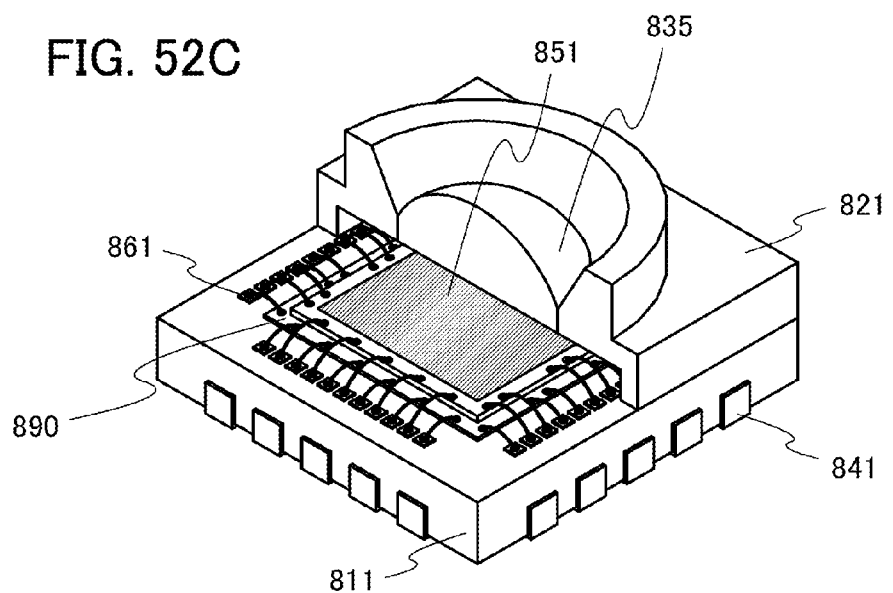
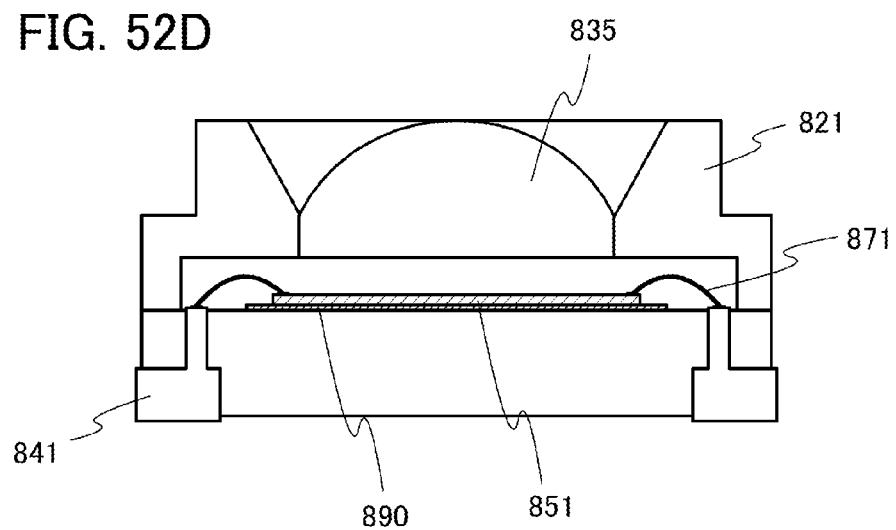

# IMAGING DEVICE, METHOD FOR OPERATING THE SAME, AND ELECTRONIC DEVICE

BACKGROUND OF THE INVENTION

1. Field of the Invention

One embodiment of the present invention relates to an imaging device and an operation method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

As a semiconductor material applicable to a transistor, an oxide semiconductor has been attracting attention. For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor including an oxide semiconductor is used in part of a pixel circuit.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-119711

SUMMARY OF THE INVENTION

Known examples of a device to which an imaging device is applied include a monitoring camera system. A monitoring camera system consumes a lot of power because it keeps on capturing moving images for a long time, for example. In addition, an expensive memory device with high capacity is needed to store imaging data.

When a stationary object is imaged by a fixed monitoring camera under an environment that can be regarded as unchanging, there is almost no difference between imaging data of one frame and that of another frame. In other words, the monitoring camera keeps on recording the same imaging data when uneventful.

In such a case, it is desirable that whether an image is changed or not be detected and imaging be performed only when needed. When an imaging device having such a function is used, the monitoring camera system can have reduced power consumption without using a separate sensor or the like. Moreover, an inexpensive memory device with lower capacity can be employed for the monitoring camera system.

In view of the above, an object of one embodiment of the present invention is to provide an imaging device with low power consumption. Another object is to provide an imaging device capable of detecting whether an image is changed or not. Another object is to provide an imaging device in which the clock frequency is lowered when no change occurs in an image. Another object is to provide an imaging device with high resolution. Another object is to provide a highly integrated imaging device. Another object is to provide an imaging device capable of imaging under a low illuminance condition. Another object is to provide an imaging device with a wide dynamic range. Another object is to provide an imaging device that can be used in a wide temperature range. Another object is to provide an imaging device with a high aperture ratio. Another object is to provide an imaging device with high reliability. Another object is to provide a novel imaging device or the like. Another object is to provide a novel semiconductor device or the like. Another object is to provide a method for operating any of the above imaging devices.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging device in which the clock frequency is lowered in a period in which a difference between frames is detected.

One embodiment of the present invention is an imaging device that includes a pixel, a first circuit, a second circuit, a third circuit, and a fourth circuit. The pixel is electrically connected to the first circuit. The first circuit is electrically connected to the second circuit. The second circuit is electrically connected to the third circuit. The third circuit is electrically connected to the fourth circuit. The fourth circuit is electrically connected to the first circuit. The first circuit has a function of converting an analog signal into a digital signal. The second circuit has a function of detecting a difference between image data of a first frame and image data of a second frame. The third circuit has a function of controlling frequency of a clock signal. The fourth circuit has a function of generating clock signals of a plurality of frequencies.

The imaging device can have the following structure. The first circuit includes a counter circuit. The counter circuit includes as many output terminals as the bit number of the output. The second circuit includes a fifth circuit and a sixth circuit. The fifth circuit includes a first input terminal, a second input terminal, and a first output terminal. The fifth circuit operates in accordance with a logic signal supplied to the first input terminal. The fifth circuit has a function of retaining a logic signal supplied to the second input terminal and a function of outputting the logic signal from the first output terminal. The sixth circuit includes a third input terminal, a fourth input terminal, and a second output terminal. The sixth circuit has a function of outputting a first logic signal from the second output terminal when a logic signal supplied to the third input terminal and a logic signal supplied to the fourth input terminal are the same. The sixth circuit has a function of outputting a second logic signal from the second output terminal when the logic signal supplied to the third input terminal and the logic signal supplied to the fourth input terminal are different. The first input terminal is electrically connected to the output terminal of the counter circuit for a high-order bit. The first output terminal is electrically connected to the third input terminal. The fourth input terminal is electrically connected to the output terminal of the counter circuit for a low-order bit. The second output terminal is electrically connected to the third circuit.

The imaging device can have the following structure. The fourth circuit includes first to fourth transistors and a seventh circuit. A gate of the first transistor is electrically connected to one of a source and a drain of the third transistor. A gate of the second transistor is electrically connected to one of a source and a drain of the fourth transistor. The other of the source and the drain of the third transistor is electrically connected to the other of the source and the drain of the fourth transistor. The seventh circuit includes a fifth input terminal, a sixth input terminal, a seventh input terminal, an eighth input terminal, and a third output terminal. The fifth input terminal is electrically connected to a wiring supplying a first potential. The sixth input terminal is electrically connected to a source or a drain of the first transistor. The seventh input terminal is electrically connected to a source or a drain of the second transistor. The eighth input terminal is electrically connected to the third output terminal. The third output terminal is electrically connected to the first circuit. The seventh circuit includes an inverter circuit, a fifth transistor, and a sixth transistor. An output terminal of the inverter circuit is electrically connected to one of a source and a drain of the fifth transistor. The output terminal of the inverter circuit is electrically connected to one of a source and a drain of the sixth transistor. The other of the source and the drain of the fifth transistor is electrically connected to the other of the source and the drain of the sixth transistor. A high power supply potential input terminal of the inverter circuit functions as the fifth input terminal. A gate of the fifth transistor functions as the sixth input terminal. A gate of the sixth transistor functions as the seventh input terminal. An input terminal of the inverter circuit functions as the eighth input terminal. The other of the source and the drain of the fifth transistor and the other of the source and the drain of the sixth transistor function as the third output terminal.

In the fourth circuit, an odd number (three or more) of stages of the seventh circuits may be connected in series, and the eighth input terminal of the seventh circuit in the first stage may be electrically connected to the third output terminal of the seventh circuit in the final stage.

It is preferable that in the fourth circuit, the third transistor and the fourth transistor each include an oxide semiconductor in an active layer and that the oxide semiconductor contain In, Zn, and M (M is Al, Ti, Ga, Sn, Y, Zr, La, Ce, Nd, or Hf).

The imaging device can have the following structure. The pixel includes seventh to tenth transistors a photoelectric conversion element. One electrode of the photoelectric conversion element is electrically connected to one of a source and a drain of the seventh transistor. The other of the source and the drain of the seventh transistor is electrically connected to one of a source and a drain of the eighth transistor. The other of the source and the drain of the seventh transistor is electrically connected to one electrode of a capacitor. The other of the source and the drain of the seventh transistor is electrically connected to a gate of the ninth transistor. One of a source and a drain of the ninth transistor is electrically connected to one of a source and a drain of the tenth transistor.

It is preferable that the seventh to tenth transistors each include an oxide semiconductor in an active layer and that the oxide semiconductor contain In, Zn, and M (M is Al, Ti, Ga, Sn, Y, Zr, La, Ce, Nd, or Hf).

The photoelectric conversion element may include selenium or a compound containing selenium in a photoelectric conversion layer. For example, amorphous selenium or crystalline selenium can be used as selenium.

Another embodiment of the present invention is a method for operating an imaging device, which includes a first step of supplying a first clock signal to an A/D converter circuit; a second step of imaging a first frame and converting imaged analog data into digital data with the A/D converter circuit; a third step of storing most significant bit data of the first frame in a comparison circuit; a fourth step of supplying a second clock signal to the A/D converter circuit; a fifth step of imaging a second frame and converting imaged analog data into digital data with the A/D converter circuit; a sixth step of transmitting least significant bit data of the second frame to the comparison circuit; and a seventh step of determining whether or not a logic signal of the most significant bit data of the first frame is the same as a logic signal of the least significant bit data of the second frame with the comparison circuit. The process returns to the first step when the two logic signals are the same or returns to the fifth step when the two logic signals are different.

When the bit number of the output of the A/D converter circuit is k (k is a natural number), the frequency of the first clock signal is f1, and the frequency of the second clock signal is f2, the equation $f2=f1/2^{(k-1)}$ can be satisfied.

According to one embodiment of the present invention, an imaging device with low power consumption can be provided. According to one embodiment of the present invention, an imaging device capable of detecting whether an image is changed or not can be provided. According to one embodiment of the present invention, an imaging device in which the clock frequency is lowered when no change occurs in an image can be provided. According to one embodiment of the present invention, an imaging device with high resolution can be provided. According to one embodiment of the present invention, a highly integrated imaging device can be provided. According to one embodiment of the present invention, an imaging device capable of imaging under a low illuminance condition can be provided. According to one embodiment of the present invention, an imaging device with a wide dynamic range can be provided. According to one embodiment of the present invention, an imaging device that can be used in a wide temperature range can be provided. According to one embodiment of the present invention, an imaging device with a high aperture ratio can be provided. According to one embodiment of the present invention, an imaging device with high reliability can be provided. According to one embodiment of the present invention, a novel imaging device or the like can be provided. According to one embodiment of the present invention, a novel semiconductor device or the like can be provided. According to one embodiment of the present invention, a method for operating any of the above imaging devices can be provided.

Note that one embodiment of the present invention is not limited to these effects. For example, depending on circumstances or conditions, one embodiment of the present invention produces another effect in some cases. Furthermore, depending on circumstances or conditions, one embodiment of the present invention does not produce the above effects in some cases.

BRIEF DESCRIPTION OF THE DRAWINGS

FIG. 5 is a circuit diagram illustrating an exclusive OR circuit.
FIG. 14 is a timing chart illustrating operation of an imaging device.
FIGS. 34A1, 34A2, 34A3, 34B1, 34B2, and 34B3 illustrate a bent imaging device.
FIGS. 41A to 41F are top views and cross-sectional views illustrating transistors.
FIGS. 46A to 46E show structural analysis of a CAAC-OS and a single crystal oxide semiconductor by XRD and selected-area electron diffraction patterns of a CAAC-OS.
FIGS. 49A and 49B show cross-sectional TEM images of an a-like OS.
FIGS. 52A to 52D are perspective views and a cross-sectional view illustrating a package including an imaging device.

DETAILED DESCRIPTION OF THE INVENTION

Figure 1:
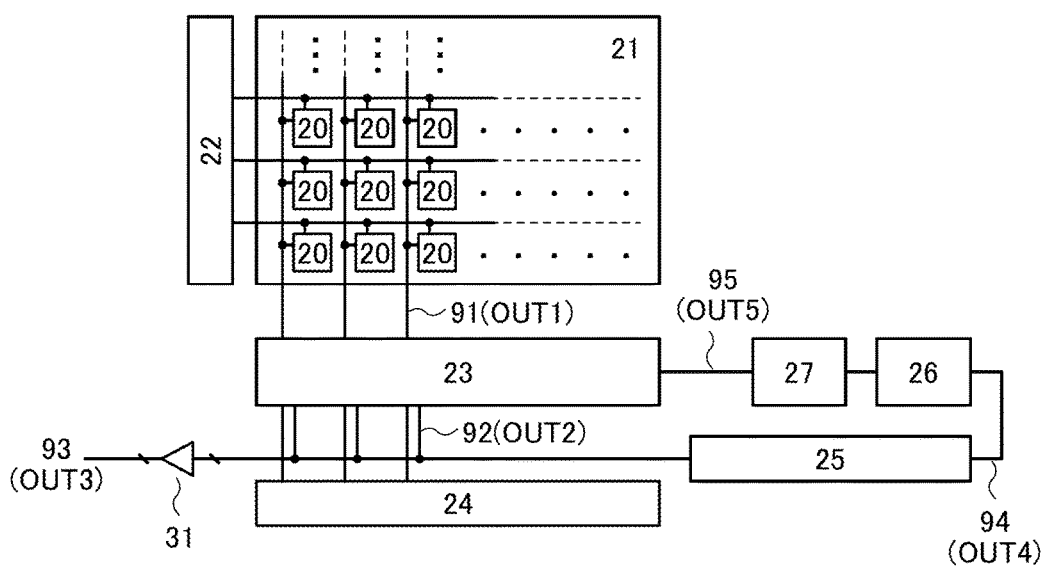
FIG. 1 is a block diagram illustrating an imaging device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be construed as being limited to the description of the embodiments below. Note that in structures of the invention described below, the same portions or portions having similar functions are denoted by the same reference numerals in different drawings, and description thereof is not repeated in some cases. The same components are denoted by different hatching patterns in different drawings, or the hatching patterns are omitted in some cases.

Note that the ordinal numbers such as "first" and "second" in this specification are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in general, a potential (voltage) is relative and is determined depending on the amount relative to a certain potential. Therefore, even when the expression "ground," "GND," or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Embodiment 1

In this embodiment, an imaging device that is one embodiment of the present invention will be described with reference to drawings.

An imaging device of one embodiment of the present invention has a function of comparing high-order bit data of a reference frame and low-order bit data of a target frame to detect a difference. In the difference detection period, the frequency of a clock signal (CLK) supplied to an A/D converter circuit is set low. After a difference is detected, the frequency of a clock signal (CLK) is set high and a new frame can be imaged. Note that in the present specification, a reference frame means a frame imaged to obtain a reference image, and a target frame means a frame imaged in a difference detection period.

For example, in imaging by a monitoring camera or the like, before a change occurs in the initially obtained image, a new image is not obtained and an A/D converter circuit can be operated with a clock signal (CLK) of a low frequency. As a result, power consumption can be reduced.

FIG. 1 illustrates an imaging device of one embodiment of the present invention. The imaging device includes a pixel array 21 that includes pixels 20 arranged in a matrix; a circuit 22 (row driver) that has a function of driving the pixels 20; a circuit 23 (A/D converter circuit) that has a function of performing digital conversion of analog signals output from the pixels 20; a circuit 24 (column driver) that has a function of selecting and reading the data converted by the circuit 23; a circuit 25 that has a function of detecting a difference between frames; a circuit 26 that has a function of controlling the frequency of a clock signal (CLK) supplied to the circuit 23; a circuit 27 that has a function of generating clock signals of a plurality of frequencies and supplying them to the circuit 23; and a buffer circuit 31 that has a function of amplifying an input signal. Note that a structure not including the buffer circuit 31 may be employed.

The connection between the above components will be described. The pixels 20 in each row are electrically connected to the circuit 22 through one wiring. The pixels 20 in each column are electrically connected to the circuit 23 through a wiring 91 (OUT1). The circuit 23 is electrically connected to the circuit 24 and the circuit 25, the circuit 25 is electrically connected to the circuit 26, the circuit 26 is electrically connected to the circuit 27, and the circuit 27 is electrically connected to the circuit 23. The circuit 23 is electrically connected to an input terminal of the buffer circuit 31, and an output terminal of the buffer circuit 31 is electrically connected to a wiring 93 (OUT3).

Figure 2:
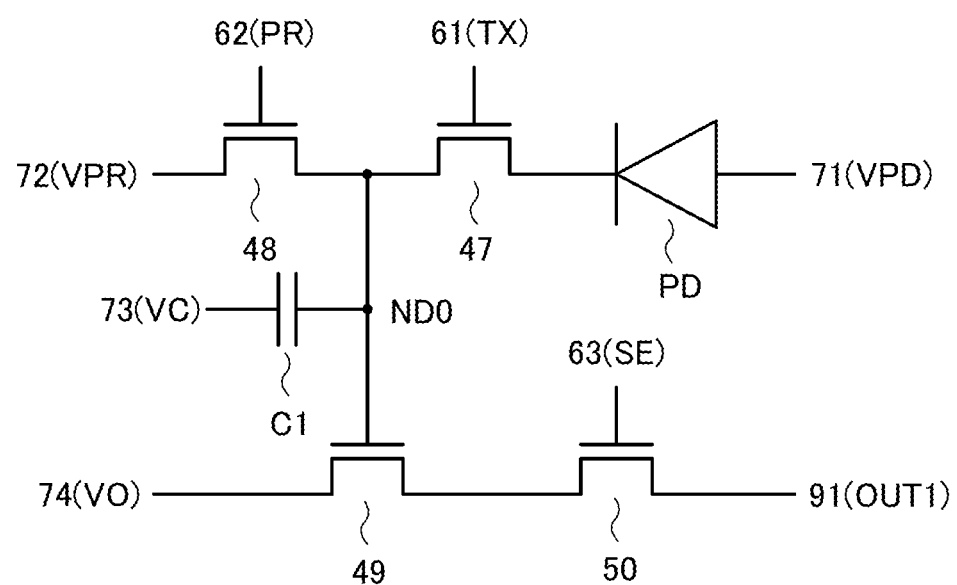
FIG. 2 is a circuit diagram illustrating a pixel.

The pixel 20 can have a circuit configuration illustrated in FIG. 2. In the pixel 20, one electrode of a photoelectric conversion element PD is electrically connected to one of a source electrode and a drain electrode of a transistor 47. The other of the source electrode and the drain electrode of the transistor 47 is electrically connected to one of a source electrode and a drain electrode of a transistor 48. The other of the source electrode and the drain electrode of the transistor 47 is electrically connected to one electrode of a capacitor C1. The other of the source electrode and the drain electrode of the transistor 47 is electrically connected to a gate electrode of a transistor 49. One of a source electrode and a drain electrode of the transistor 49 is electrically connected to one of a source electrode and a drain electrode of a transistor 50. Note that the circuit configuration of the pixel 20 illustrated in FIG. 2 is an example and the pixel 20 may have a different circuit configuration as long as output current or output voltage can be controlled in accordance with the intensity of light.

The other electrode of the photoelectric conversion element PD is electrically connected to a wiring 71 (VPD). The other of the source electrode and the drain electrode of the transistor 48 is electrically connected to a wiring 72 (VPR). The other electrode of the capacitor C1 is electrically connected to a wiring 73 (VC). The other of the source electrode and the drain electrode of the transistor 49 is electrically connected to a wiring 74 (VO). The other of the source electrode and the drain electrode of the transistor 50 is electrically connected to the wiring 91 (OUT1).

Here, the wiring 71 (VPD), the wiring 72 (VPR), the wiring 73 (VC), and the wiring 74 (VO) can function as power supply lines. For example, the wiring 71 (VPD) and the wiring 73 (VC) can function as low power supply potential lines, and the wiring 72 (VPR) and the wiring 74 (VO) can function as high power supply potential lines.

A gate electrode of the transistor 47 is electrically connected to a wiring 61 (TX). A gate electrode of the transistor 48 is electrically connected to a wiring 62 (PR). A gate electrode of the transistor 50 is electrically connected to a wiring 63 (SE).

The wiring 61 (TX), the wiring 62 (PR), and the wiring 63 (SE) can each function as a signal line that controls the on/off state of the transistor.

The transistor 47 functions as a transfer transistor for controlling the potential of a node ND0 in response to the output of the photoelectric conversion element PD. The transistor 48 functions as a reset transistor for initializing the potential of the node ND0. The transistor 49 functions as an amplifying transistor for outputting a signal corresponding to the potential of the node ND0. The transistor 50 functions as a selection transistor for selecting the pixel 20.

Note that the above structure of the pixel 20 is just an example, and some of the circuits, some of the transistors, some of the capacitors, some of the wirings, or the like are not included in some cases. Alternatively, a circuit, a transistor, a capacitor, a wiring, or the like that is not included in the above structure might be included. Alternatively, connection between some wirings might be different from the above connection. A reading circuit including a current source transistor may be connected to the wiring 91 (OUT1) in order to output an appropriate signal potential to the wiring 91 (OUT1).

An operation example of the pixel 20 is as follows. Here, the wiring 72 (VPR) and the wiring 74 (VO) are each set at the high potential, and the wiring 71 (VPD) and the wiring 73 (VC) are each set at the low potential.

First, the wiring 62 (PR) is set at the high potential, so that the transistor 48 is turned on and the node ND0 has the potential of the wiring 72 (VPR) (i.e., reset operation).

Next, the transistor 48 is turned off, and the wiring 61 (TX) is set at the high potential to turn on the transistor 47, so that charges are released from the node ND0 through the photodiode PD (i.e., accumulation operation). In the pixel circuit illustrated in FIG. 2, the higher the illuminance of light with which the photodiode PD is irradiated is, the larger the amount of photocurrent flowing through the photodiode PD becomes and the lower the potential of the node ND0 becomes.

Next, the transistor 47 is turned off, and the wiring 63 (SE) is set at the high potential to turn on the transistor 50, so that a current flowing through the transistor 49 depending on the potential of the node ND0 is output to the wiring 91 (OUT1) through the transistor 50 (i.e., reading operation). The pixel 20 can be operated as described above.

The circuit 22 has a function of selecting a specific row in the pixel array 21. The circuit 22 includes a shift register circuit, a negative AND circuit, a negative OR circuit, a buffer circuit, or the like.

The circuit 23 has a function of converting an analog signal output from the pixel 20 to the wiring 91 (OUT1) into a digital signal. The digital signal obtained by the conversion is output from an output terminal of the circuit 23. In this embodiment, the bit number of the output of the circuit 23 is 12. Thus, the number of the buffer circuits 31 is 12, and accordingly, the number of bus lines connecting the circuit 23 to the buffer circuits 31 is 12. Note that the number of bus lines connecting the circuit 23 to the circuit 25 can be reduced to a minimum of 2. Note that the bit number of the output of the circuit 23 is not limited to the above.

The circuit 24 has a function of sequentially selecting columns outputting the above digital signals. The circuit 24 can include a shift register circuit, a negative AND circuit, a buffer circuit, or the like.

With the above configuration, analog signals output from the pixels 20 in the row selected by the circuit 22 can be converted into digital signals by the circuit 23, and the digital signals can be sequentially output column by column to the wiring 93 (OUT3) through the buffer circuit 31 by the circuit 24.

The circuit 25 has a function of a comparison circuit that compares an output value of the circuit 23 obtained in the reference frame and an output value of the circuit 23 obtained in the target frame to detect a difference.

Figure 3:
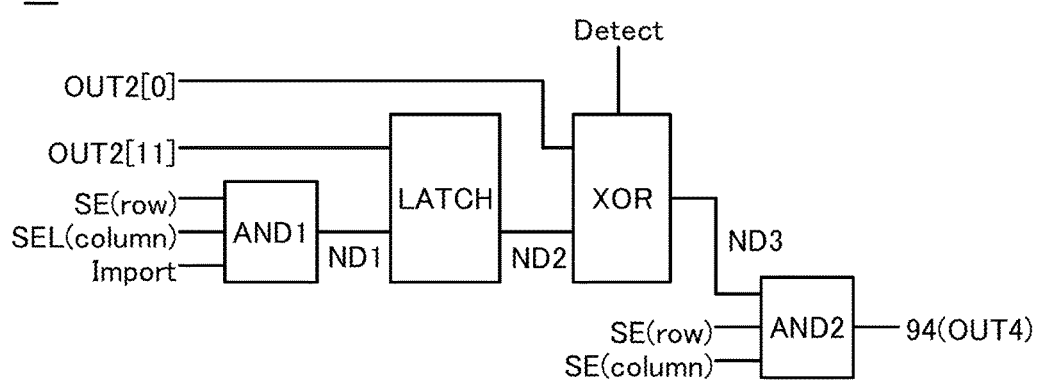
FIG. 3 is a block diagram illustrating a comparison circuit.

FIG. 3 shows an example of a block diagram of the circuit 25. The circuit 25 can include an AND circuit (AND1), a latch circuit (LATCH), an exclusive OR circuit (XOR), and an AND circuit (AND2). Note that in the following description, an "H" level signal is a logic signal and can be called a "1" signal or a high potential signal. An "L" level signal is a logic signal and can be called a "0" signal or a low potential signal.

To input terminals of the AND circuit (AND1), a signal line SE selected by the circuit 22, a signal line SEL selected by the circuit 24, and a signal line Import are connected, and the AND of the signals input from the signal lines is output from an output terminal of the AND circuit (AND1). That is, when "H" level signals are input from the signal line SE, the signal line SEL, and the signal line Import, an "H" level signal is output from the output terminal.

Here, the signal line SE selected by the circuit 22 and the signal line SEL selected by the circuit 24 are connected to the input terminals of the AND circuit (AND1). Thus, selection signals (the signal line SE and signal line SEL) for selecting a predetermined pixel controls the operation of the circuit 25 corresponding to the pixel. In that case, by supplying an "H" level signal to the signal line Import, data corresponding to the pixel selected in the reference frame can be captured.

Figure 4:
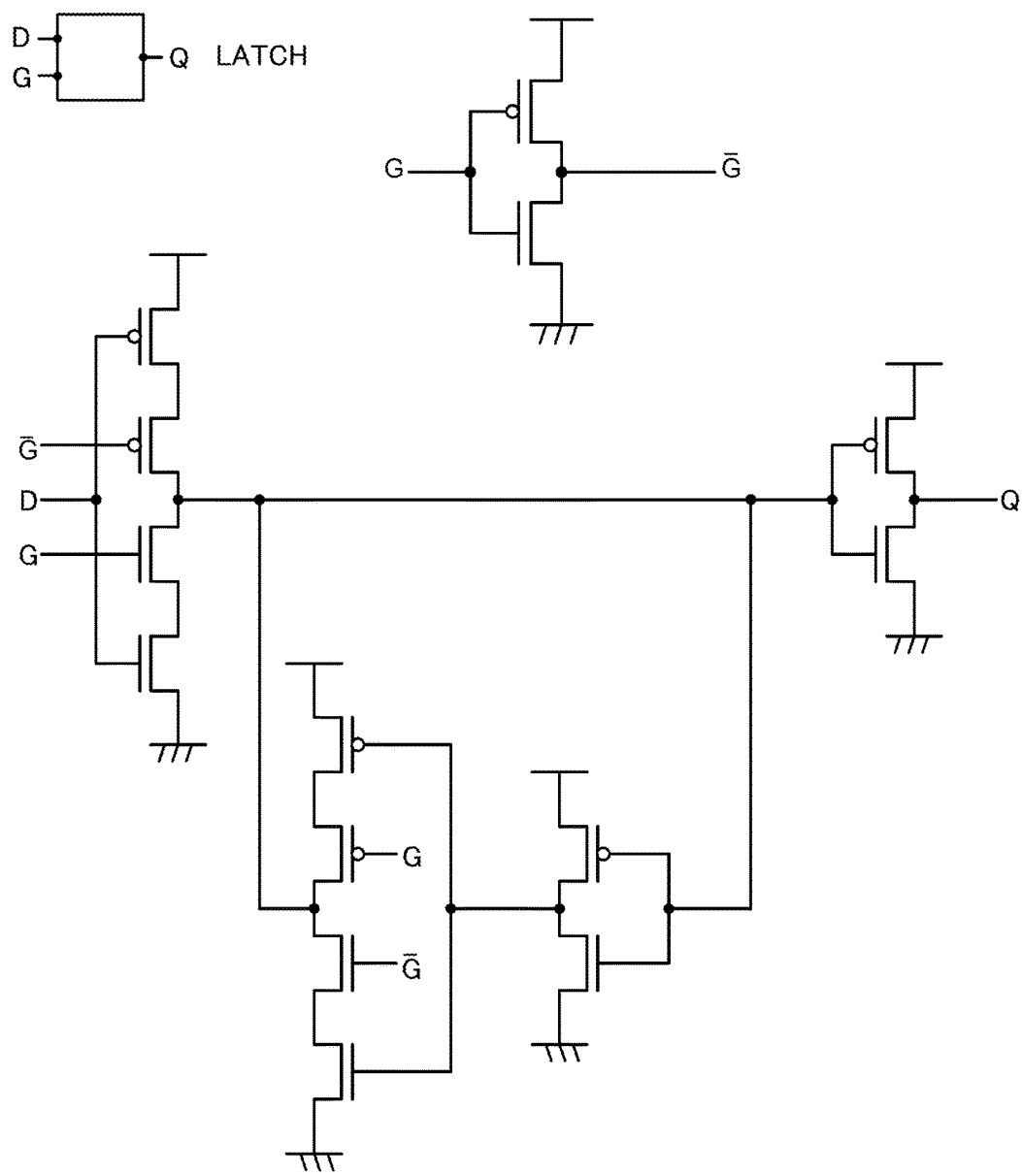
FIG. 4 is a circuit diagram illustrating a latch circuit.

The latch circuit (LATCH) has a function of retaining part of digital data of the reference frame. FIG. 4 shows an example of a circuit diagram of the latch circuit (LATCH). The circuit diagram in FIG. 4 illustrates a D latch circuit. When an "L" level signal is supplied to a wiring G, the previous state is maintained. When an "H" level signal is supplied, a logic signal supplied to a wiring D is output to a wiring Q.

The output terminal of the AND circuit (AND1) is connected to a first input terminal (wiring G) of the latch circuit (LATCH), and an output line of a counter circuit of the circuit 23 for high-order bit data is connected to a second input terminal (wiring D) of the latch circuit (LATCH). Here, a wiring OUT2[11], which is an output line of the 12-bit circuit 23 for most significant bit data, is connected to the second input terminal (wiring D). Note that instead of the output line for most significant bit data, an output line for high-order bit data may be connected to the second input terminal (wiring D). With the above structure, the latch circuit (LATCH) outputs the logic signal of the wiring OUT2[11] to an output terminal (wiring Q) in synchronization with the output signal from the AND circuit (AND1).

The exclusive OR circuit (XOR) has a function of outputting the XOR of two input signals. FIG. 5 shows an example of a circuit diagram of the exclusive OR circuit (XOR). The exclusive OR circuit (XOR) can be composed of five negative OR circuits (NOR). If the logic of a wiring A is the same as that of a wiring B, the exclusive OR circuit (XOR) outputs an "L" level signal to a wiring Z in response to input of an "L" level signal to a wiring Detect. If not, an "H" level potential is output to the wiring Z.

The output terminal of the latch circuit (LATCH) is connected to a first input terminal (wiring A) of the exclusive OR circuit (XOR), and an output line of the counter circuit of the circuit 23 for low-order bit data is connected to a second input terminal (wiring B) of the exclusive OR circuit (XOR). Here, a wiring OUT2[0], which is an output line of the 12-bit circuit 23 for least significant bit data, is connected to the second input terminal (wiring B). Note that instead of the output line for least significant bit data, an output line for low-order bit data may be connected to the second input terminal (wiring B).

With the above structure, the exclusive OR circuit (XOR) can compare a logic signal retained in the latch circuit (LATCH) and output to the wiring OUT2[11] in the reference frame and a logic signal that is output to the wiring OUT2[0] in a target frame. When an "L" level signal is supplied to the wiring Detect and the logic signals of the above two frames are the same, i.e., there is no difference, an "L" level signal is output to the output terminal (wiring Z); when an "L" level signal is supplied to the wiring Detect and the logic signals of the above two frames are different, i.e., there is a difference, an "H" level signal is output to the output terminal (wiring Z).

To input terminals of the AND circuit (AND2), the signal line SE selected by the circuit 22, the signal line SEL selected by the circuit 24, and an output terminal of the exclusive OR circuit (XOR) are connected, and the AND of the signals input from the signal lines and the exclusive OR circuit (XOR) is output from an output terminal of the AND circuit (AND2). That is, when "H" level signals are input from the signal line SE, the signal line SEL, and the exclusive OR circuit (XOR), an "H" level signal is output from the output terminal. In other words, when it is determined that there is a difference between the reference frame and a target frame, the AND circuit (AND2) outputs an "H" level signal to a wiring 94 (OUT4).

In the circuit 25, a wiring connecting the output terminal of the AND circuit (AND1) to the first input terminal of the latch circuit (LATCH) is a node ND1. A wiring connecting the output terminal of the latch circuit (LATCH) to the first input terminal of the exclusive OR circuit (XOR) is a node ND2. A wiring connecting the output terminal of the exclusive OR circuit (XOR) to the input terminal of the AND circuit (AND2) is a node ND3.

The circuit 26 has a function of controlling the operation of the circuit 27. Details about the circuit 26 are described later together with the explanation of the circuit 27.

The circuit 27 has a function of generating clock signals (CLK) of a plurality of frequencies and supplies the clock signals (CLK) to the counter circuit of the circuit 23. The frequencies of the clock signals (CLK) are controlled by the circuit 26.

Figure 6:
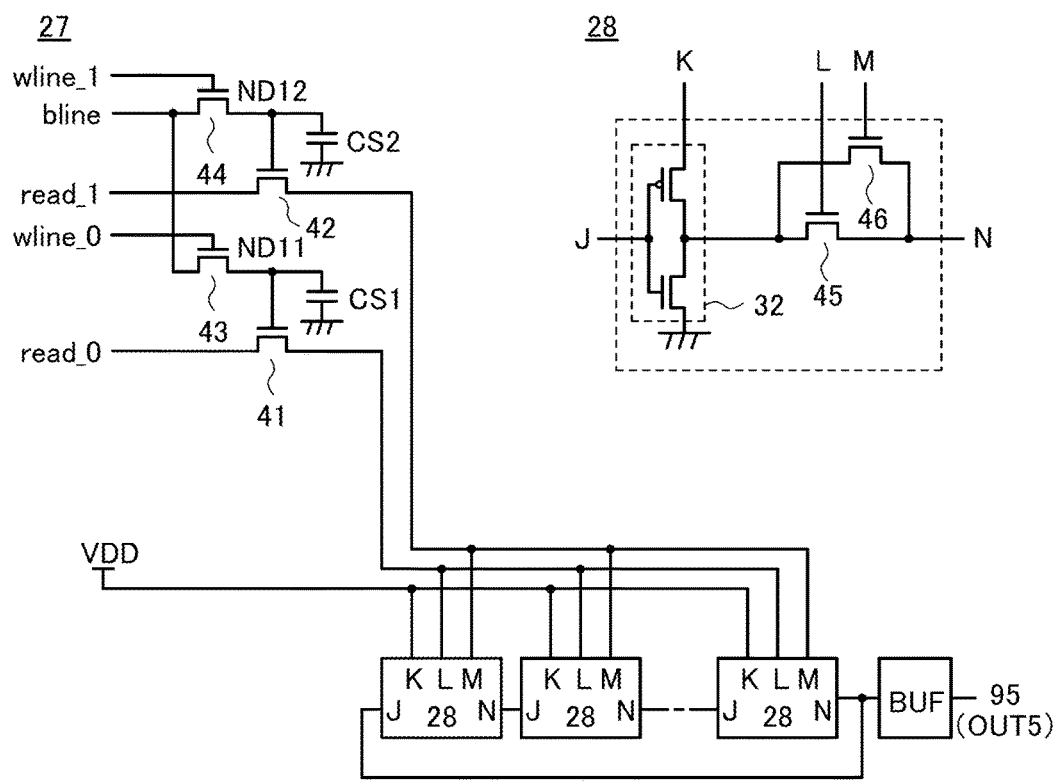
FIG. 6 is a circuit diagram illustrating a voltage-controlled oscillator.

FIG. 6 is an example of a circuit diagram of the circuit 27. The circuit 27 has a function of a voltage-controlled oscillator that generates clock signals (CLK) of a plurality of frequencies. The circuit 27 can include an odd number of stages of circuits 28, a buffer circuit (BUF), a transistor 41, a transistor 42, a transistor 43, a transistor 44, a capacitor CS1, and a capacitor CS2. The clock signal (CLK) generated by the circuit 27 is supplied to the circuit 23 through a wiring 95 (OUT5).

The circuit 28 can include an inverter circuit 32, a transistor 45, and a transistor 46. An input side of the inverter circuit 32 has a function of a first input terminal (J), and to an output side of the inverter circuit 32, one of a source electrode and a drain electrode of the transistor 45 and one of a source electrode and a drain electrode of the transistor 46 are electrically connected. The other of the source electrode and the drain electrode of the transistor 45 and the other of the source electrode and the drain electrode of the transistor 46 are electrically connected to each other to function as an output terminal (N). A high potential power supply input terminal of the inverter circuit functions as a second input terminal (K). A gate electrode of the transistor 45 functions as a third input terminal (L). A gate electrode of the transistor 46 functions as a fourth input terminal (M). The on/off state of the transistor 45 is controlled with the potential of the third input terminal (L) and the on/off state of the transistor 46 is controlled with the potential of the fourth input terminal (M).

Here, the number of the stages of the circuits 28 is an odd number of 200 or less, preferably an odd number of 100 or less, more preferably an odd number of 50 or less. Note that in view of power consumption or the occupied area, the number of the stages of the circuits 28 is preferably made small as long as a clock signal (CLK) of a desired frequency can be generated. In one embodiment of the present invention, the frequency of the clock signal (CLK) can also be adjusted by changing the modes of the transistors used in the circuit 27 and the circuit 28 and by control by the circuit 26; thus, the number of the stages of the circuits 28 is not limited. Therefore, the number of the stages of the circuits 28 can be one.

A gate electrode of the transistor 41 is electrically connected to one of a source electrode and a drain electrode of the transistor 43 and one electrode of the capacitor CS1. Here, this connection portion is a node ND11. A gate electrode of the transistor 42 is electrically connected to one of a source electrode and a drain electrode of the transistor 44 and one electrode of the capacitor CS2. Here, this connection portion is a node ND12.

One of a source electrode and a drain electrode of the transistor 41 is electrically connected to a signal line read_0. One of a source electrode and a drain electrode of the transistor 42 is electrically connected to a signal line read_1. Here, the signal line read_0 and the signal line read_1 are electrically connected to the circuit 26.

The other of the source electrode and the drain electrode of the transistor 43 and the other of the source electrode and the drain electrode of the transistor 44 are electrically connected to a signal line bline. A gate electrode of the transistor 43 is electrically connected to a signal line wline_0, and a gate electrode of the transistor 44 is electrically connected to a signal line wline_1.

The other of the source electrode and the drain electrode of the transistor 41 is electrically connected to the third input terminal (L) of the circuit 28, and the other of the source electrode and the drain electrode of the transistor 42 is electrically connected to the fourth input terminal (M) of the circuit 28.

The second input terminal (K) of the circuit 28 is electrically connected to a high power supply potential line (VDD). The first input terminal (J) of the circuit 28 is electrically connected to the output terminal (N) of the circuit 28 in the previous stage. Note that when two or more stages of the circuits 28 are connected in series, the first input terminal (J) of the circuit 28 in the first stage is electrically connected to the output terminal (N) of the circuit 28 in the final stage.

The output terminal (N) of the circuit 28 in the final stage is electrically connected to an input terminal of the buffer circuit, and an output terminal of the buffer circuit is electrically connected to the wiring 95 (OUT5). Note that a structure not including the buffer circuit may be employed.

In the circuit 27, the on/off state of the transistor 43 is controlled in accordance with the potential supplied from the signal line wline_0. When the transistor 43 is turned on, an analog potential supplied from the signal line bline can be written in the node ND11. The capacitor CS1 has a function of retaining the analog potential written in the node ND11.

The on/off state of the transistor 41 is controlled in accordance with the potential of the node ND11. When the transistor 41 is turned on, the potential supplied from the signal line read_0 is supplied to the third input terminal (L)

of each of the circuits 28. At that time, a potential VL of the third input terminal (L) depends on a potential V11 of the node ND11, a potential V0 of the signal line read_0, and a threshold voltage Vth41 of the transistor 41. For example, when V0<V11−Vth41, VL=V0. When V0>V11−Vth41, VL=V11−Vth41. Note that in this embodiment, operation is carried out under conditions where V0>V11−Vth41.

The on/off state of the transistor 44 is controlled in accordance with the potential supplied from the signal line wline_1. When the transistor 44 is turned on, an analog potential supplied from the signal line bline can be written in the node ND12. The capacitor CS2 has a function of retaining the analog potential written in the node ND12. The on/off state of the transistor 42 is controlled in accordance with the potential of the node ND12. When the transistor 42 is turned on, the potential supplied from the signal line read_1 is supplied to the fourth input terminal (M) of each of the circuits 28.

Figure 7:
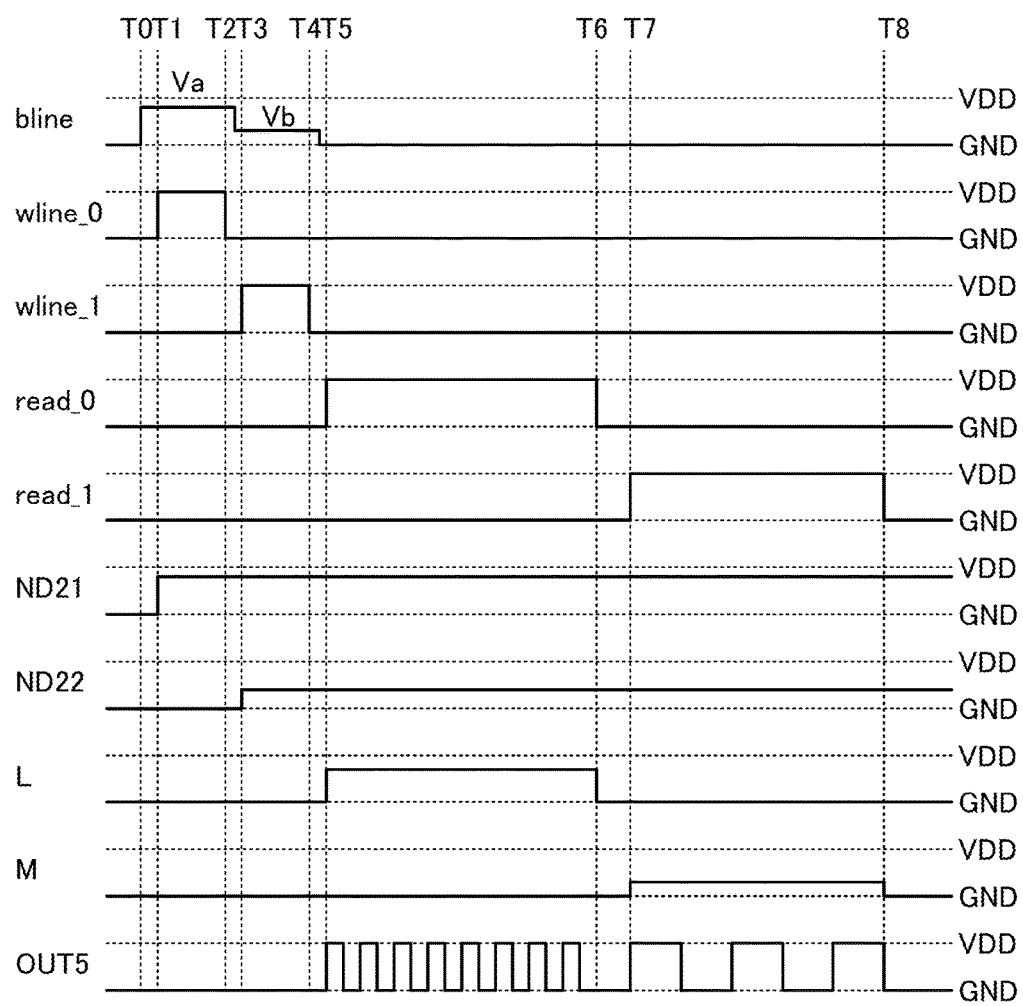
FIG. 7 is a timing chart illustrating operation of a voltage-controlled oscillator.

An example of an operation method of the circuit 27 is described with reference to the timing chart in FIG. 7. Here, the case where an analog potential Va is written in the node ND11 and an analog potential Vb is written in the node ND12 is considered. In the timing chart in FIG. 7, the relation of potentials is as follows: GND<Vb<Va<VDD. The threshold voltages of the transistors included in the circuit 27 are 0 V for convenience.

At time T0, the analog potential Va is applied to the signal line bline. At time T1, an "H" level potential is applied to the signal line wline_0, whereby the transistor 43 is turned on and the analog potential Va is supplied to the node ND11.

At time T2, an "L" level potential is applied to the signal line wline_0 and the transistor 43 is turned off, whereby the analog potential Va is stored in the node ND11. Then, the analog potential Vb is applied to the signal line bline.

At time T3, an "H" level potential is applied to the signal line wline_1 and the transistor 44 is turned on, whereby the analog potential Vb is supplied to the node ND12. At time T4, an "L" level potential is applied to the signal line wline_1 and the transistor 44 is turned off, whereby the analog potential Vb is stored in the node ND12.

Until time T5, the potentials supplied to the third input terminal (L) and the fourth input terminal (M) of the circuit 28 are "L" level potentials (which correspond to GND). Thus, the transistor 45 and the transistor 46 in the circuit 28 are in an off state, which means that the circuit 27 does not generate a clock signal (CLK) and an output signal of the circuit 27 is fixed at an "L" level.

At time T5, an "H" level potential is applied to the signal line read_0. At this time, since the potential of the node ND11 is Va, Va is input to the third input terminal (L) of the circuit 28. Therefore, the transistor 45 of the circuit 28 is turned on, so that the circuit 27 generates a clock signal (CLK) of the frequency f1. At this time, in the circuit 28, a signal is transmitted through the inverter circuit 32 and the transistor 45.

At time T6, an "L" level potential is applied to the signal line read_0. At this time, the potential supplied to the third input terminal (L) of the circuit 28 is at an "L" level. Therefore, the transistor 45 of the circuit 28 is turned off, so that the circuit 27 does not generate a clock signal (CLK).

At time T7, an "H" level potential is applied to the signal line read_1. At this time, since the potential of the node ND12 is Vb, Vb is input to the fourth input terminal (M) of the circuit 28. Therefore, the transistor 46 of the circuit 28 is turned on, so that the circuit 27 generates a clock signal (CLK) of the frequency f2. At this time, in the circuit 28, a signal is transmitted through the inverter circuit 32 and the transistor 46.

At time T8, an "L" level potential is applied to the signal line read_1. At this time, the potential supplied to the fourth input terminal (M) of the circuit 28 is at an "L" level. Therefore, the transistor 46 of the circuit 28 is turned off, so that the circuit 27 does not generate a clock signal (CLK).

As described above, in the circuit 28, a signal is transmitted through the inverter circuit 32 and the transistor 45 in the period from time T5 to time T6, and a signal is transmitted through the inverter circuit 32 and the transistor 46 in the period from time T7 to time T8. In each period, the potential of the gate of the transistor 45 is Va, the potential of the gate of the transistor 46 is Vb, and Va>Vb; accordingly, the signal-transmission speed of the circuit 28 is higher in the period from time T5 to time T6. Thus, the frequencies of the clock signals (CLK) generated by the circuit 27 have a relation of f1>f2.

In other words, the circuit 27 can generate a clock signal (CLK) of an oscillation frequency that corresponds to the analog potential stored in the node ND11 or the node ND12. Furthermore, the oscillation frequency of the clock signal (CLK) can be changed instantaneously by storing different analog potentials in the node ND11 and the node ND12 in advance and performing control for supplying an "H" level potential to one of the signal line read_0 and the signal line read_1.

Here, the control for supplying an "H" level potential to one of the signal line read_0 and the signal line read_1 can be performed by the circuit 26. By receiving a determination signal indicating whether a difference has been detected between frames or not from the circuit 25, the circuit 26 changes the signals to be supplied to the signal line read_0 and the signal line read_1. As a result, in the imaging device of one embodiment of the present invention, the circuit 23 operates with a clock signal (CLK) of a low frequency during difference detection by the circuit 25, and the circuit 23 operates with a clock signal (CLK) of a high frequency during imaging of the reference frame and imaging of a new frame after detection of a difference.

FIG. 6 illustrates a circuit configuration where clock signals (CLK) of two frequencies are simply switched to be generated by using the transistors 41 to 46; however, transistors may be added so that clock signals (CLK) of three or more frequencies can be generated.

Figure 8:
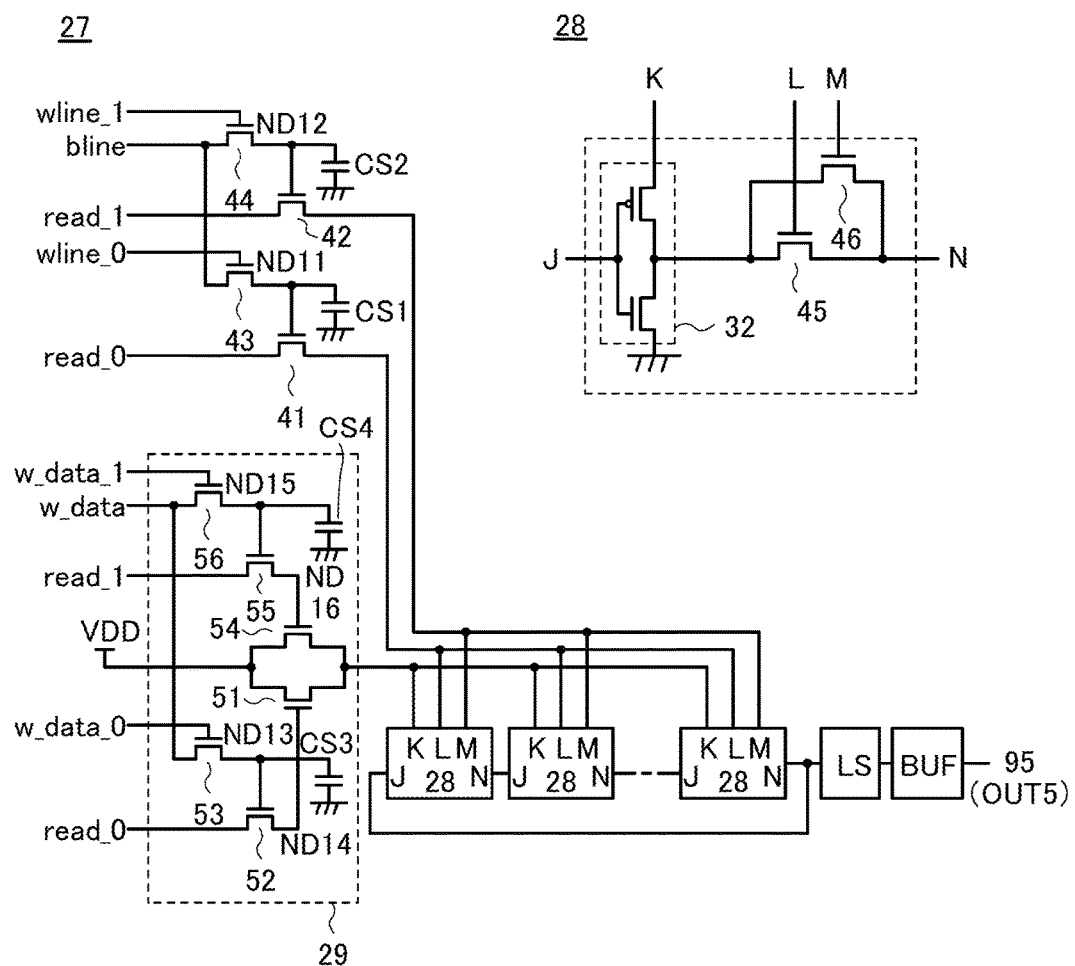
FIG. 8 is a circuit diagram illustrating a voltage-controlled oscillator.

The circuit 27 may have a configuration illustrated in FIG. 8. The circuit 27 in FIG. 8 is different from that in FIG. 6 in that a circuit 29 that controls the potential to be supplied to the second input terminal (K) of the circuit 28 is connected.

The circuit 29 can include a transistor 51, a transistor 52, a transistor 53, a transistor 54, a transistor 55, a transistor 56, a capacitor CS3, and a capacitor CS4.

A gate electrode of the transistor 52 is electrically connected to one of a source electrode and a drain electrode of the transistor 53 and one electrode of the capacitor CS3. Here, this connection portion is a node ND13. A gate electrode of the transistor 55 is electrically connected to one of a source electrode and a drain electrode of the transistor 56 and one electrode of the capacitor CS4. Here, this connection portion is a node ND15.

One of a source electrode and a drain electrode of the transistor 52 is electrically connected to the signal line read_0. The other of the source electrode and the drain electrode of the transistor 52 is electrically connected to a gate electrode of the transistor 51. Here, the wiring connecting the other of the source electrode and the drain electrode of the transistor 52 to the gate electrode of the transistor 51 is a node ND14.

One of a source electrode and a drain electrode of the transistor 55 is electrically connected to the signal line read_1. The other of the source electrode and the drain electrode of the transistor 55 is electrically connected to a gate electrode of the transistor 54. Here, the wiring connecting the other of the source electrode and the drain electrode of the transistor 55 to the gate electrode of the transistor 54 is a node ND16.

The other of the source electrode and the drain electrode of the transistor 53 and the other of the source electrode and the drain electrode of the transistor 56 are electrically connected to a signal line w_data. A gate electrode of the transistor 53 is electrically connected to a signal line w_data_0 and a gate electrode of the transistor 56 is electrically connected to a signal line w_data_1.

One of a source electrode and a drain electrode of the transistor 51 and one of a source electrode and a drain electrode of the transistor 54 are electrically connected to the high power supply potential line (VDD). The other of the source electrode and the drain electrode of the transistor 51 and the other of the source electrode and the drain electrode of the transistor 54 are electrically connected to the second input terminal (K) of the circuit 28.

The on/off state of the transistor 53 is controlled in accordance with the potential supplied from the signal line w_data_0. When the transistor 53 is turned on, an analog potential supplied from the signal line w_data is written in the node ND13. The capacitor CS3 has a function of retaining the analog potential written in the node ND13.

The on/off state of the transistor 52 is controlled in accordance with the potential of the node ND13. When the transistor 52 is turned on, an analog potential is written from the signal line read_0 to the node ND14. The on/off state of the transistor 51 is controlled in accordance with the potential of the node ND14. When the transistor 51 is turned on, an analog potential is supplied to the second input terminal (K) of the circuit 28.

The on/off state of the transistor 56 is controlled in accordance with the potential supplied from the signal line w_data_1. When the transistor 56 is turned on, an analog potential supplied from the signal line w_data is written in the node ND15. The capacitor CS4 has a function of retaining the analog potential written in the node ND15.

The on/off state of the transistor 55 is controlled in accordance with the potential of the node ND15. When the transistor 55 is turned on, an analog potential is written from the signal line read_1 to the node ND16. The on/off state of the transistor 54 is controlled in accordance with the potential of the node ND16. When the transistor 55 is turned on, an analog potential is supplied to the second input terminal (K) of the circuit 28.

Here, when the potential of the node ND13 is V23, the potential of the node ND14 is V24, the potential supplied to the second input terminal (K) of the circuit 28 is VD1, the threshold voltage of the transistor 52 is Vth52, and the threshold voltage of the transistor 51 is Vth51, the potentials can be expressed as follows.

When the potential V0 of the signal line read_0 is higher than V23−Vth52, V24=V23−Vth52. Furthermore, when VDD is higher than V24−Vth51, VD1=V24−Vth51=V23−Vth52−Vth51.

In other words, in accordance with the analog potential stored in the node ND13, the potential VD1 supplied to the second input terminal (K) of the circuit 28 can be controlled.

In a similar manner, in accordance with the analog potential stored in the node ND15, the potential VD1 supplied to the second input terminal (K) of the circuit 28 can be controlled. The signal-transmission speed of the circuit 28 depends on the potential VD1. Thus, the circuit 27 can generate clock signals (CLK) of different frequencies in accordance with the potential VD1.

In the above-described manner, the circuit 27 in FIG. 8 can adjust the oscillation frequency by two kinds of controls: control of the voltage supplied to the third input terminal (L) or the fourth input terminal (M) of the circuit 28 and control of the voltage supplied to the second input terminal (K).

Note that in the case where the voltage supplied to the second input terminal (K) of the circuit 28 is set low, a decrease in output voltage of the circuit 28 might occur. Therefore, a level shifter circuit (LS) is preferably provided on an output side of the circuit 28 as shown in FIG. 8. The level shifter circuit (LS) can boost a lowered voltage and output the resulting voltage.

FIG. 8 illustrates a circuit configuration where clock signals (CLK) of two frequencies are simply switched to be generated by using the transistors 41 to 46 and the transistors 51 to 56; however, transistors may be added so that clock signals (CLK) of three or more frequencies can be generated.

Figure 9:
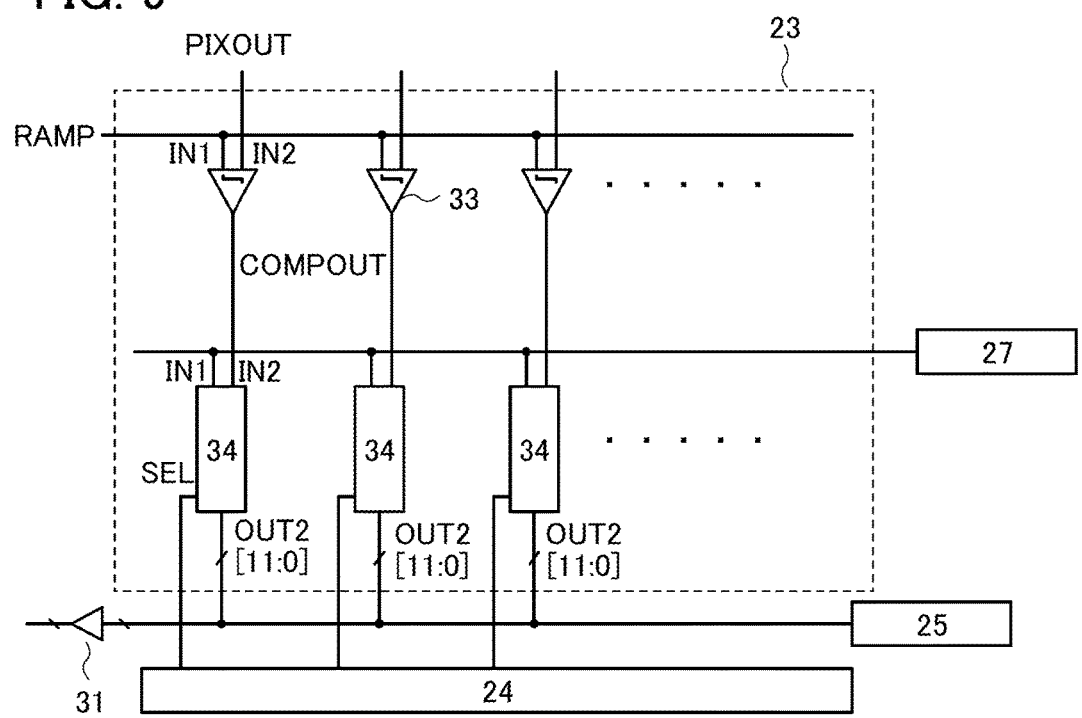
FIG. 9 is a circuit diagram illustrating an A/D converter circuit.

FIG. 9 illustrates a configuration example of the circuit 23. The circuit 23 includes a plurality of comparator circuits 33 and a plurality of counter circuits 34. A reference analog potential RAMP is input to a first input terminal (IN1) of the comparator circuit 33, and an analog potential PIXOUT output from the pixel 20 is input to a second input terminal (IN2) through the wiring 91 (OUT1).

The comparator circuit 33 has a function of comparing the above two input analog potentials. It outputs an "L" level signal when RAMP>PIXOUT and outputs an "H" level signal when RAMP≤PIXOUT (PIXOUT is higher than or equal to RAMP).

A clock signal (CLK) is input from the circuit 27 to a first input terminal (IN1) of the counter circuit 34, and an output signal COMPOUT of the comparator circuit 33 is input to a second input terminal (IN2) of the counter circuit 34.

The counter circuit 34 has a function of performing count-up operation in synchronization with a clock signal (CLK) generated by the circuit 27. When receiving an "H" level signal from the comparator circuit 33 during the count-up operation, the counter circuit 34 retains data at that time.

As described above, the circuit 23 can convert a specific analog potential into a digital value. By receiving a signal SEL from the circuit 24, the circuit 23 can output data retained in a specific counter circuit 34. In this embodiment, the bit number of the output of the counter circuit 34 is 12. Accordingly, the counter circuit 34 has 12 output terminals for outputting digital data.

Here, in the case of detecting a difference between the reference frame and a target frame, power consumption is preferably reduced as much as possible in a period in which a difference is detected.

When the bit number of the output of the counter circuit is 12, the A/D converter circuit should be capable of outputting 4096-level data. Thus, when the reference frame is imaged, the counter circuit needs to operate at an extremely high frequency, resulting in relatively high power consumption.

In contrast, in a difference detection period, not all the 12 bit signals are necessary, and for example, it can be determined that a change occurs in an image if a change in 1 bit signal is detected. In the case where the bit number of the output of the counter circuit in a difference detection period is one, the counter circuit 34 can operate at a low frequency. The frequency can be ½₀₄₈ of the frequency for outputting 12 bit signals. Therefore, the power consumption of the A/D converter circuit can be substantially reduced.

Figure 54:
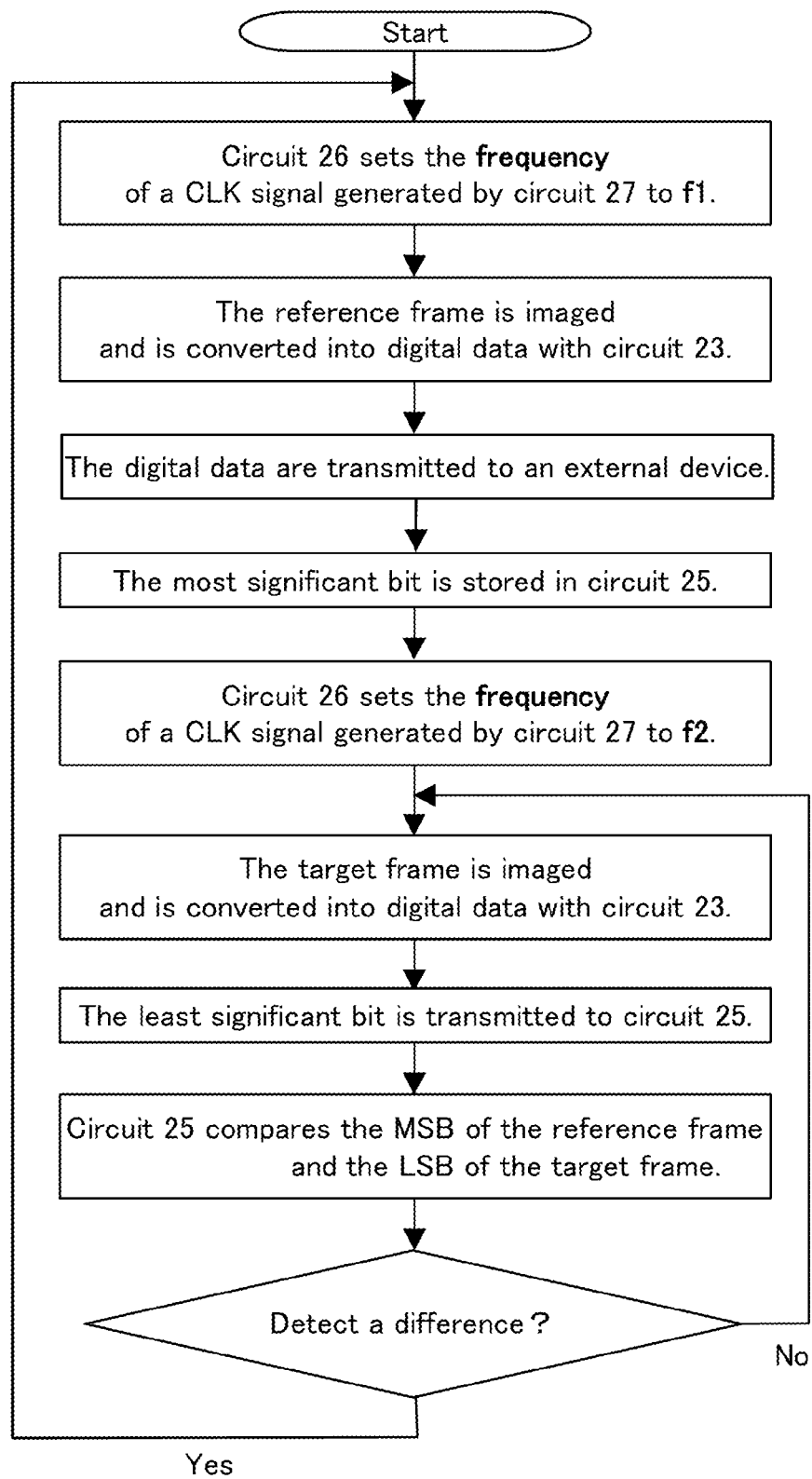
FIG. 54 is a flow chart showing an operation method of an imaging device.

Next, an operation method of the imaging device of one embodiment of the present invention is described with reference to a timing chart. Here, operation of extracting data in every imaging of a frame (which corresponds to operation of a general imaging device), operation of extracting data of the reference frame, and operation of detecting a difference between the reference frame and a target frame are described one by one. Note that for the flow of the overall operation, the simplified flow chart in FIG. 54 can be referred to.

SE (row) and SEL (column) in the timing chart represent the potential of the signal line connected to the circuit 22 and that of the signal line connected to the circuit 24. When both of the potentials are at an "H" level, a specific pixel is selected. COMPOUT, OUT2[11], OUT2[0], and OUT4 represent an output signal of the comparator circuit 33, a most significant bit output signal of the counter circuit 34, a least significant bit output signal of the counter circuit 34, and an output signal of the circuit 25, respectively.

The circuit 27 is assumed to have the configuration illustrated in FIG. 6. In the circuit 27, the oscillation frequency of a clock signal (CLK) when the signal line read_0 is at an "H" level is f1, the oscillation frequency of a clock signal (CLK) when the signal line read_1 is at an "H" level is f2, and f1>f2. A potential equivalent to the high power supply potential VDD is supplied or output as an "H" level signal, and a potential equivalent to the GND potential is supplied or output as an "L" level signal.

Figure 10:
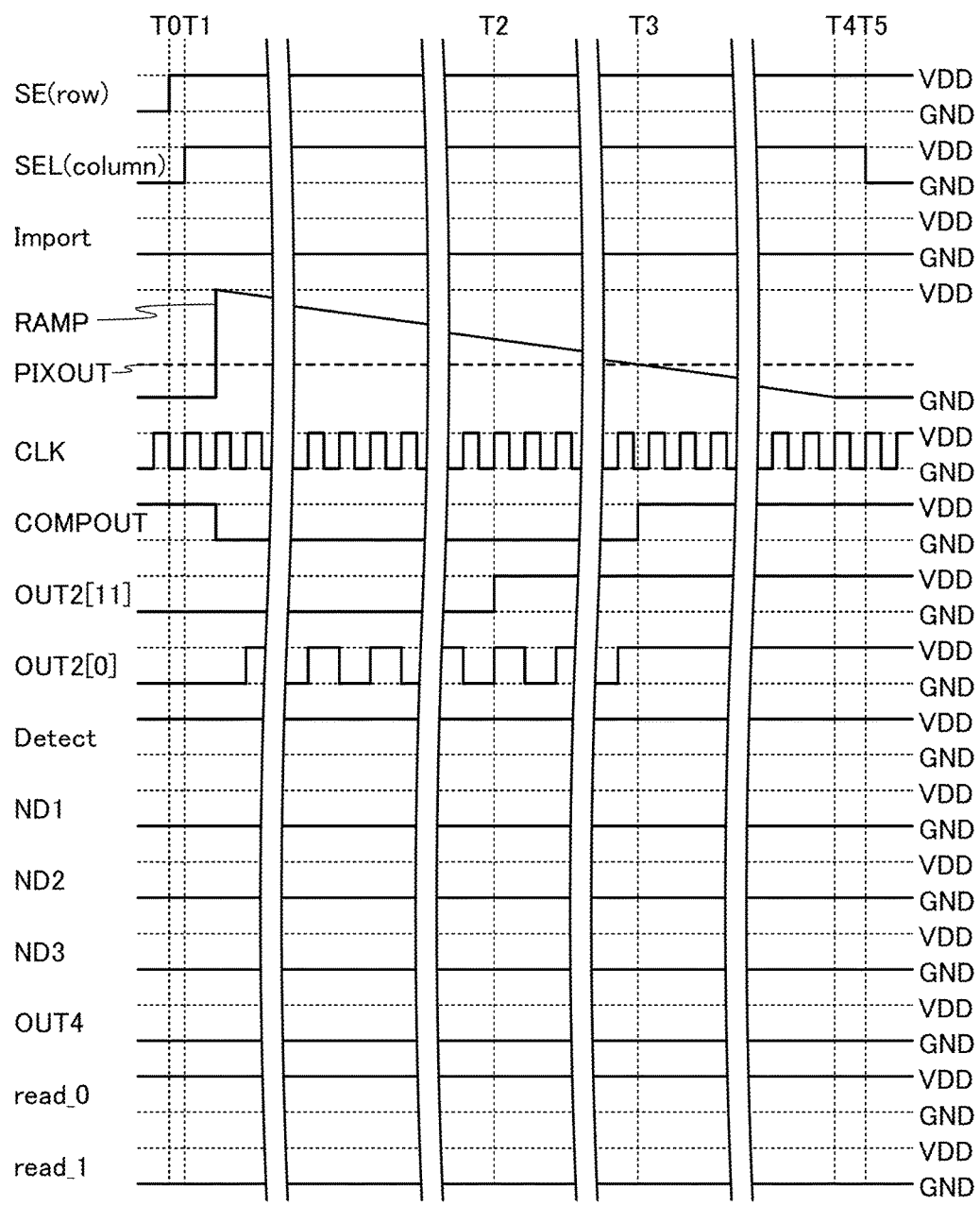
FIG. 10 is a timing chart illustrating operation of an imaging device.

FIG. 10 is a timing chart for explaining operation of extracting data in every imaging of a frame. By time T0, the signal line read_0 and the signal line read_1 are set at an "H" level and an "L" level, respectively, and a clock signal (CLK) of the frequency f1 is generated.

At time T0, the potential of the signal line SE (row) is set at an "H" level, and at time T1, the potential of the signal line SEL (column) is set at an "H" level, whereby a specific pixel is selected. Furthermore, the potential RAMP is set at an "H" level and the comparator circuit 33 starts to compare the potential RAMP and the potential PIXOUT. Furthermore, the counter circuit 34 starts to operate. After that, the potential RAMP is gradually lowered to GND by time T5. In the above period, the signal line Import is at an "L" level, the signal line Detect is at an "H" level, and thus, the circuit 25 does not operate.

After time T1, the potential of OUT2[0] keeps on changing in accordance with a clock signal (CLK) as a result of operation of the counter circuit 34. At time T2, the potential of OUT2[11] is set at an "H" level as a result of operation of the counter circuit 34.

At time T3, the potential RAMP and the potential PIXOUT become equal, and the potential of COMPOUT is set at an "H" level. Thus, the potentials of OUT2[0] to OUT2[11] are maintained. At time T4, sweeping of RAMP is finished, and 12 bit signals OUT2[0] to OUT2[11] are output as output of the circuit 23. At time T5, the potential of the signal line SEL (column) is set at an "L" level and a selection period for the specific pixel ends. The 12 bit signals are transmitted to an external device such as a display device or a memory device.

Figure 11:
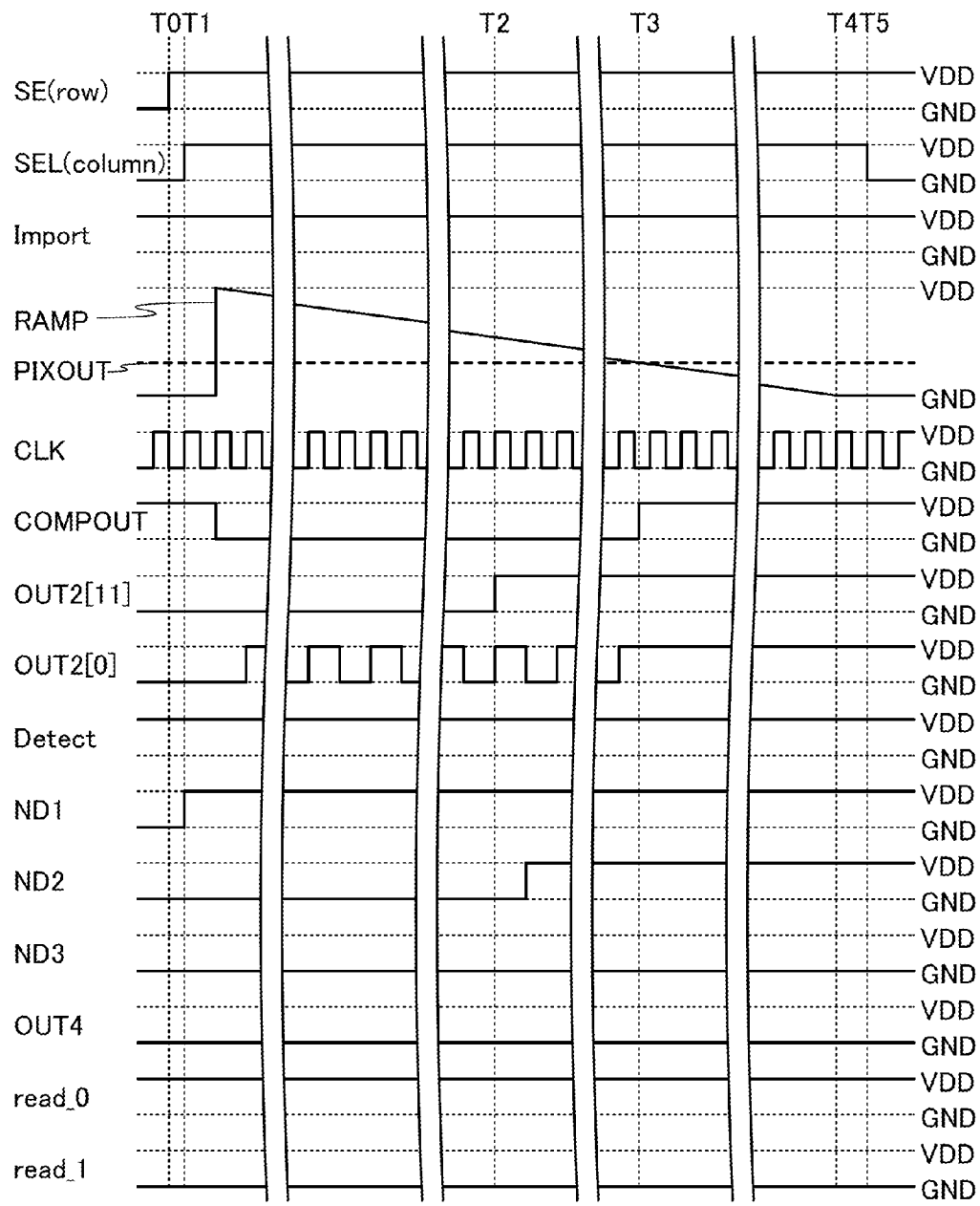
FIG. 11 is a timing chart illustrating operation of an imaging device.

FIG. 11 is a timing chart for explaining operation of storing data of the reference frame in the circuit 25. The timing chart in FIG. 11 is different from that in FIG. 10 in that the potential of the signal line Import stays at an "H" level.

At time T0, the potential of the signal line SE (row) is set at an "H" level. At time T1, the potential of the signal line SEL (column) is set at an "H" level. Here, since the potentials of the signal line SE (row), the signal line SEL (column), and the signal line Import are at an "H" level, the node ND1 in the circuit 25 is set at an "H" level. Furthermore, the potential RAMP is set at an "H" level and the comparator circuit 33 starts to compare the potential RAMP and the potential PIXOUT. Furthermore, the counter circuit 34 starts to operate.

After time T1, the potential of OUT2[0] keeps on changing in accordance with a clock signal as a result of operation of the counter circuit 34. At time T2, the potential of OUT2[11] is set at an "H" level as a result of operation of the counter circuit 34. Here, since the potential of the node ND1 is at an "H" level and the potential of OUT2[11] is at an "H" level, the potential of the node ND2 in the circuit 25 is set at an "H" level. Here, the latch circuit (LATCH) in the circuit 25 retains an "H" level signal, which is the potential of OUT2[11].

At time T3, the potential RAMP and the potential PIXOUT become equal, and the potential of COMPOUT is set at an "H" level. Thus, the potentials of OUT2[0] to OUT2[11] are maintained. At time T4, sweeping of RAMP is finished, and 12 bit signals OUT2[0] to OUT2[11] are output as output of the circuit 23. At time T5, the potential of the signal line SEL (column) is set at an "L" level and a selection period for the specific pixel ends. The 12 bit signals are transmitted to an external device such as a display device or a memory device.

Figure 12:
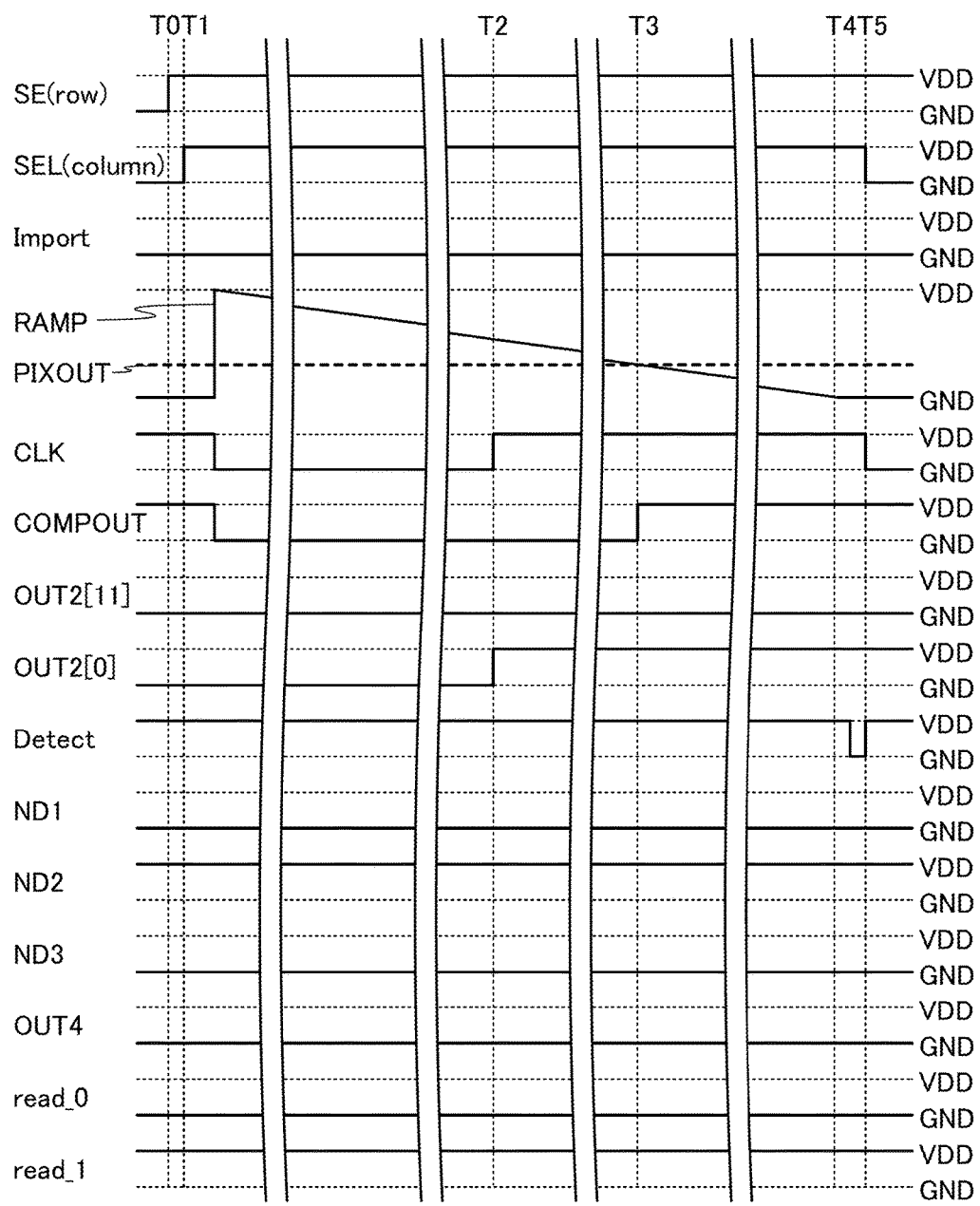
FIG. 12 is a timing chart illustrating operation of an imaging device.

FIG. 12 is a timing chart for explaining operation in a difference detection period. In the difference detection period, imaging of a target frame is performed and a difference between data of the reference frame and that of the target frame is detected. Note that data retained in the latch circuit (LATCH) of the circuit 25 in imaging of the reference frame is at an "H" level. Here, the case where there is no difference between the reference frame and the target frame, i.e., the case where the potential PIXOUT is not different between the reference frame and the target frame, is described.

The timing chart in FIG. 12 is different from that in FIG. 11 in that the potential of the signal line Import stays at an "L" level and that the potential of the signal line Detect is set at an "L" level between time T4 and time T5. Furthermore, the timing chart in FIG. 12 is different from that in FIG. 10 in that by time T0, the signal line read_0 and the signal line read_1 are set at an "L" level and an "H" level, respectively, and a clock signal (CLK) of the frequency f2 is generated.

At time T0, the potential of the signal line SE (row) is set at an "H" level, and at time T1, the potential of the signal line SEL (column) is set at an "H" level, whereby a specific pixel is selected. Furthermore, the potential RAMP is set at an "H" level and the comparator circuit 33 starts to compare the potential RAMP and the potential PIXOUT. Furthermore, the counter circuit 34 starts to operate. After that, the potential RAMP is gradually lowered to GND by time T5.

At time T2, the potential of OUT2[0] is set at an "H" level in accordance with a clock signal (CLK) as a result of operation of the counter circuit 34.

At time T3, the potential RAMP and the potential PIXOUT become equal, and the potential of COMPOUT is set at an "H" level. Thus, the potential of OUT2[0] is maintained. In a period before time T3, the clock signal (CLK)

supplied to the counter circuit 34 is of the lower frequency, f2; accordingly, no output signal other than the least significant bit output signal is output. That is, output of OUT2[1] to OUT2[11] is stopped, resulting in reduced power consumption.

At time T4, sweeping of RAMP is finished, and 1 bit signal OUT2[0] is output as output of the circuit 23. Then, the potential of the signal line Detect is set at an "L" level, so that the exclusive OR circuit (XOR) in the circuit 25 compares the potential of the node ND2 (the potential of OUT2[11] in the reference frame) with the potential of OUT2[0] in the target frame.

Here, since the potential of the node ND2 and the potential of OUT2[0] are at an "H" level, the potential of the node ND3 is set at an "L" level, which means that a difference is not detected. That is, the potential of OUT4 is also set at an "L" level, so that it is determined that there is no difference. At time T5, the potential of the signal line SEL (column) is set at an "L" level and a selection period for the specific pixel ends.

In the above operation, digital data of the most significant bit of the reference frame is compared with digital data of the least significant bit of the target frame in order to determine whether there is a difference or not. This can be achieved by making the clock signal (CLK) supplied in imaging of the reference frame and that supplied in the difference detection period different from each other and by fixing the timings of the outputs of the counter circuits 34 to coincide with each other.

Provided that the bit number of the output of the counter circuit 34 is 12, the clock frequency (CLK) in imaging of the reference frame is f1, and the time at which the most significant bit digital data is output in imaging of the reference frame is T2, by setting the clock frequency in the difference detection period to $f2=f1/2^{11}$, the time at which the least significant bit digital data in the difference detection period is output can be T2. Therefore, it can be determined whether there is a difference or not by comparing the most significant bit data of the reference frame with the least significant bit data of the target frame. Note that when the bit number of the output of the A/D converter circuit is k, $f2=f1/2^{(k-1)}$.

Figure 13:
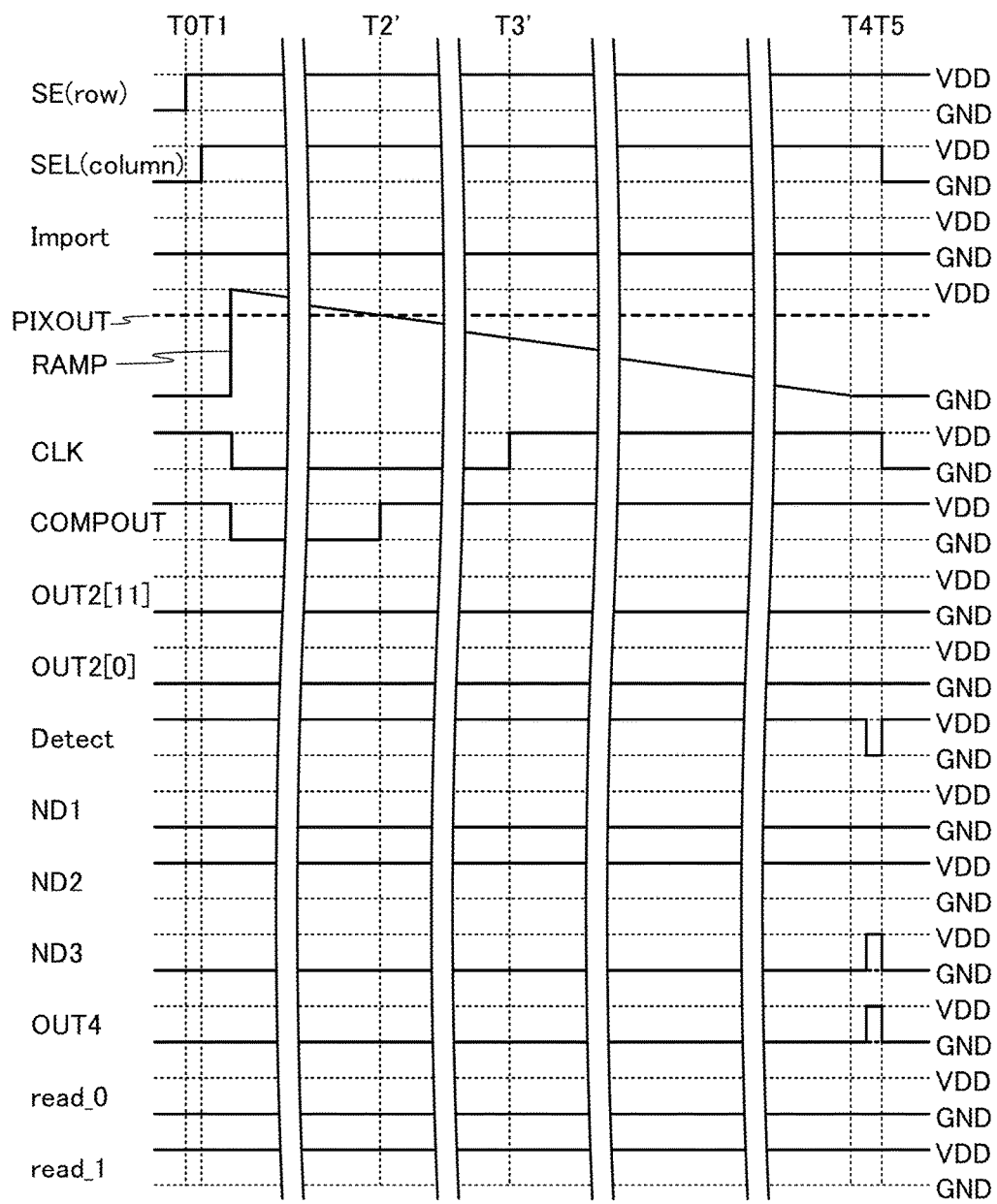
FIG. 13 is a timing chart illustrating operation of an imaging device.

FIG. 13 is a timing chart for explaining the case where there is a difference between the reference frame and the target frame, i.e., the case where the potential PIXOUT is different between the reference frame and the target frame. Note that data retained in the latch circuit (LATCH) of the circuit 25 in the reference frame is at an "H" level.

At time T0, the potential of the signal line SE (row) is set at an "H" level, and at time T1, the potential of the signal line SEL (column) is set at an "H" level, whereby a specific pixel is selected. Furthermore, the potential RAMP is set at an "H" level and the comparator circuit 33 starts to compare the potential RAMP and the potential PIXOUT. Furthermore, the counter circuit 34 starts to operate. After that, the potential RAMP is gradually lowered to GND by time T5.

At time T2', the potential RAMP and the potential PIXOUT become equal, and the potential of COMPOUT is set at an "H" level. Thus, the potential of OUT2[0] is maintained.

At time T4, sweeping of RAMP is finished, and 1 bit signal OUT2[0] is output as output of the circuit 23. Then, the potential of the signal line Detect is set at an "L" level, so that the exclusive OR circuit (XOR) in the circuit 25 compares the potential of the node ND2 (the potential of OUT2[11] in the reference frame) with the potential of OUT2[0] in the target frame.

Here, since the potential of the node ND2 is at an "H" level and the potential of OUT2[0] is at an "L" level, the potential of the node ND3 is set at an "H" level, which means that a difference is detected. That is, the potential of OUT4 is also set at an "H" level, so that it is determined that there is a difference. At time T5, the potential of the signal line SEL (column) is set at an "L" level and a selection period of the specific pixel ends.

The circuit 26, to which the circuit 25 has transmitted a signal indicating that there is a difference ("H" level signal), controls the frequency of a clock signal (CLK) generated by the circuit 27 so that imaging of a new frame can be performed at 12 bit signals. Specifically, the potential of the signal line read_0 is set at an "H" level, the potential of the signal line read_1 is set at an "L" level, and the frequency of the clock signal (CLK) generated by the circuit 27 is set to f1 again. Note that the frequency is changed in the next frame. Furthermore, operation may be forcibly terminated at the time of detection of a difference, and imaging of a new frame may be started immediately.

Although difference detection is performed the comparison at 1 bit data in the above description, difference detection may be performed by comparing 2 bit data. In that case, signals OUT1[1] and OUT1[10] are preferably used in addition to signals OUT1[0] and OUT1 [11]. At this time, $f2=f1/2^{10}$.

In the above-described method for obtaining data, the sweep rate of RAMP is not different between imaging of the reference frame and imaging of the target frame but the frequency of the clock signal (CLK) is different therebetween; however, data may be obtained under conditions where the frequency of the clock signal (CLK) is not different therebetween and the sweep rate of RAMP is different therebetween.

FIG. 14 is a timing chart for explaining operation of detecting a difference under the conditions where the sweep rate of RAMP is different. In FIG. 10, the sweep rate is adjusted such that sweeping of the potential RAMP is finished in a period in which the most significant bit data OUT2[11] can be obtained once. Unlike in FIG. 10, the sweep rate is adjusted such that sweeping of the potential RAMP is finished in a period in which the least significant bit data OUT2[0] can be obtained once in FIG. 14. When the sweep rate of RAMP is adjusted in such a manner, whether there is a difference or not can be determined by comparing the most significant bit data of the reference frame and the least significant bit data of a target frame.

At time T0, the potential of the signal line SE (row) is set at an "H" level, and at time T1, the potential of the signal line SEL (column) is set at an "H" level, whereby a specific pixel is selected. Furthermore, the potential RAMP is set at an "H" level and the comparator circuit 33 starts to compare the potential RAMP and the potential PIXOUT. Furthermore, the counter circuit 34 starts to operate. After that, the potential RAMP is gradually lowered to GND by time T3.

At time T2, the potential RAMP and the potential PIXOUT become equal, and the potential of COMPOUT is set at an "H" level. Thus, the potential of OUT2[0] is maintained.

At time T3, sweeping of RAMP is finished, and 1 bit signal OUT2[0] is output as output of the circuit 23. Then, the potential of the signal line Detect is set at an "L" level, so that the exclusive OR circuit (XOR) in the circuit 25 compares the potential of the node ND2 (the potential of OUT2[11] in the reference frame) with the potential of OUT2[0] in the target frame.

Here, since the potential of the node ND2 is at an "H" level and the potential of OUT2[0] is at an "L" level, the potential of the node ND3 is set at an "H" level, which means that a difference is detected. That is, the potential of OUT4 is also set at an "H" level, so that it is determined that there is a difference.

In response to the "H" level signal, the circuit 26 supplies an "L" level potential to the signal line read_0 to stop output of the circuit 27. Thus, no power is wasted after time T3. At time T4, the potential of the signal line SEL (column) is set at an "L" level and a selection period of the specific pixel ends.

Then, the circuit 26 sets the potential of the signal line read_0 at an "H" level and the potential of the signal line read_1 at an "L" level, and sets the frequency of the clock signal (CLK) generated by the circuit 27 to f1 again. Note that the frequency is changed in the next frame. Furthermore, operation may be forcibly terminated at the time of detection of a difference, and imaging of a new frame may be started immediately.

In the above-described manner, the circuit configuration and operation method of embodiments of the present invention make it possible to easily determine whether there is a difference between the reference frame and a target frame or not and to operate the A/D converter circuit with a clock signal (CLK) of a low frequency in a difference detection period. As a result, the power consumption of the imaging device can be reduced.

Figure 15A:
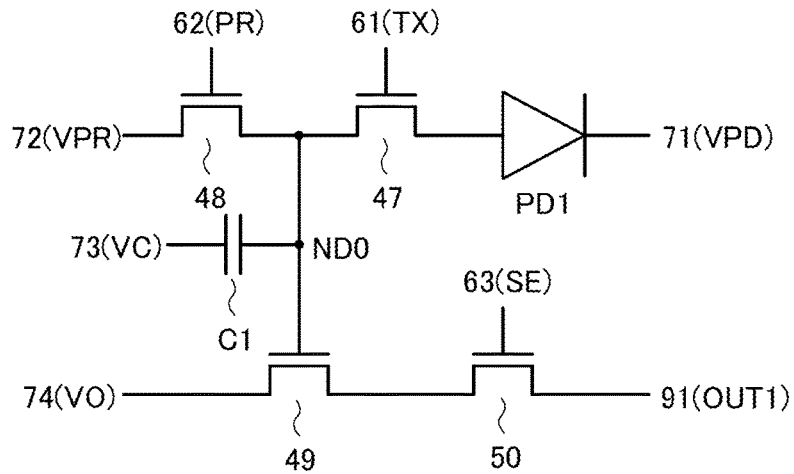
FIGS. 15A to 15C are circuit diagrams each illustrating a pixel.
Figure 15B:
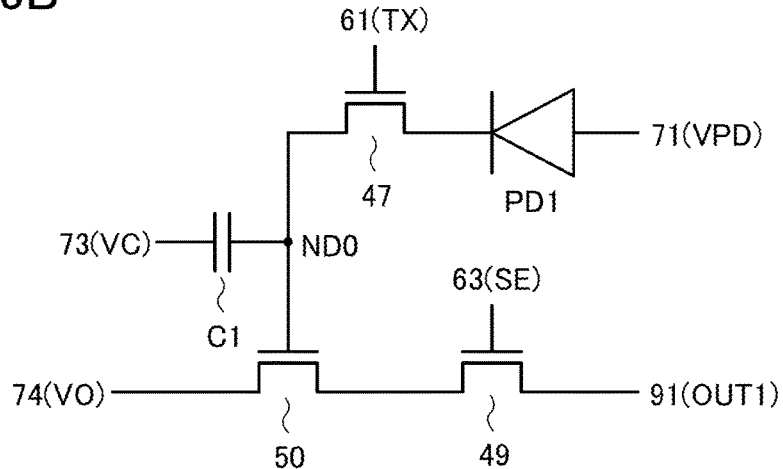
Figure 15C:
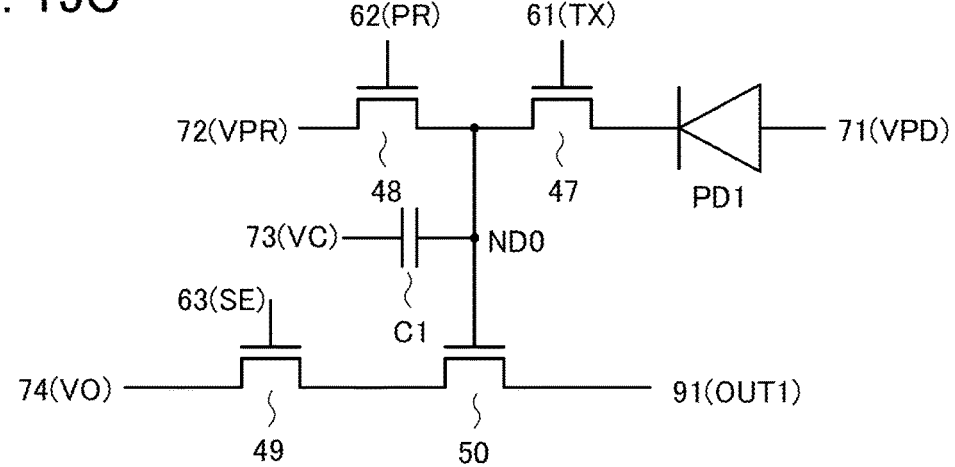

Note that the configuration of the circuit of the pixel 20 is not limited to that illustrated in FIG. 2, and may be any of the ones illustrated in FIGS. 15A to 15C. The connection direction of the photoelectric conversion element PD in FIG. 15A is opposite to that in FIG. 2. In this configuration, operation can be performed in such a manner that the wiring 71 (VPD) is set at a high potential and the wiring 72 (VPR) is set at a low potential. In the configuration of FIG. 15B, the transistor 48 is not provided. In this configuration, the wiring 71 (VPD) is set at a high potential, whereby the potential of the node ND0 can be reset. In the configuration of FIG. 15C, the other of the source electrode and the drain electrode of the transistor 49 is connected to the wiring 91 (OUT1).

Figure 16A:
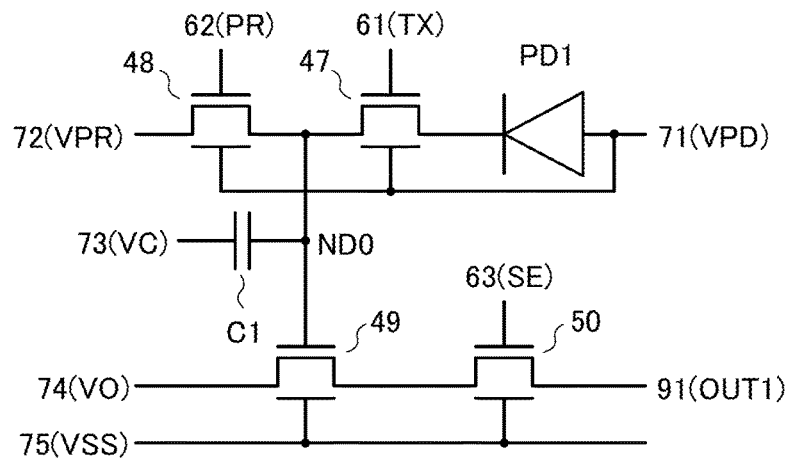
FIGS. 16A to 16C are circuit diagrams each illustrating a pixel.
Figure 16B:
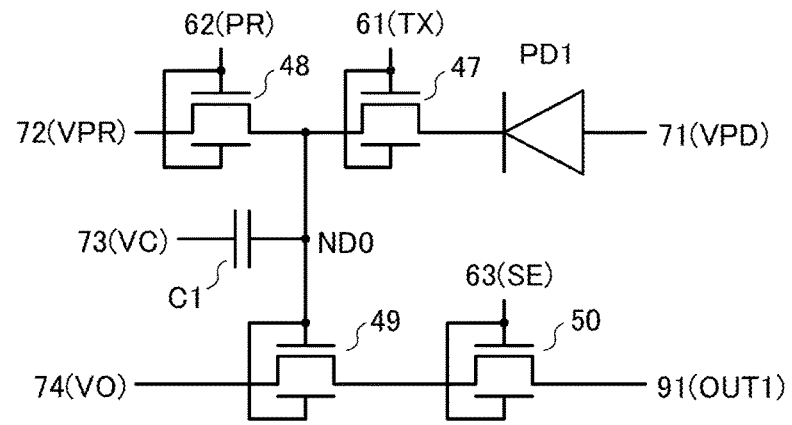
Figure 16C:
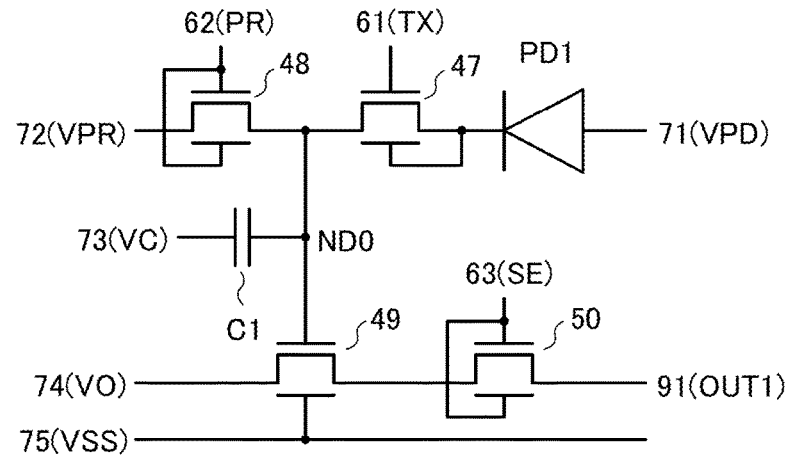

The transistors 47 to 50 in the pixel circuit may each have a back gate as illustrated in FIGS. 16A to 16C. FIG. 16A illustrates a configuration in which a constant potential is applied to the back gates, which enables control of the threshold voltages. The back gates are connected to the wiring 71 (VPD) and a wiring 75 (VSS) that supply a low potential in the example of FIG. 16A, but may be connected to either of the wirings. FIG. 16B illustrates a configuration in which the same potential is applied to the front gate and the back gate, which enables an increase in on-state current and a decrease in off-state current. The configuration of FIG. 16C is obtained by combining the configurations of FIGS. 16A and 16B and the like such that desired transistors can have appropriate electrical characteristics. Note that the configuration of FIG. 16C is just an example, and a transistor without a back gate may be provided. Note that any of the configurations of FIG. 2 and FIGS. 15A to 15C can be combined with any of the configurations of FIGS. 16A to 16C as necessary.

Figure 17:
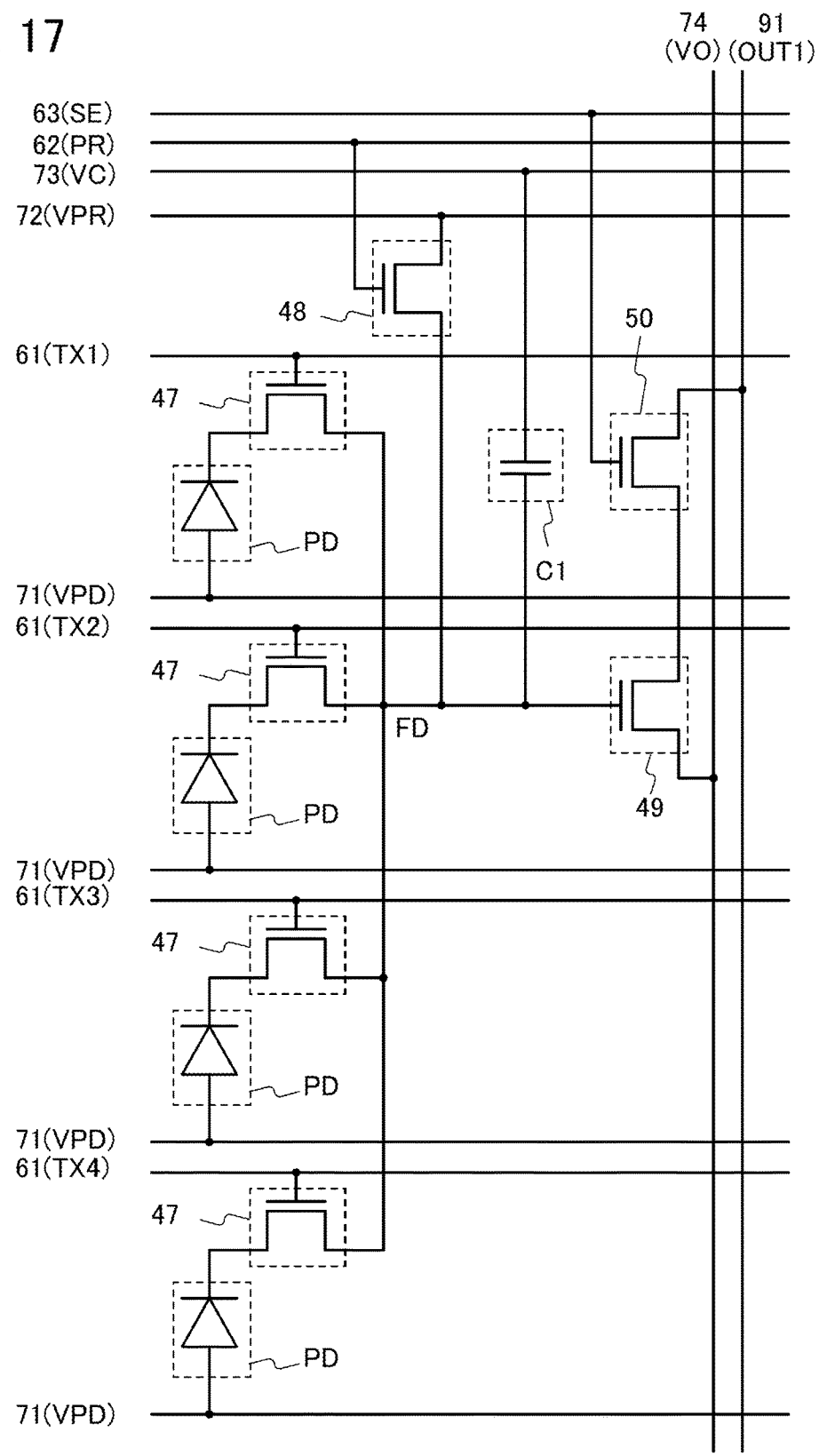
FIG. 17 is a circuit diagram illustrating pixels.

The circuit of the pixel 20 may have a configuration in which the transistors 48 to 50 are shared among a plurality of pixels as illustrated in FIG. 17. FIG. 17 illustrates a configuration in which the transistors 48 to 50 are shared among a plurality of pixels in the perpendicular direction; however, the transistors 48 to 50 may be shared among a plurality of pixels in the horizontal direction or in the horizontal and perpendicular directions. With such a configuration, the number of transistors included in one pixel can be reduced. Furthermore, the other electrode of the capacitor C1 is connected to the wiring 73 (VC) in the example of FIG. 17, but may be connected to the wiring 71 (VPD).

Although FIG. 17 illustrates a configuration in which the transistors 48 to 50 are shared among four pixels, the transistors 48 to 50 may be shared among two pixels, three pixels, or five or more pixels. Note that this configuration can be optionally combined with any of the configurations in FIGS. 15A to 15C and FIGS. 16A to 16C.

Figure 18A:
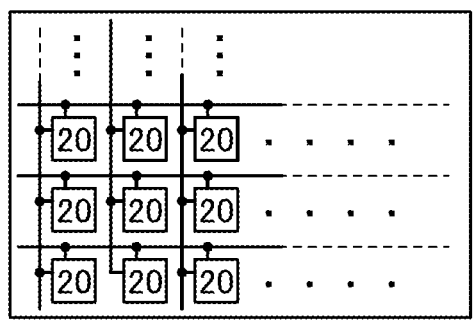
FIGS. 18A to 18C illustrate a structure of an imaging device.
Figure 18B:
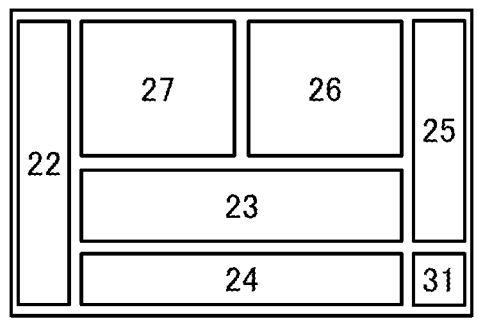
Figure 18C:
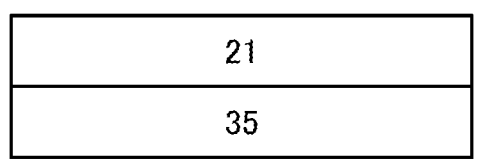

Furthermore, an imaging device of one embodiment of the present invention can have a stacked-layer structure including the pixel array 21 and a substrate 35 provided with the circuits 22 to 27 and the buffer circuit 31. For example, it is possible to employ a stacked-layer structure as illustrated in the front view in FIG. 18C, which includes the pixel array 21 having the top view in FIG. 18A and the substrate 35 having the top view in FIG. 18B. With such a structure, transistors suitable for respective elements can be used, and the area of the imaging device can be small.

To achieve both high-speed operation and the configuration of a CMOS circuit, the circuits 22 to 27 and the buffer circuit 31 are preferably formed using transistors including silicon (hereinafter referred to as Si transistors). For example, a silicon substrate is used as the substrate 35, over which the above circuits are formed. The pixel array is preferably formed using transistors including an oxide semiconductor (hereinafter referred to as OS transistors). Note that some of the transistors included in the circuits 22 to 27 and the buffer circuit 31 may be provided on the same surface as the pixel array 21.

Figure 19A:
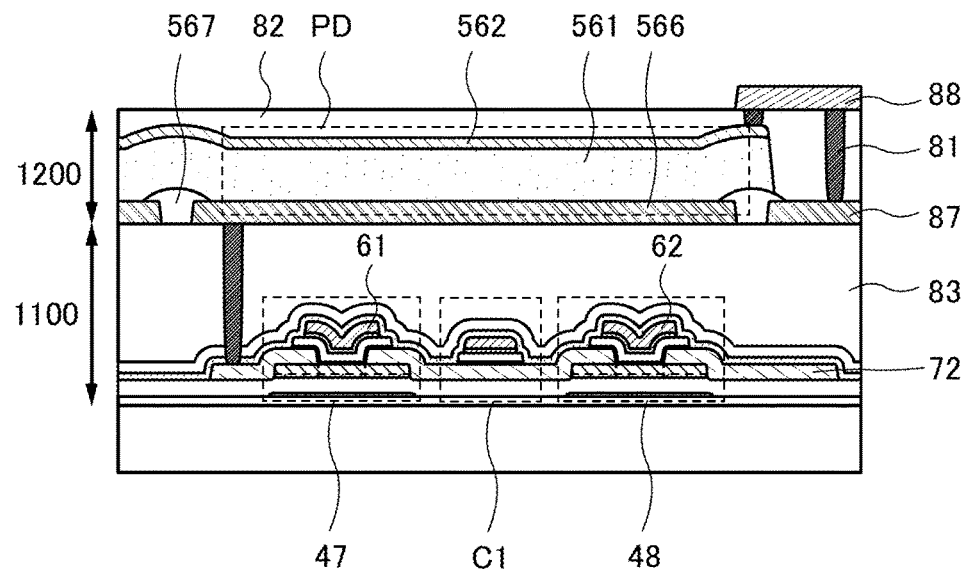
FIGS. 19A to 19C are cross-sectional views each illustrating a structure of an imaging device.

Next, specific structure examples of an imaging device of one embodiment of the present invention are described below with reference to drawings. FIG. 19A illustrates an example of specific connection between the photoelectric conversion element PD, the transistors 47 and 48, and the capacitor C1 which are included in the pixel 20 in FIG. 2. Note that the transistors 49 and 50 are not illustrated in FIG. 19A. The pixel 20 includes a layer 1100 including the transistors 47 to 50 and the capacitor C1 and a layer 1200 including the photoelectric conversion element PD.

Although the wirings, the electrodes, and conductors 81 are illustrated as independent components in cross-sectional views in this embodiment, some of them are provided as one component in some cases when they are electrically connected to each other. In addition, a structure in which a gate electrode, a source electrode, or a drain electrode of the transistor is connected to the wirings through the conductor 81 is only an example, and the gate electrode, the source electrode, and the drain electrode of the transistor might each function as a wiring.

In addition, insulating layers 82 and 83 and the like that function as protective films, interlayer insulating films, or planarization films are provided over the components. For example, an inorganic insulating film such as a silicon oxide film or a silicon oxynitride film can be used as each of the insulating layers 82 and 83 and the like. Alternatively, an organic insulating film such as an acrylic resin film or a polyimide resin film may be used. Top surfaces of the insulating layers 82 and 83 and the like are preferably planarized by chemical mechanical polishing (CMP) or the like as necessary.

In some cases, some of the wirings and the like illustrated in the drawing are not provided or a wiring, a transistor, or the like that is not illustrated in the drawing is included in each layer. In addition, a layer that is not illustrated in the drawing might be included. Furthermore, some of the layers illustrated in the drawing are not included in some cases.

It is preferable that OS transistors with a low off-state current be used for the transistors 47 to 50 which are components of the pixel 20. An extremely low off-state current of the OS transistor can widen the dynamic range of imaging. In the circuit configuration of the pixel 20 illustrated in FIG. 2, an increase in the intensity of light entering the photoelectric conversion element PD reduces the potential of the node ND0. Since the OS transistor has an extremely low off-state current, a current based on a gate potential can be accurately output even when the gate potential is extremely low. Thus, it is possible to widen the detection range of illuminance, i.e., the dynamic range.

A period during which charge can be held in the node ND0 can be extremely long owing to the low off-state current of the transistors 47 and 48. Therefore, a global shutter system in which accumulation operation is performed in all the pixels at the same time can be used without a complicated circuit structure or a complicated operation method.

Figure 20A:
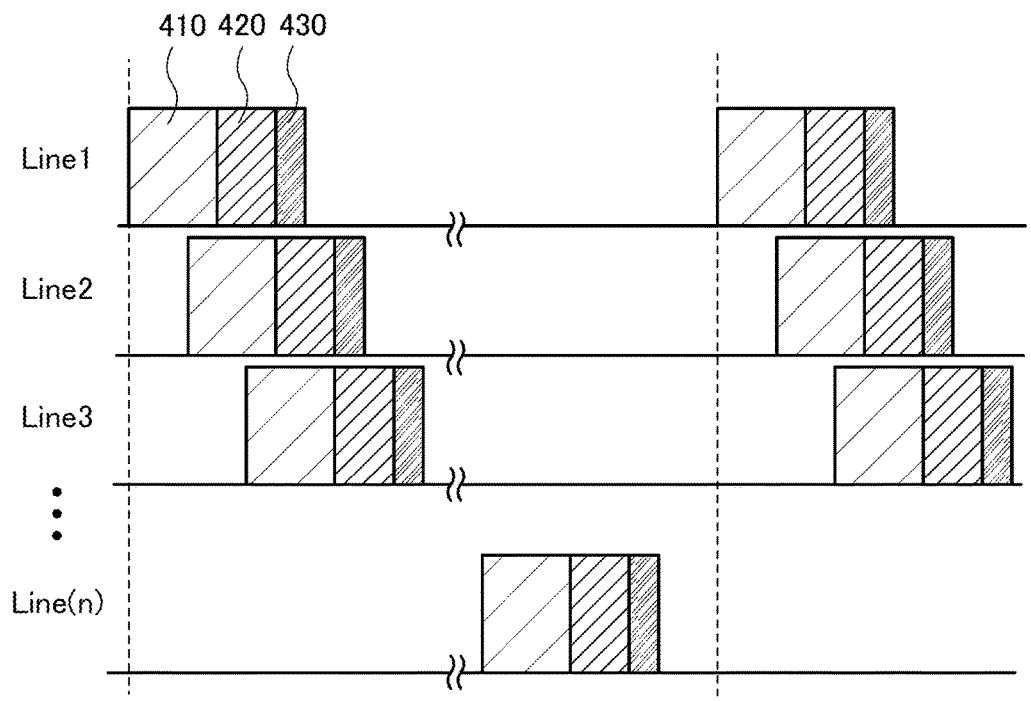
FIGS. 20A and 20B illustrate operations of a rolling shutter system and a global shutter system.

In general, in an imaging device where pixels are arranged in a matrix, a rolling shutter system is employed in which imaging operation 410, data retention operation 420, and read operation 430 are performed row by row as illustrated in FIG. 20A. In the case of employing the rolling shutter system, simultaneousness of imaging is lost. Therefore, when an object moves, an image is distorted.

Figure 20B:
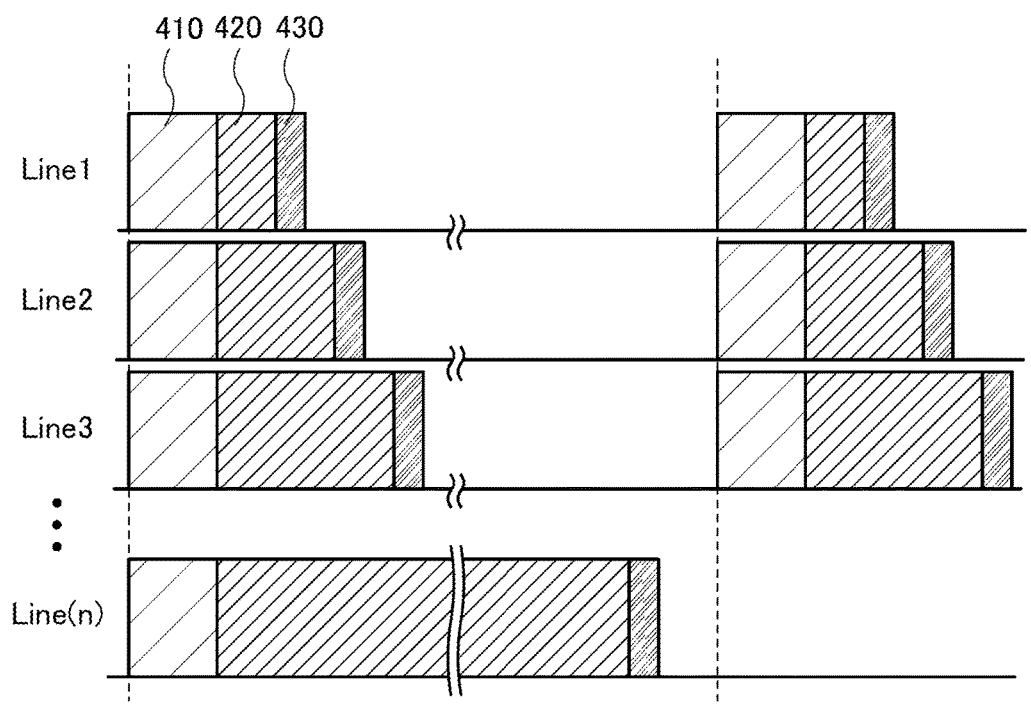

Accordingly, in one embodiment of the present invention, it is preferable to employ a global shutter system in which the imaging operation 410 and the data retention operation 420 can be performed simultaneously in all the rows and the read operation 430 can be sequentially performed row by row as illustrated in FIG. 20B. By employing the global shutter system, simultaneousness of imaging in all the pixels in the imaging device can be secured, and an image with little distortion can be easily obtained even when an object moves.

It is preferable to use OS transistors as the transistors 43 and 44 in the circuit 27 shown in FIG. 6 and the transistors 43, 44, 53, and 56 in the circuit 27 shown in FIG. 8. Owing to the low off-state current of these transistors, the potentials of the node ND11, the node ND12, the node ND13, and the node ND14 can be retained, and the circuit 27 can keep on generating clock signals (CLK) accurately.

In addition, the OS transistor has lower temperature dependence of change in electrical characteristics than a transistor including silicon in an active region or an active layer, and thus can be used in an extremely wide range of temperatures. Therefore, an imaging device and a semiconductor device that include OS transistors are suitable for use in automobiles, aircrafts, spacecrafts, and the like.

Moreover, the OS transistor has higher drain breakdown voltage than the Si transistor. In a photoelectric conversion element including a selenium-based material in a photoelectric conversion layer, a relatively high voltage (e.g., 10 V or more) is preferably applied to easily cause an avalanche phenomenon. Therefore, by combination of the OS transistor and the photoelectric conversion element including a selenium-based material in the photoelectric conversion layer, a highly reliable imaging device can be obtained.

Figure 19B:
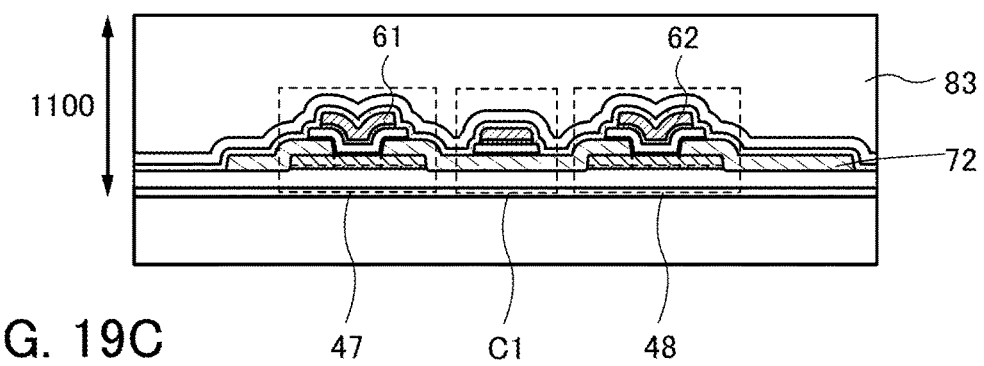
Figure 19C:
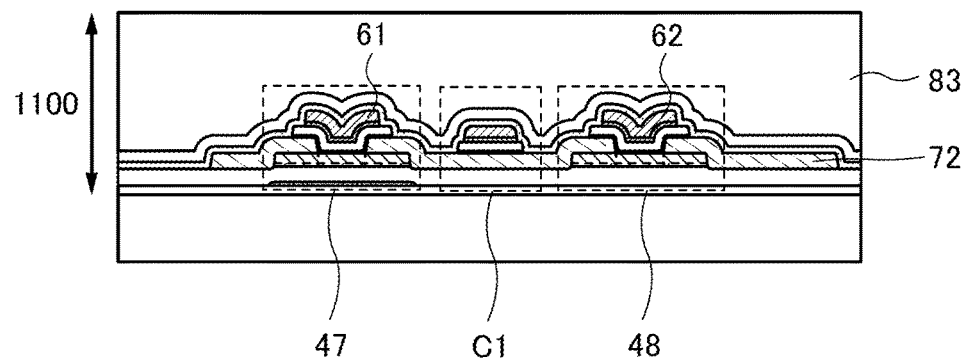

Note that although each transistor includes a back gate in FIG. 19A, each transistor does not necessarily include a back gate as illustrated in FIG. 19B. Alternatively, as illustrated in FIG. 19C, some of the transistors, for example, only the transistor 47 may include a back gate. The back gate might be electrically connected to a front gate of the transistor, which is provided to face the back gate. Alternatively, different fixed potentials might be supplied to the back gate and the front gate. Note that these descriptions on the presence or absence of the back gate can also be applied to other configurations of a pixel described in this embodiment.

A variety of elements can be used as the photoelectric conversion element PD provided in the layer 1200. FIG. 19A illustrates the photoelectric conversion element PD including a selenium-based material for a photoelectric conversion layer 561. The photoelectric conversion element PD including a selenium-based material has high external quantum efficiency with respect to visible light. Furthermore, the selenium-based material has a high light-absorption coefficient, making the photoelectric conversion layer 561 thin easily. The photoelectric conversion element PD including a selenium-based material can be a highly sensitive sensor in which the amount of amplification of electrons with respect to the amount of incident light is large because of an avalanche phenomenon. In other words, the use of a selenium-based material for the photoelectric conversion layer 561 allows a sufficient amount of photocurrent to be obtained even when the pixel area is reduced. Moreover, the photoelectric conversion element PD including a selenium-based material is also suitable for imaging in a low-illuminance environment.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to visible light and a higher absorption coefficient for visible light than amorphous selenium.

Although the photoelectric conversion layer 561 is illustrated as a single layer in FIG. 19A, gallium oxide, cerium oxide, an In—Ga—Zn oxide or the like as a hole-blocking layer may be provided on the light reception side of the selenium-based material, and nickel oxide, antimony sulfide, or the like as an electron-blocking layer may be provided on an electrode 566 side.

Furthermore, the photoelectric conversion layer 561 may be a layer including a compound of copper, indium, and selenium (CIS). Alternatively, a layer including a compound of copper, indium, gallium, and selenium (CIGS) may be used. A photoelectric conversion element including the CIS layer or the CIGS layer can also utilize an avalanche phenomenon like the photoelectric conversion element including only selenium.

In the photoelectric conversion element PD using the selenium-based material, for example, the photoelectric conversion layer 561 can be provided between a light-transmitting conductive layer 562 and the electrode 566 formed using a metal material or the like. Furthermore, CIS and CIGS are p-type semiconductors, and an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain breakdown voltage than the Si transistor, the application of a relatively high voltage to the photoelectric conversion element is easy. Thus, by combination of the OS transistor having high drain breakdown voltage and the photoelectric conversion element including the selenium-based material in the photoelectric conversion layer, a highly sensitive and highly reliable imaging device can be obtained.

Figure 21A:
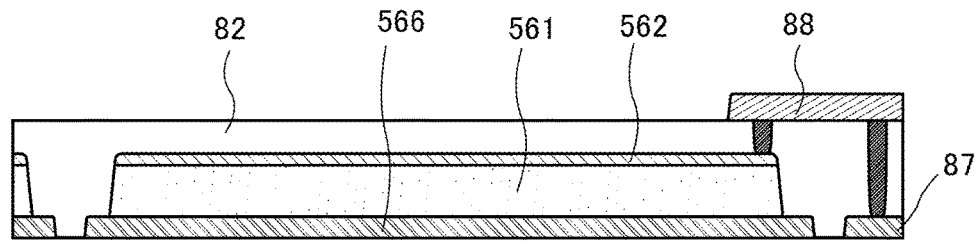
FIGS. 21A to 21D are cross-sectional views each illustrating connection of a photoelectric conversion element.
Figure 21B:
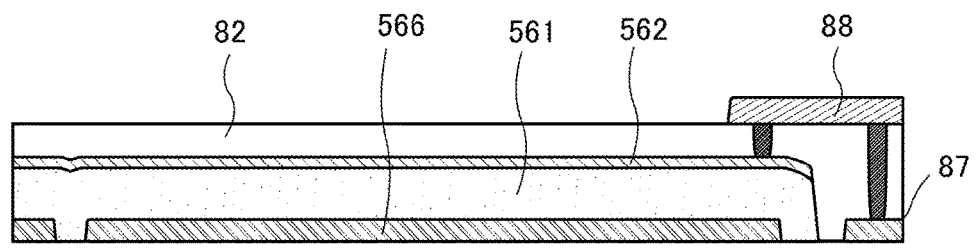
Figure 21C:
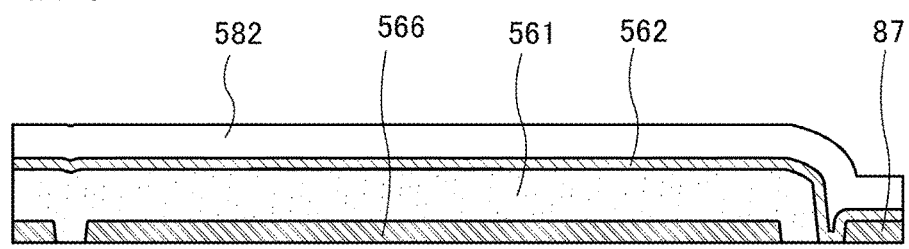
Figure 21D:
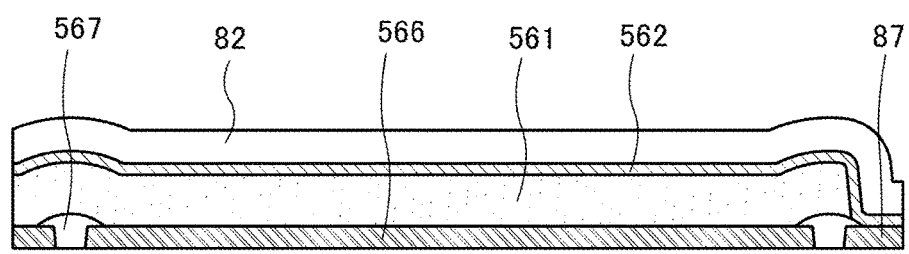

Although the photoelectric conversion layer 561 and the light-transmitting conductive layer 562 are not divided between pixel circuits in FIG. 19A, they may be divided between circuits as illustrated in FIG. 21A. In a region between pixels where the electrode 566 is not provided, a partition wall 567 formed of an insulator is preferably provided, thereby preventing generation of a crack in the photoelectric conversion layer 561 and the light-transmitting conductive layer 562. However, the partition wall 567 is not necessarily provided as illustrated in FIG. 21B. Although the light-transmitting conductive layer 562 and a wiring 87 are connected to each other through a wiring 88 and the conductor 81 in FIG. 19A, the light-transmitting conductive layer 562 and the wiring 87 may be in direct contact with each other as in FIGS. 21C and 21D.

Figure 22A:
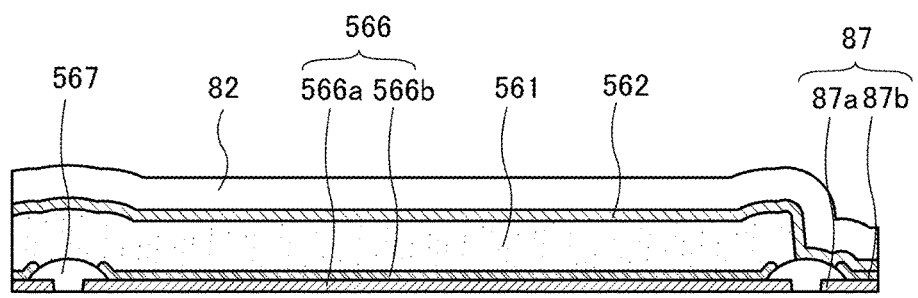
FIGS. 22A and 22B are cross-sectional views each illustrating connection of a photoelectric conversion element.

The electrode 566, the wiring 87, and the like may each be a multilayer. For example, as illustrated in FIG. 22A, the electrode 566 can include two conductive layers 566a and 566b and the wiring 87 can include two conductive layers 87a and 87b. In the structure in FIG. 22A, for example, the conductive layers 566a and 87a may be made of a low-resistance metal or the like, and the conductive layers 566b and 87b may be made of a metal or the like that exhibits an excellent contact property with the photoelectric conversion layer 561. Such a structure improves the electrical properties of the photoelectric conversion element PD. Furthermore, even when the conductive layer 87a contains a metal that causes electrolytic corrosion by being in contact with the light-transmitting conductive layer 562, the electrolytic corrosion can be prevented because the conductive layer 87b is between the conductive layer 87a and the light-transmitting conductive layer 562.

The conductive layers 566b and 87b can be formed using, for example, molybdenum, tungsten, or the like. The conductive layers 566a and 87a can be formed using, for example, aluminum, titanium, or a stack of titanium, aluminum, and titanium that are layered in that order.

Figure 22B:
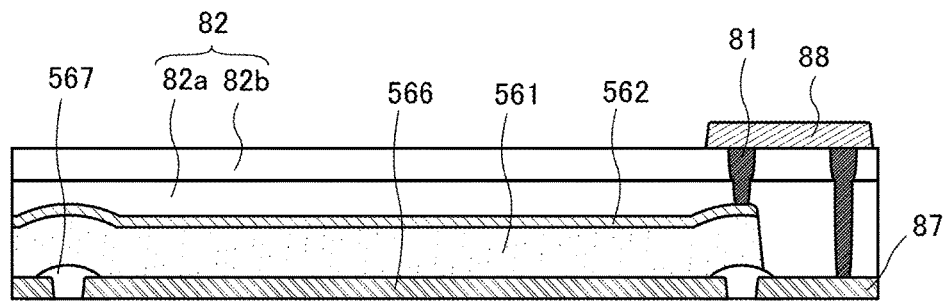

The insulating layer 82 and the like may each be a multilayer. For example, as illustrated in FIG. 22B, the conductor 81 has a difference in level in the case where the insulating layer 82 includes insulating layers 82a and 82b that have different etching rates. In the case where another insulating layer used as an interlayer insulating film or a planarization film is a multilayer, the conductor 81 also has a difference in level. Although the insulating layer 82 is formed using two layers here, the insulating layer 82 and another insulating layer may each be formed using three or more layers.

The partition wall 567 can be formed using an inorganic insulator, an insulating organic resin, or the like. The partition wall 567 may be colored black or the like in order to shield the transistors and the like from light and/or to determine the area of a light-receiving portion in each pixel.

Alternatively, a PIN diode element formed using an amorphous silicon film, a microcrystalline silicon film, or the like may be used as the photoelectric conversion element PD.

Figure 23:
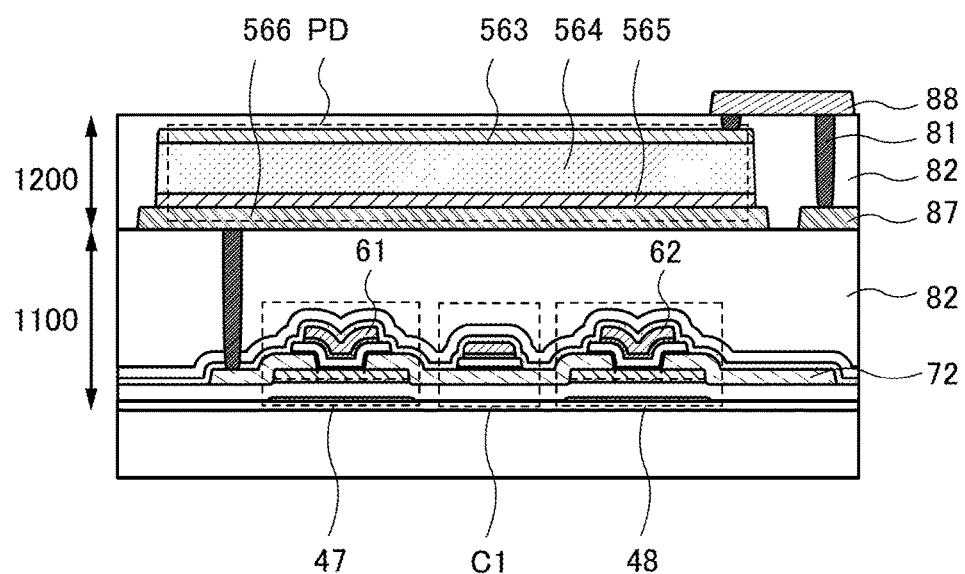
FIG. 23 is a cross-sectional view illustrating an imaging device.

FIG. 23 illustrates an example in which a thin film PIN photodiode is used as the photoelectric conversion element PD. In the photodiode, an n-type semiconductor layer 565, an i-type semiconductor layer 564, and a p-type semiconductor layer 563 are stacked in that order. The i-type semiconductor layer 564 is preferably formed using amorphous silicon. The p-type semiconductor layer 563 and the n-type semiconductor layer 565 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element PD in FIG. 23, the n-type semiconductor layer 565 functioning as a cathode is in contact with the electrode 566 that is electrically connected to the transistor 47. Furthermore, the p-type semiconductor layer 563 functioning as an anode is electrically connected to the wiring 87 through the conductor 81.

As illustrated in FIG. 15A, the photoelectric conversion element PD may be connected in a manner opposite to that illustrated in FIG. 2. Therefore, in FIG. 23, the anode and the cathode of the photoelectric conversion element PD are connected to the electrode layer and the wiring in a manner opposite to that in FIG. 2 in some cases.

In any case, the photoelectric conversion element PD is preferably formed so that the p-type semiconductor layer 563 serves as a light-receiving surface. When the p-type semiconductor layer 563 serves as a light-receiving surface, the output current of the photoelectric conversion element PD can be increased.

FIGS. 24A to 24F show other examples of the structure of the photoelectric conversion element PD having a configuration of a PIN thin film photodiode and the connection between the photoelectric conversion element PD and the wirings. Note that the structure of the photoelectric conversion element PD and the connection between the photoelectric conversion element PD and the wirings are not limited thereto, and other configurations may be applied.

Figure 24A:
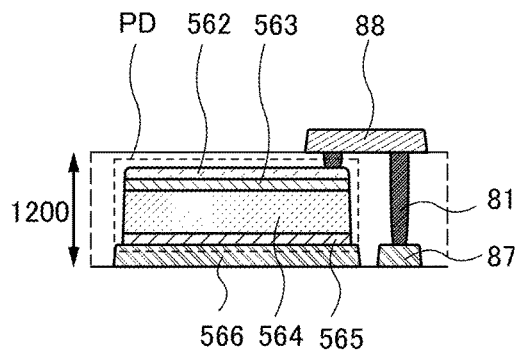
FIGS. 24A to 24F are cross-sectional views each illustrating connection of a photoelectric conversion element.

FIG. 24A illustrates a structure of the photoelectric conversion element PD that includes the light-transmitting conductive layer 562 in contact with the p-type semiconductor layer 563. The light-transmitting conductive layer 562 serves as an electrode and can increase the output current of the photoelectric conversion element PD.

For the light-transmitting conductive layer 562, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 562 is not limited to a single layer, and may be a stacked layer of different films.

Figure 24B:
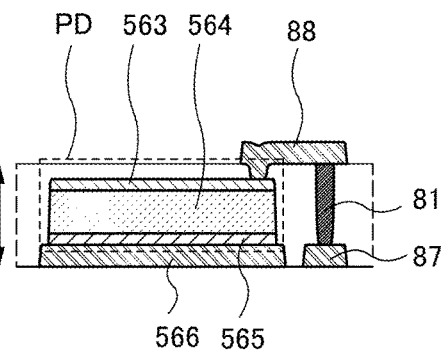

FIG. 24B illustrates a structure of the photoelectric conversion element PD in which the p-type semiconductor layer 563 is electrically connected directly to the wiring 88.

Figure 24C:
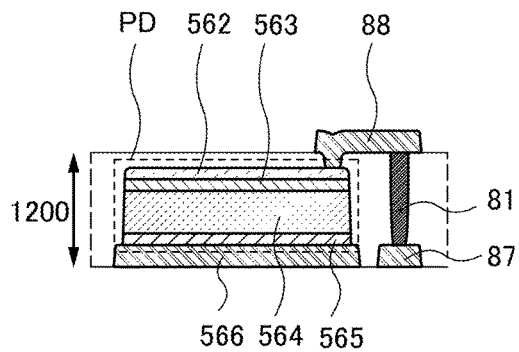

FIG. 24C illustrates a structure of the photoelectric conversion element PD which includes the light-transmitting conductive layer 562 in contact with the p-type semiconductor layer 563 and in which the wiring 87 is electrically connected to the light-transmitting conductive layer 562.

Figure 24D:
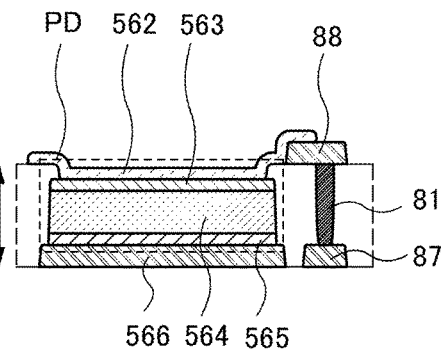

FIG. 24D illustrates a structure in which an opening exposing the p-type semiconductor layer 563 is provided in an insulating layer covering the photoelectric conversion element PD, and the light-transmitting conductive layer 562 that covers the opening is electrically connected to the wiring 88.

Figure 24E:
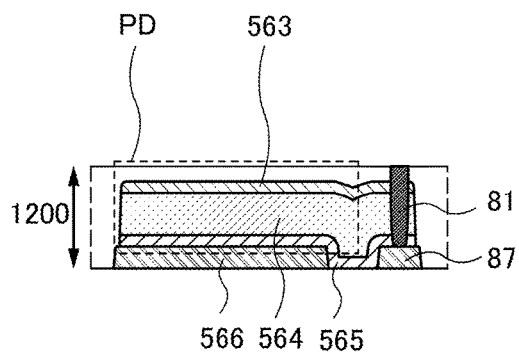

FIG. 24E illustrates a structure including the conductor 81 which penetrates the photoelectric conversion element PD. In the structure, the wiring 87 is electrically connected to the p-type semiconductor layer 563 through the conductor 81. In the drawing, the wiring 87 appears to be electrically connected to the electrode 566 through the n-type semiconductor layer 563. However, because of a high resistance in the lateral direction of the n-type semiconductor layer 563, the resistance between the wiring 87 and the electrode 566 is extremely high when there is an appropriate distance therebetween. Thus, the photoelectric conversion element PD can have diode characteristics without a short circuit between the anode and the cathode. Note that two or more conductors 81 that are electrically connected to the p-type semiconductor layer 563 may be provided.

Figure 24F:
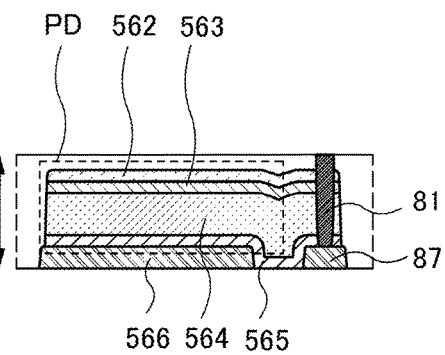

FIG. 24F illustrates a structure in which the photoelectric conversion element PD in FIG. 24E is provided with the light-transmitting conductive layer 562 in contact with the p-type semiconductor layer 563.

Each of the photoelectric conversion elements PD illustrated in FIGS. 24D to 24F has an advantage of having a large light-receiving area because wirings and the like do not overlap with a light-receiving region.

Figure 25:
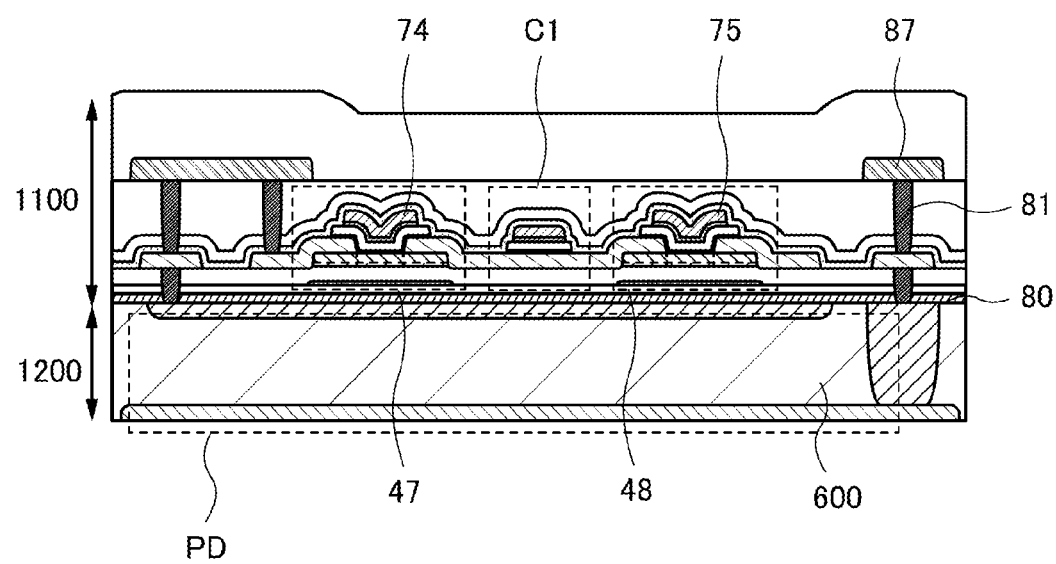
FIG. 25 is a cross-sectional view illustrating an imaging device.

Alternatively, as illustrated in FIG. 25, the photoelectric conversion element PD may be a photodiode including a silicon substrate 600 as a photoelectric conversion layer.

The photoelectric conversion element PD including the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 561 does not need to be divided between circuits as illustrated in FIG. 19A. Therefore, the imaging device of one embodiment of the present invention can be manufactured with a high yield at low cost. In contrast, a photodiode including the silicon substrate 600 as the photoelectric conversion layer requires difficult processes such as a polishing process and a bonding process.

Figure 26A:
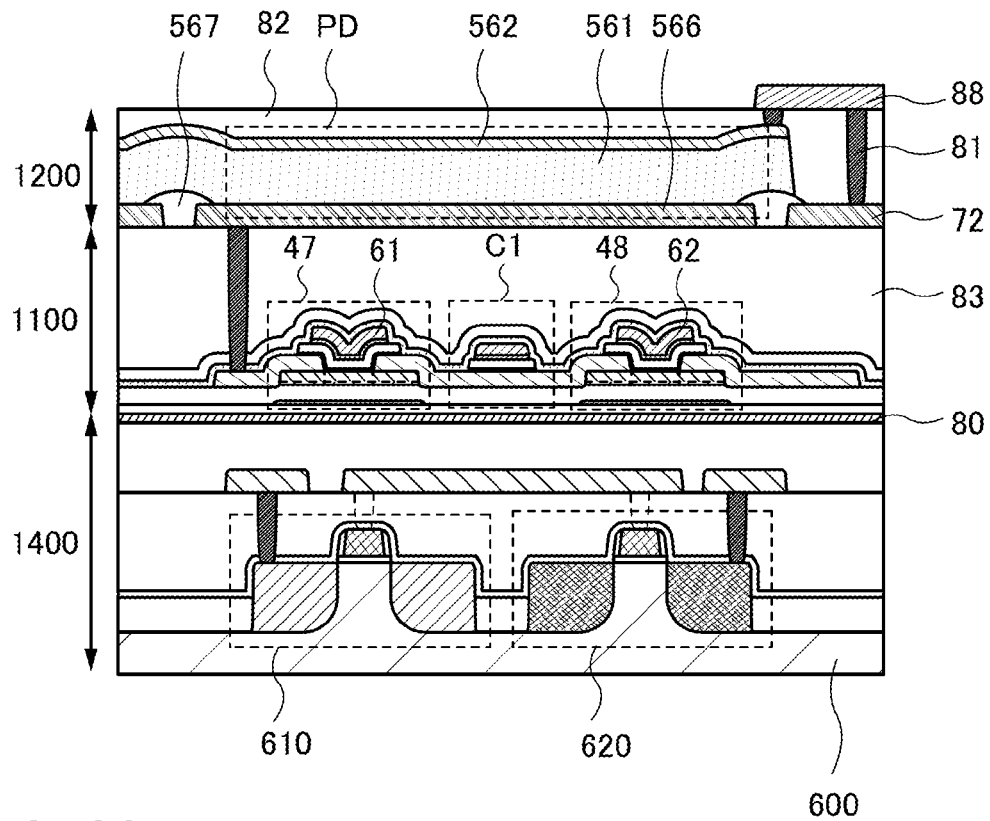
FIGS. 26A and 26B are cross-sectional views illustrating an imaging device.
Figure 26B:
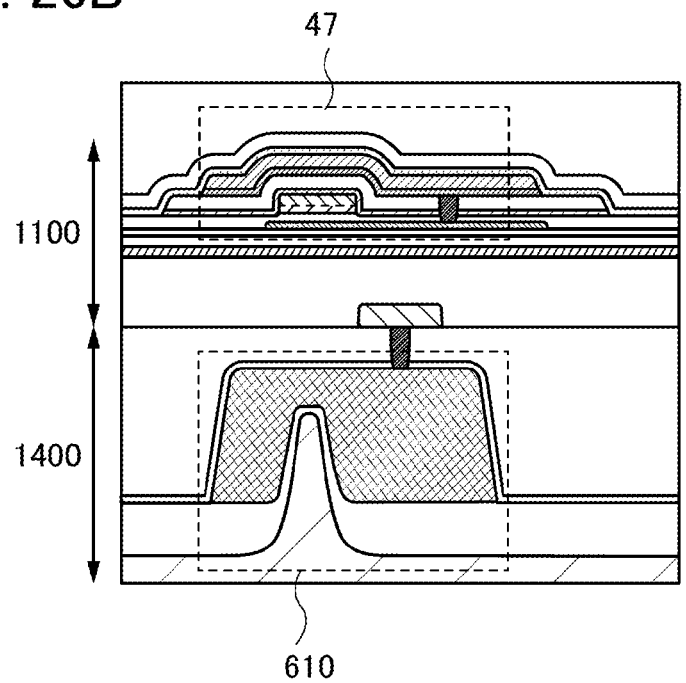

Furthermore, in the imaging device of one embodiment of the present invention, a stack including the silicon substrate 600 in which a circuit is formed may be used. For example, as illustrated in FIG. 26A, the pixel circuit may overlap with a layer 1400 that includes transistors 610 and 620 whose active regions are formed in the silicon substrate 600. FIG. 26B is a cross-sectional view illustrating the transistors in the channel width direction.

Figure 27A:
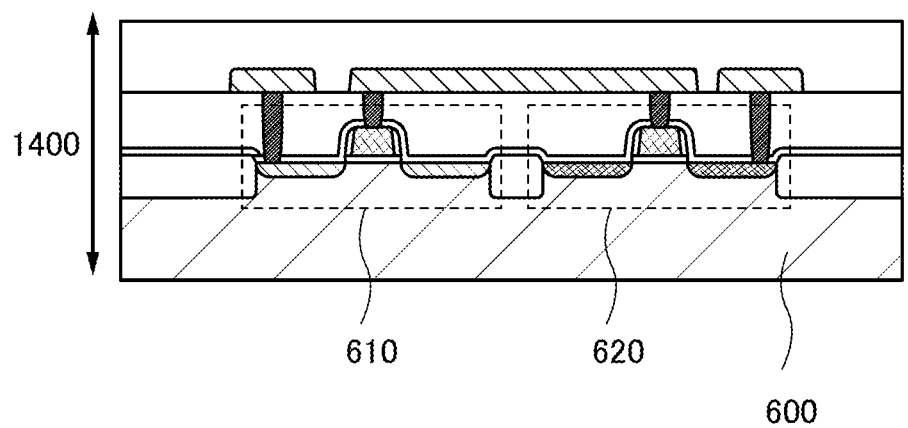
FIGS. 27A to 27C are cross-sectional views and a circuit diagram illustrating an imaging device.
Figure 27B:
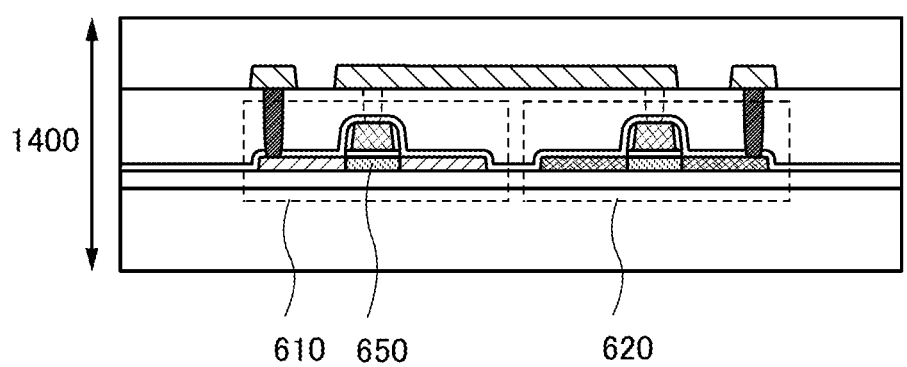

Although FIGS. 26A and 26B show the Si transistors of a fin type, the transistors may be of a planar type as illustrated in FIG. 27A. Alternatively, as illustrated in FIG. 27B, they may be transistors each including an active layer 650 formed using a silicon thin film. The active layer 650 can be formed using polycrystalline silicon or single crystal silicon of a silicon-on-insulator (SOI) structure.

Figure 27C:
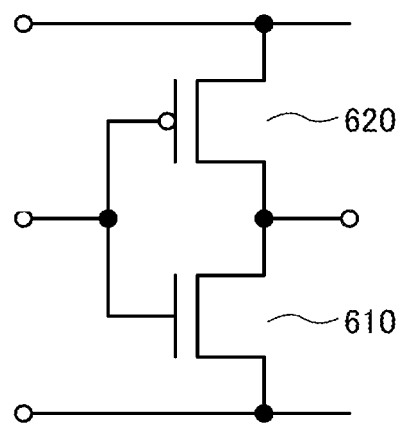

The circuit formed on the silicon substrate 600 is capable of reading a signal output from the pixel circuit and converting the signal; for example, the circuit may include a CMOS inverter as illustrated in the circuit diagram in FIG. 27C. A gate of the transistor 610 (n-channel transistor) is electrically connected to a gate of the transistor 620 (p-channel transistor). One of a source and a drain of one of the transistors 610 and 620 is electrically connected to one of a source and a drain of the other transistor. The other of the source and the drain of the one transistor is electrically connected to a wiring and the other of the source and the drain of the other transistor is electrically connected to another wiring.

The circuit formed on the silicon substrate 600 corresponds to each of the circuit 22, the circuit 23, the circuit 24, the circuit 25, the circuit 26, the circuit 27, the buffer circuit 31, and the like illustrated in FIG. 1, for example.

The silicon substrate 600 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 25 and FIG. 26A, an insulating layer 80 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 610 and 620. Therefore, hydrogen has an effect of improving the reliability of the transistors 610 and 620. Meanwhile, hydrogen in insulating layers provided in the vicinity of the oxide semiconductor layer that is the active layer of the transistor 47 or the like causes generation of carriers in the oxide semiconductor layer, and therefore may reduce the reliability of the transistor 47 or the like. Thus, the insulating layer 80 having a function of preventing diffusion of hydrogen is preferably provided between one layer including the transistor using a silicon-based semiconductor material and another layer stacked thereon that includes the transistor using an oxide semiconductor. Hydrogen is confined in the one layer by the insulating layer 80, so that the reliability of the transistors 610 and 620 can be improved. Furthermore, diffusion of hydrogen from the one layer to the other layer is inhibited, so that the reliability of the transistor 47 or the like can also be improved.

The insulating layer 80 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

As illustrated in FIG. 26A, a circuit (e.g., a driver circuit) formed on the silicon substrate 600, the transistor 47 or the like, and the photoelectric conversion element PD can overlap with each other; thus, the integration degree of pixels can be increased. In other words, the resolution of the imaging device can be increased. Such a structure is suitable for an imaging device with, for example, 4K2K, 8K4K, or 16K8K pixels. Note that a structure may be employed in which a Si transistor is formed as the transistor 50 or the like included in the pixel 20 so as to overlap with the transistor 47, the transistor 48, the photoelectric conversion element PD, and the like.

Figure 28:
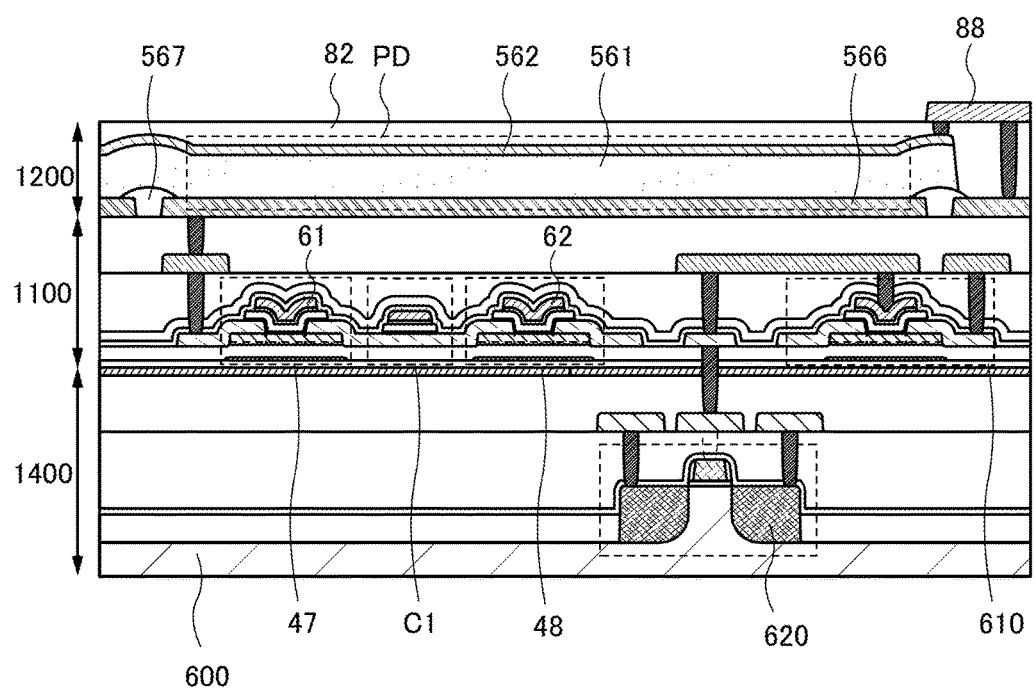
FIG. 28 is a cross-sectional view illustrating an imaging device.

An imaging device of one embodiment of the present invention can also have a structure in FIG. 28.

The imaging device in FIG. 28 is a modification example of the imaging device in FIG. 26A. A CMOS inverter is formed using an OS transistor and a Si transistor.

Here, the transistor 620 is a p-channel Si transistor provided in the layer 1400, and the transistor 610 is an n-channel OS transistor provided in the layer 1100. When only the p-channel transistor is provided on the silicon substrate 600, a step of forming a well, an n-type impurity layer, or the like can be skipped.

Although selenium is used for the photoelectric conversion element PD in the imaging device in FIG. 28, a PIN thin film photodiode may be used as in FIG. 23.

In the imaging device in FIG. 28, the transistor 610 can be formed through the same process as the transistors 47 and 48 formed in the layer 1100. Thus, the manufacturing process of the imaging device can be simplified.

Figure 29:
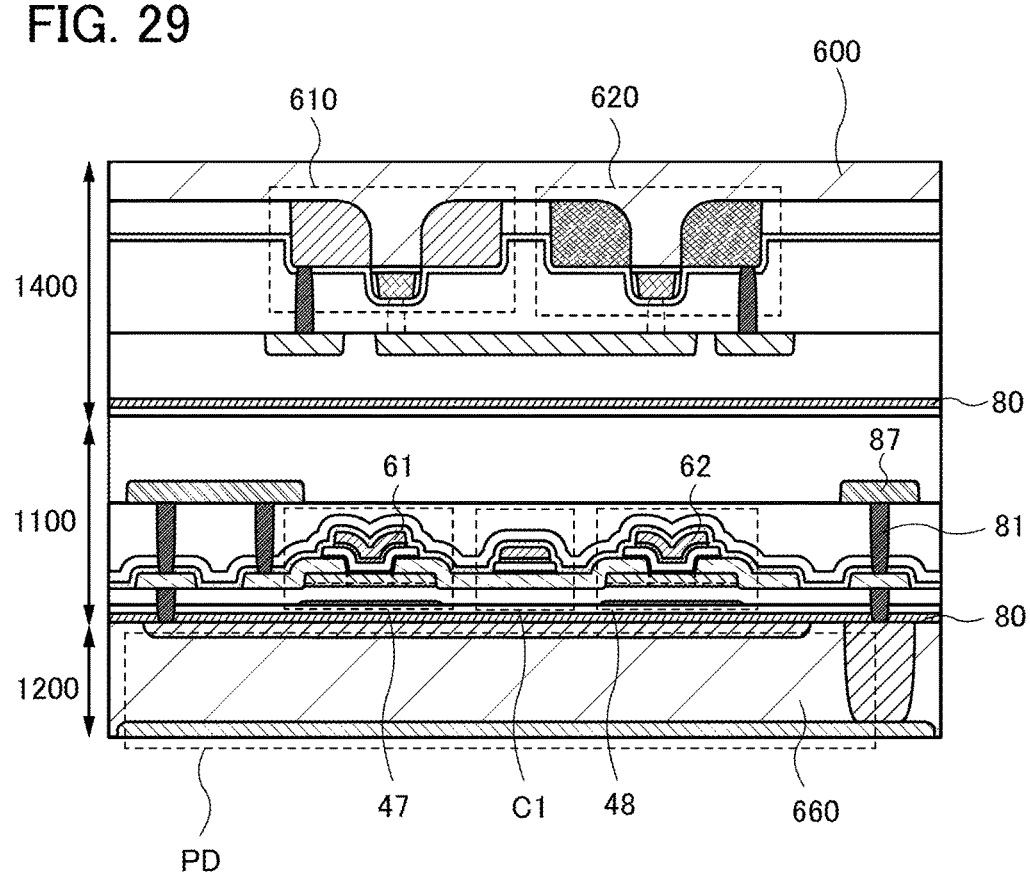
FIG. 29 is a cross-sectional view illustrating an imaging device.

As illustrated in FIG. 29, an imaging device of one embodiment of the present invention may have a structure where a pixel includes the photoelectric conversion element PD formed on a silicon substrate 660 and OS transistors formed over the photoelectric conversion element PD and the pixel and the silicon substrate 600 on which the circuit is formed are attached to each other. Such a structure is suitable for increasing the effective area of the photoelectric conversion element PD formed on the silicon substrate 660. Furthermore, the integration degree of the circuit formed on the silicon substrate 600 can be improved using miniaturized Si transistors; thus, a high-performance imaging device can be provided.

Figure 30:
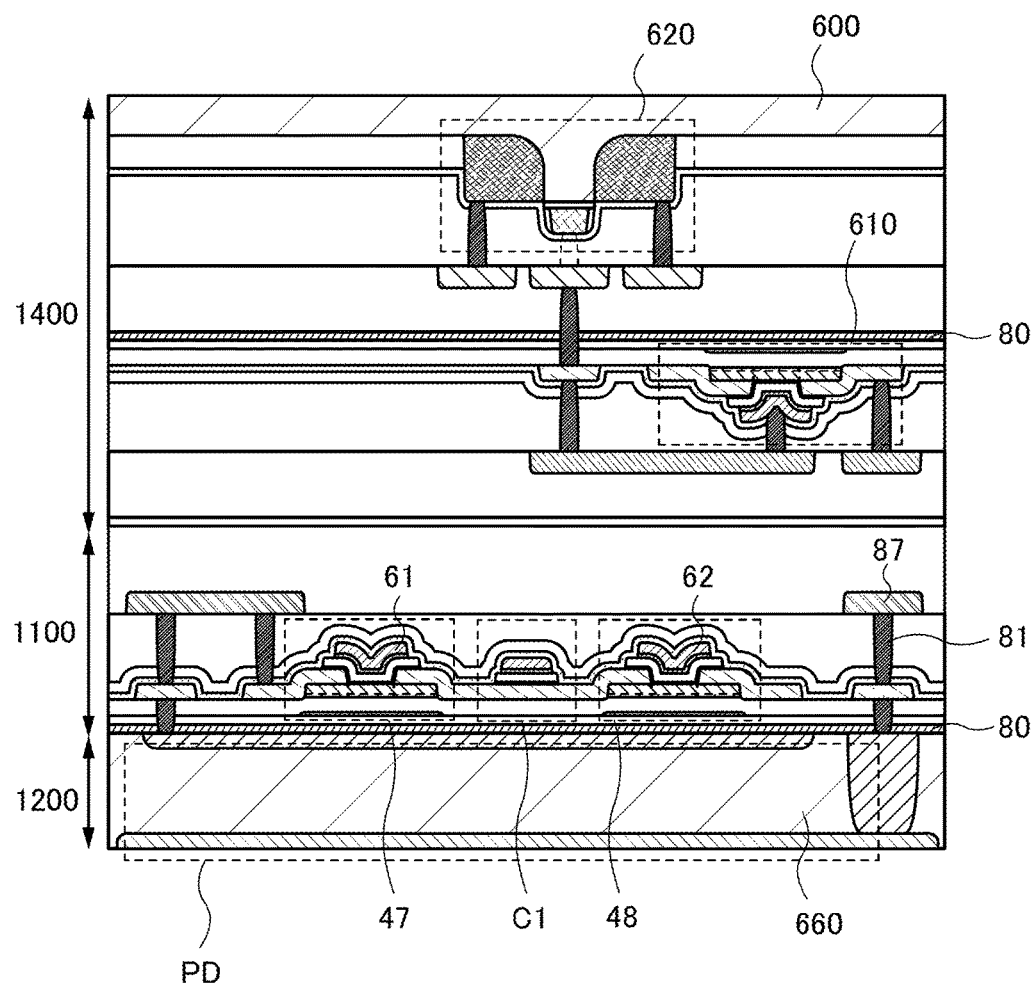
FIG. 30 is a cross-sectional view illustrating an imaging device.

FIG. 30 shows a modification example of FIG. 29, in which a circuit includes an OS transistor and a Si transistor. Such a structure is suitable for increasing the effective area of the photoelectric conversion element PD formed on the silicon substrate 660. Furthermore, the integration degree of the circuit formed on the silicon substrate 600 can be improved using miniaturized Si transistors; thus, a high-performance imaging device can be provided.

In the case of the structure illustrated in FIG. 30, a CMOS circuit can be formed using the Si transistor on the silicon substrate 600 and the OS transistor thereon. Since the off-state current of the OS transistor is extremely low, the static leakage current of the CMOS circuit can be extremely low.

Note that the structure of the transistor and the photoelectric conversion element included in each of the imaging devices described in this embodiment is only an example. Therefore, for example, one or more of the transistors 47 to 50 may include silicon or the like in an active region or an active layer. Furthermore, one of or both the transistors 610 and 620 may include an oxide semiconductor layer as an active layer.

Figure 31A:
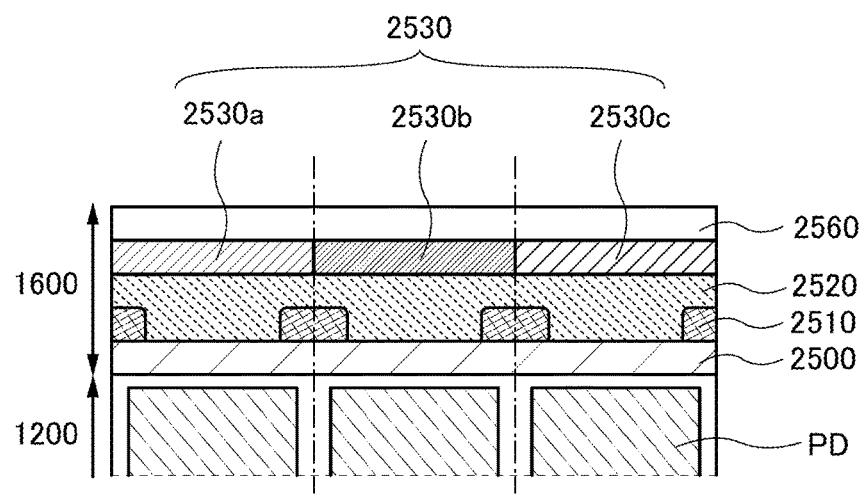
FIGS. 31A to 31C are cross-sectional views each illustrating a structure of an imaging device.

FIG. 31A is a cross-sectional view of an example of a mode in which a color filter and the like are added to the imaging device. The cross-sectional view illustrates part of a region including pixel circuits for three pixels. An insulating layer 2500 is formed over the layer 1200 where the photoelectric conversion element PD is formed. As the insulating layer 2500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed of a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (a color filter 2530a, a color filter 2530b, and a color filter 2530c) is formed in each pixel. For example, the color filter 2530a, the color filter 2530b, and the color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 31B:
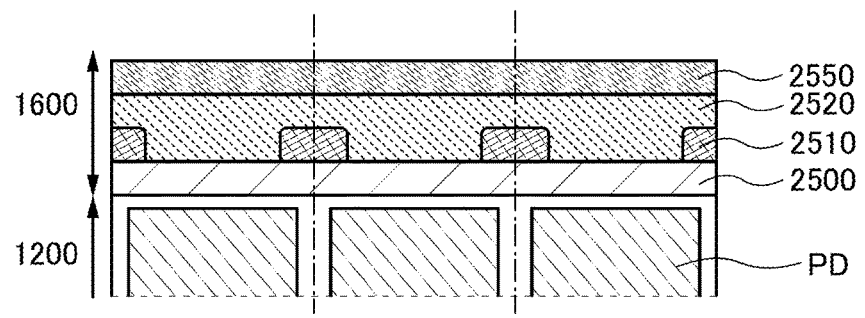

As illustrated in FIG. 31B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that takes an image visualizing the intensity of radiation and is used for an X-ray imaging device or the like can be obtained. Radiation such as X-rays passes through a subject to enter a scintillator, and then is converted into light (fluorescence) such as visible light or ultraviolet light owing to a phenomenon known as photoluminescence. Then, the photoelectric conversion element PD detects the light to obtain image data. Furthermore, the imaging device having the structure may be used in a radiation detector or the like.

A scintillator includes a substance that, when irradiated with radiation such as X-rays or gamma-rays, absorbs energy of the radiation to emit visible light or ultraviolet light. For example, a resin or ceramics in which any of $Gd_2O_2S$:Tb, $Gd_2O_2S$:Pr, $Gd_2O_2S$:Eu, $BaFC_1$:Eu, NaI, CsI, $CaF_2$, $BaF_2$, $CeF_3$, LiF, LiI, and ZnO is dispersed can be used.

In the photoelectric conversion element PD using a selenium-based material, radiation such as X-rays can be directly converted into charge; thus, the scintillator is not necessarily used.

Figure 31C:
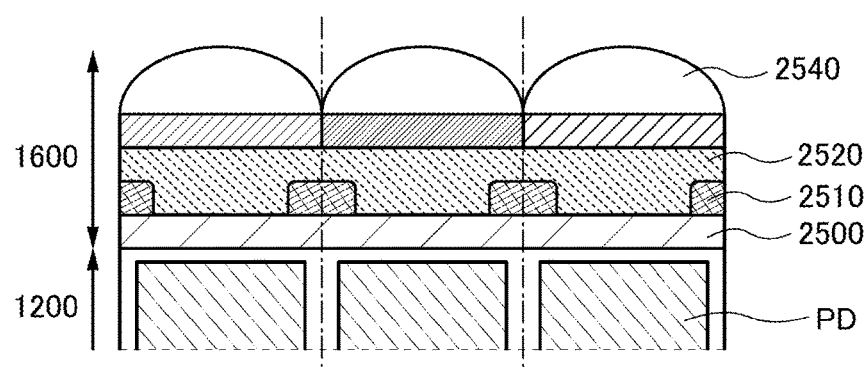

Alternatively, as illustrated in FIG. 31C, a microlens array 2540 may be provided over the color filters 2530a, 2530b, and 2530c. Light penetrating lenses included in the microlens array 2540 goes through the color filters positioned thereunder to reach the photoelectric conversion element PD. Note that a region other than the layer 1200 in FIGS. 31A to 31C is referred to as a layer 1600.

Figure 32:
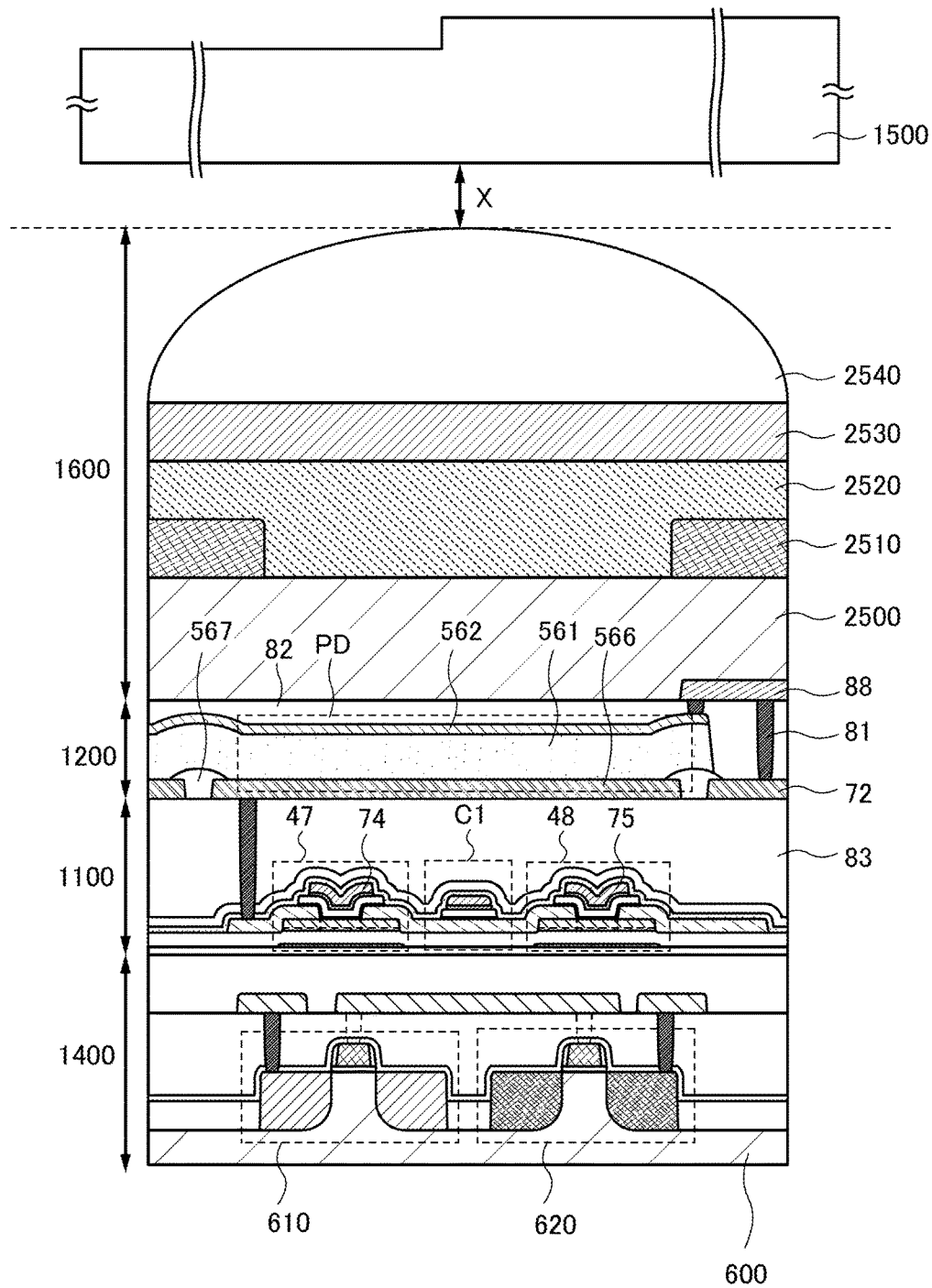
FIG. 32 is a cross-sectional view illustrating a structure of an imaging device.

FIG. 32 illustrates a specific example of a layered structure including the pixel 20 of one embodiment of the present invention, the microlens array 2540 illustrated in FIG. 31C, and the like. In the example illustrated in FIG. 32, the structure of the pixel illustrated in FIG. 26A is used. In the case of using the pixel illustrated in FIG. 25, a structure illustrated in FIG. 33 is employed.

The photoelectric conversion element PD, the circuit of the pixel 20, and the driver circuit can be positioned so as to overlap with each other in this manner, leading to a reduction in the size of the imaging device.

Figure 33:
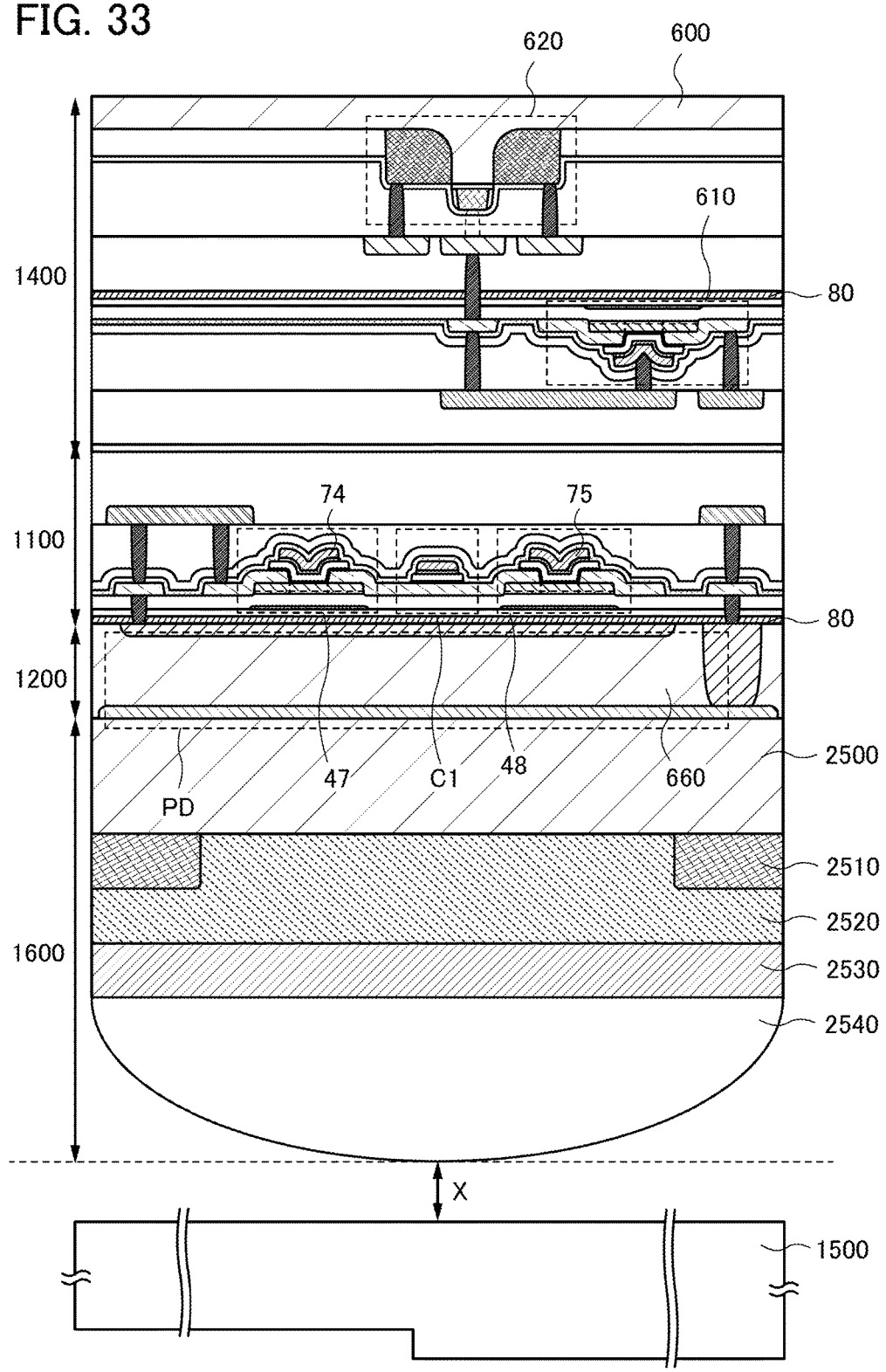
FIG. 33 is a cross-sectional view illustrating a structure of an imaging device.

As illustrated in FIG. 32 and FIG. 33, a diffraction grating 1500 may be provided above the microlens array 2540. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

A space X may be provided between the diffraction grating 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

As illustrated in FIGS. 34A1 and 34B1, the imaging device may be bent. FIG. 34A1 illustrates a state in which the imaging device is bent in the direction of dashed-two dotted line X1-X2. FIG. 34A2 is a cross-sectional view illustrating a portion indicated by dashed-two dotted line X1-X2 in FIG. 34A1. FIG. 34A3 is a cross-sectional view illustrating a portion indicated by dashed-two dotted line Y1-Y2 in FIG. 34A1.

FIG. 34B1 illustrates a state where the imaging device is bent in the direction of dashed-two dotted line X3-X4 and the direction of dashed-two dotted line Y3-Y4. FIG. 34B2 is a cross-sectional view illustrating a portion indicated by dashed-two dotted line X3-X4 in FIG. 34B1. FIG. 34B3 is a cross-sectional view illustrating a portion indicated by dashed-two dotted line Y3-Y4 in FIG. 34B1.

Bending the imaging device can reduce field curvature and astigmatism. Thus, the optical design of lens and the like, which is used in combination of the imaging device, can be facilitated. For example, the number of lenses used for aberration correction can be reduced; accordingly, the size or weight of electronic devices including the imaging device can be easily reduced. In addition, the quality of a captured image can be improved.

In Embodiment 1, one embodiment of the present invention has been described. Other embodiments of the present invention will be described in Embodiments 2 to 6. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

This embodiment can be implemented in appropriate combination with any of the structures described in the other embodiments.

Embodiment 2

In this embodiment, a transistor including an oxide semiconductor that can be used in one embodiment of the present invention will be described with reference to drawings. In the drawings in this embodiment, some components are enlarged, reduced in size, or omitted for easy understanding.

Figure 35A:
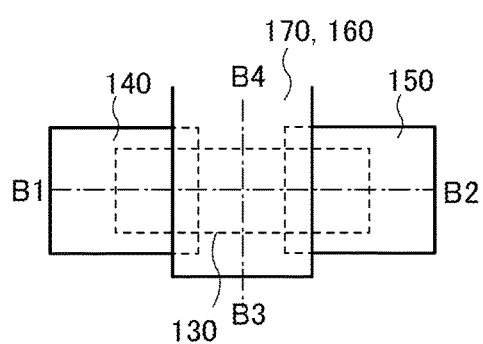
FIGS. 35A to 35F are top views and cross-sectional views illustrating transistors.
Figure 35B:
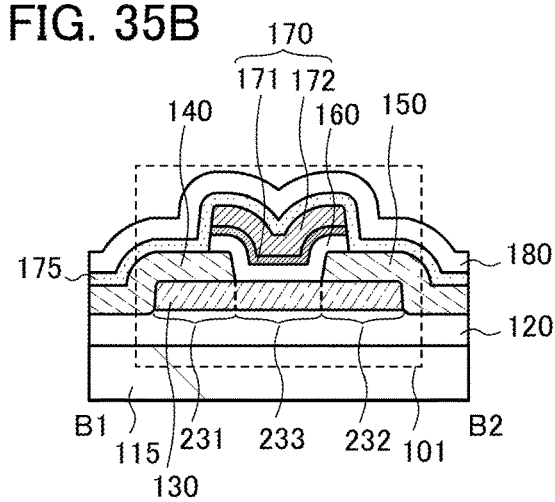
Figure 37A:
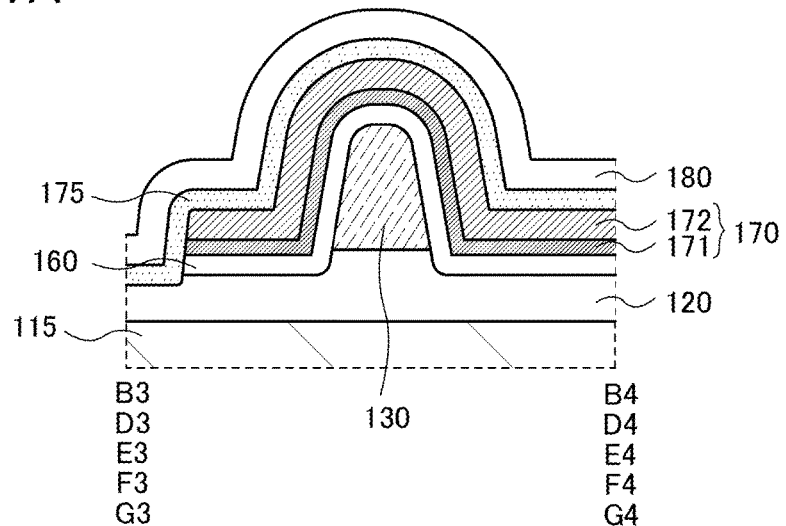
FIGS. 37A to 37D each illustrate a cross section of a transistor in a channel width direction.

FIGS. 35A and 35B are a top view and a cross-sectional view illustrating a transistor 101 of one embodiment of the present invention. FIG. 35A is the top view, and FIG. 35B illustrates a cross section in the direction of dashed-dotted line B1-B2 in FIG. 35A. A cross section in the direction of dashed-dotted line B3-B4 in FIG. 35A is illustrated in FIG. 37A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

Here, the conductive layer 140, the conductive layer 150, the insulating layer 160, and the conductive layer 170 can respectively function as a source electrode layer, a drain electrode layer, a gate insulating film, and a gate electrode layer.

A region 231, a region 232, and a region 233 in FIG. 35B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of opposite polarity is used or when the direction of current flow is changed in circuit operation, for example. Therefore, the terms "source" and "drain" can be interchanged with each other in this specification. In addition, the term "electrode layer" can be replaced with the term "wiring."

The conductive layer 170 includes two layers, a conductive layer 171 and a conductive layer 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

Figure 35C:
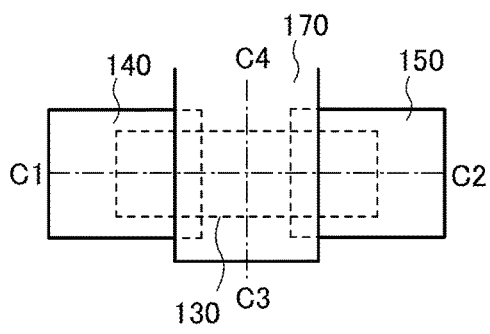
Figure 35D:
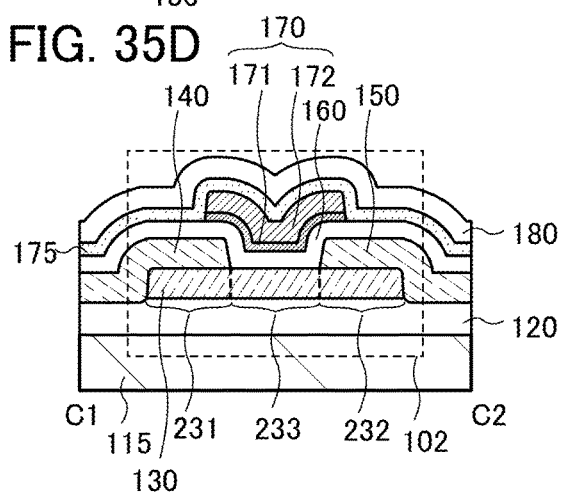
Figure 37B:
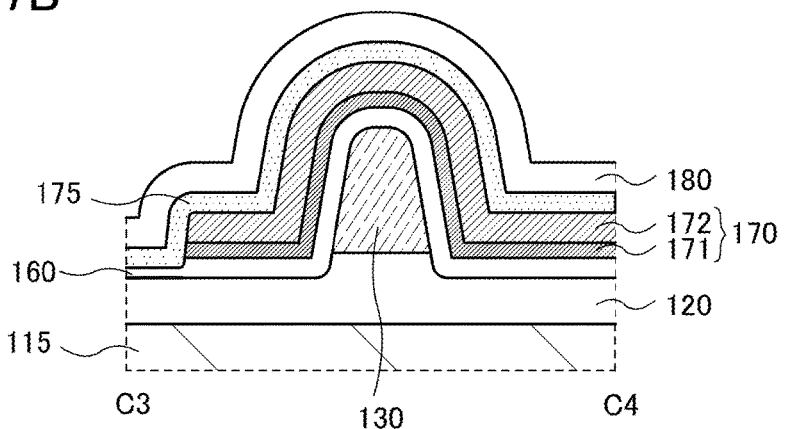

The transistor in one embodiment of the present invention may have a structure illustrated in FIGS. 35C and 35D. FIG. 35C is a top view of a transistor 102. A cross section in the direction of dashed-dotted line C1-C2 in FIG. 35C is illustrated in FIG. 35D. A cross section in the direction of dashed-dotted line C3-C4 in FIG. 35C is illustrated in FIG. 37B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has a feature of a low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with a high on-state current can be easily formed.

Figure 35E:
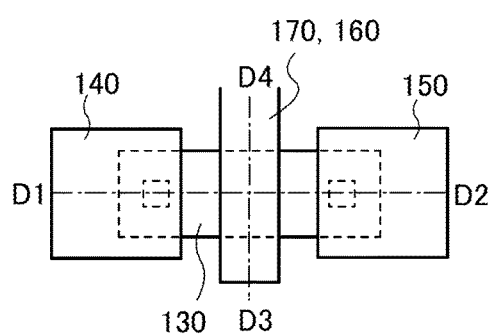
Figure 35F:
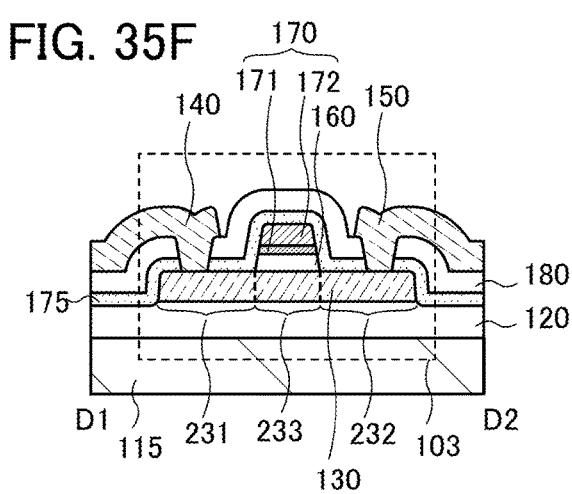

The transistor in one embodiment of the present invention may have a structure illustrated in FIGS. 35E and 35F. FIG. 35E is a top view of a transistor 103. A cross section in the direction of dashed-dotted line D1-D2 in FIG. 35E is illustrated in FIG. 35F. A cross section in the direction of dashed-dotted line D3-D4 in FIG. 35E is illustrated in FIG. 37A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 35F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 36A:
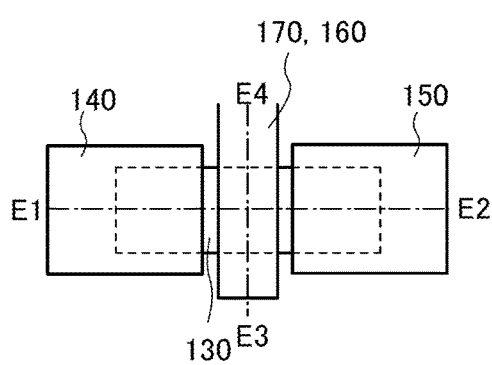
FIGS. 36A to 36F are top views and cross-sectional views illustrating transistors.
Figure 36B:
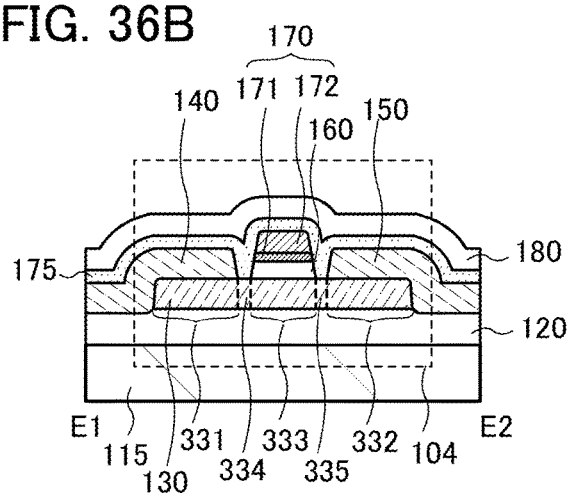

The transistor in one embodiment of the present invention may have a structure illustrated in FIGS. 36A and 36B. FIG. 36A is a top view of a transistor 104. A cross section in the direction of dashed-dotted line E1-E2 in FIG. 36A is illustrated in FIG. 36B. A cross section in the direction of dashed-dotted line E3-E4 in FIG. 36A is illustrated in FIG. 37A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 36B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 36C:
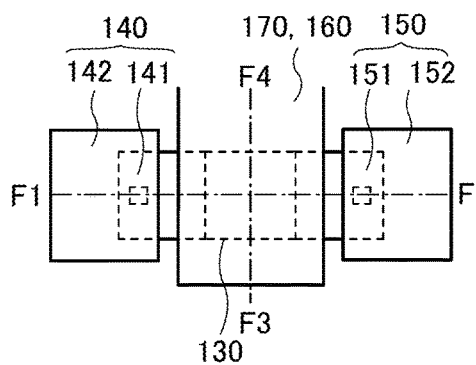
Figure 36D:
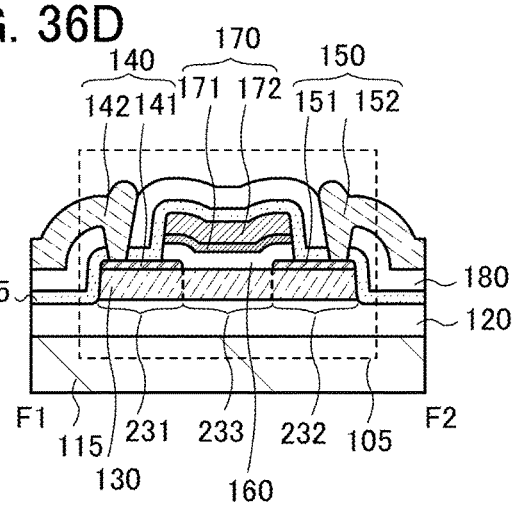

The transistor in one embodiment of the present invention may have a structure illustrated in FIGS. 36C and 36D. FIG. 36C is a top view of a transistor 105. A cross section in the direction of dashed-dotted line F1-F2 in FIG. 36C is illustrated in FIG. 36D. A cross section in the direction of dashed-dotted line F3-F4 in FIG. 36C is illustrated in FIG. 37A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 36E:
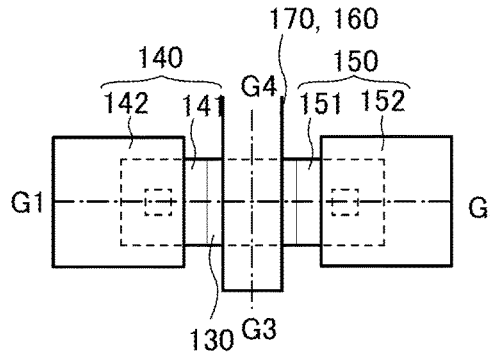
Figure 36F:
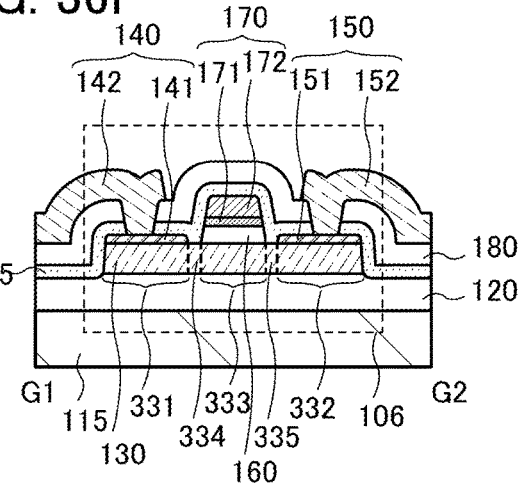

The transistor in one embodiment of the present invention may have a structure illustrated in FIGS. 36E and 36F. FIG. 36E is a top view of a transistor 106. A cross section in the direction of dashed-dotted line G1-G2 in FIG. 36E is illustrated in FIG. 36F. A cross section in the direction of dashed-dotted line G3-G4 in FIG. 36A is illustrated in FIG. 37A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 37C:
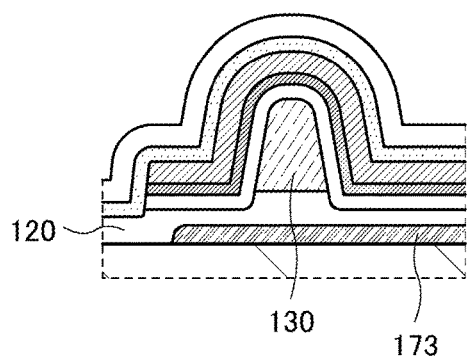
Figure 37D:
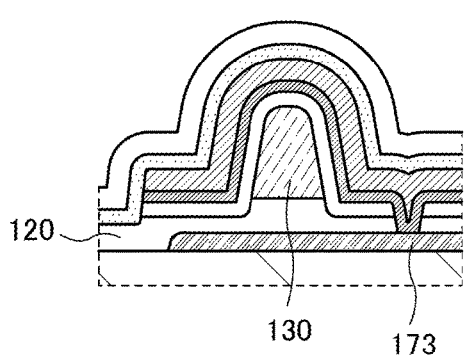
Figure 38A:
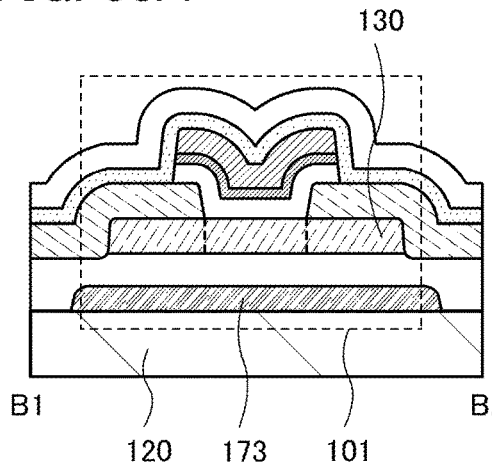
FIGS. 38A to 38F each illustrate a cross section of a transistor in a channel length direction.
Figure 38B:
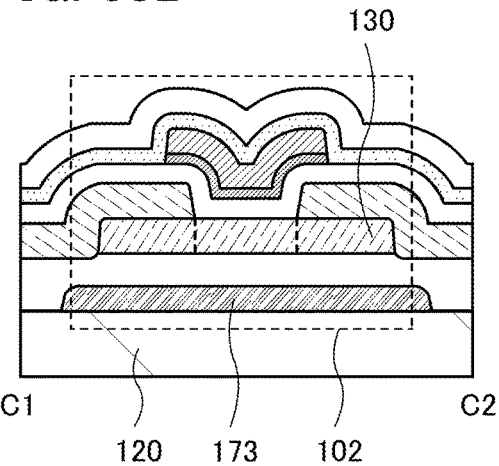
Figure 38C:
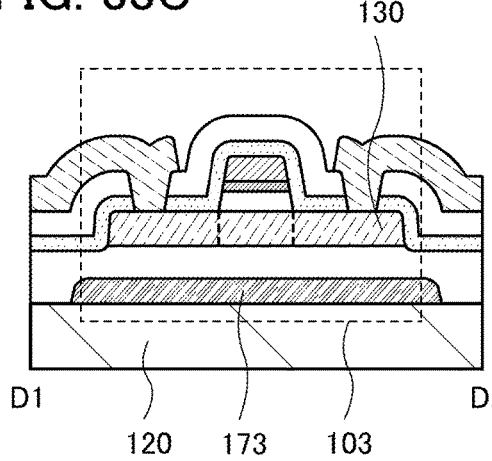
Figure 38D:
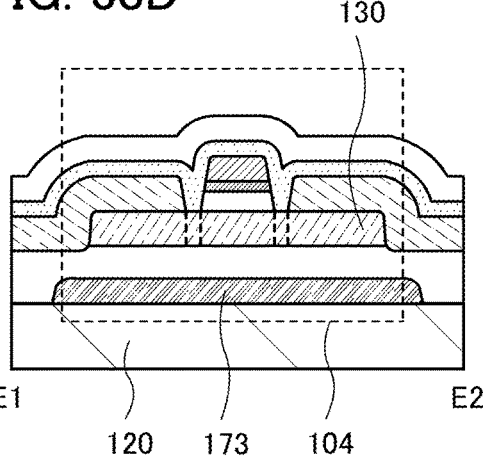
Figure 38E:
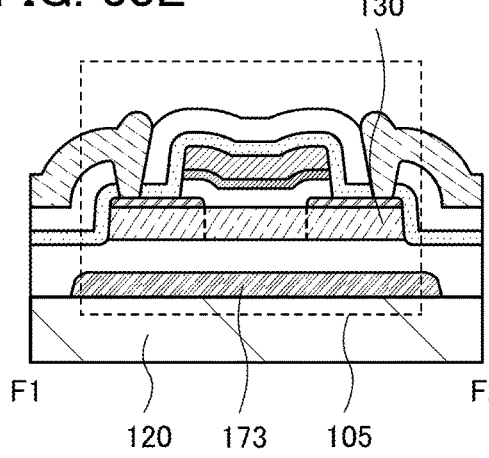
Figure 38F:
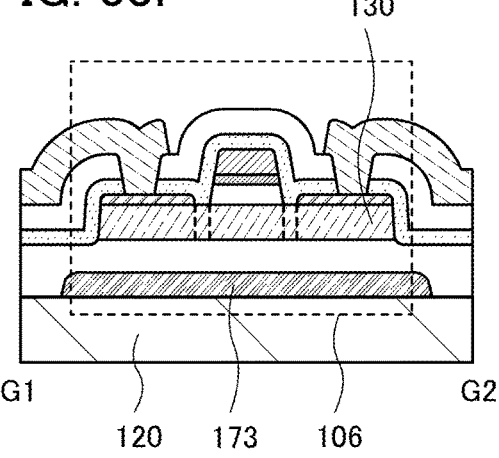

The transistor in one embodiment of the present invention may include a conductive layer 173 between the oxide semiconductor layer 130 and the substrate 115 as illustrated in cross-sectional views in the channel length direction in FIGS. 38A to 38F and cross-sectional views in the channel width direction in FIGS. 37C and 37D. When the conductive layer 173 is used as a second gate electrode layer (back gate), the on-state current can be increased or the threshold voltage can be controlled. In the cross-sectional views in FIGS. 38A to 38F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 37D, the conductive layers 170 and 173 may be electrically connected to each other through a contact hole.

Although the transistors 101 to 106 in FIGS. 35A to 35F and FIGS. 36A to 36F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIGS. 39B and 39C or FIGS. 39D and 39E.

Figure 39A:
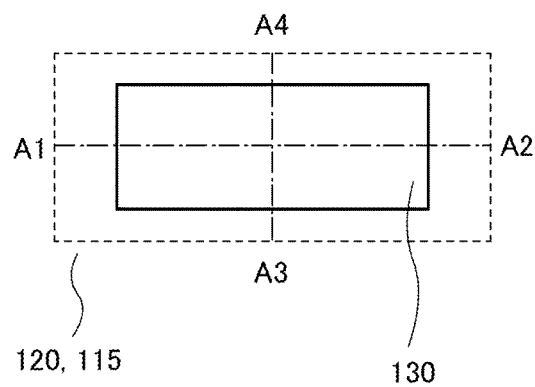
FIGS. 39A to 39E are a top view and cross-sectional views illustrating a semiconductor layer.
Figure 39B:
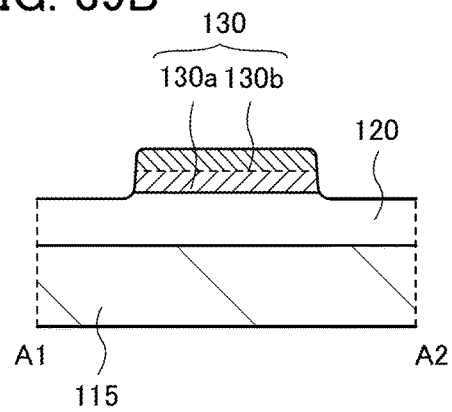
Figure 39D:
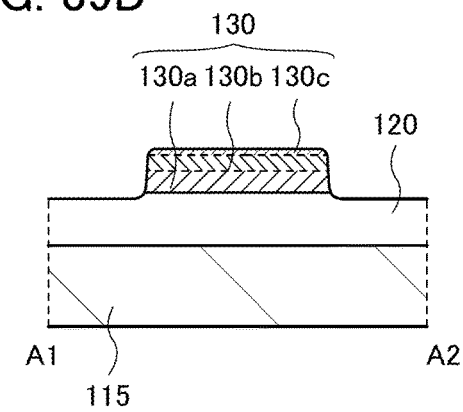
Figure 39C:
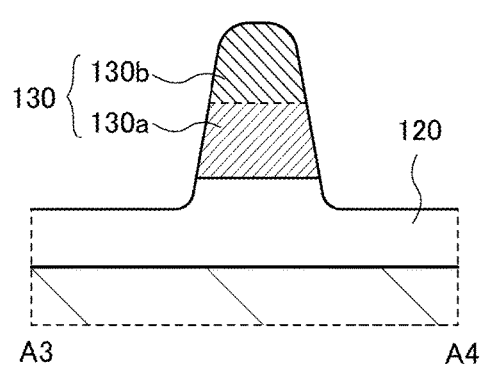
Figure 39E:
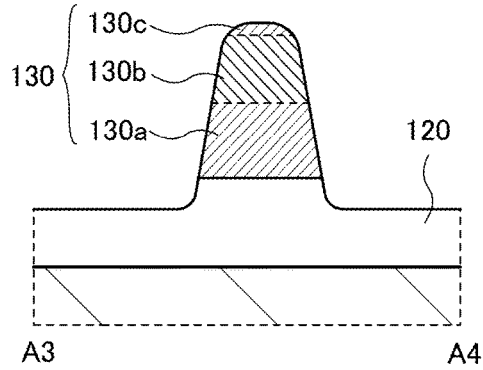

FIG. 39A is a top view of the oxide semiconductor layer 130, and FIGS. 39B and 39C are cross-sectional views of the oxide semiconductor layer 130 with a two-layer structure. FIGS. 39D and 39E are cross-sectional views of the oxide semiconductor layer 130 with a three-layer structure.

Oxide semiconductor layers with different compositions, for example, can be used as an oxide semiconductor layer 130*a*, an oxide semiconductor layer 130*b*, and an oxide semiconductor layer 130*c*.

Figure 40A:
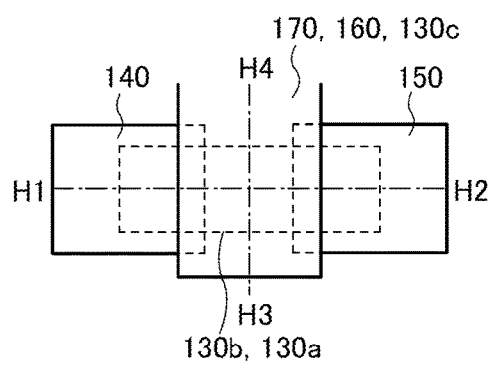
FIGS. 40A to 40F are top views and cross-sectional views illustrating transistors.
Figure 40B:
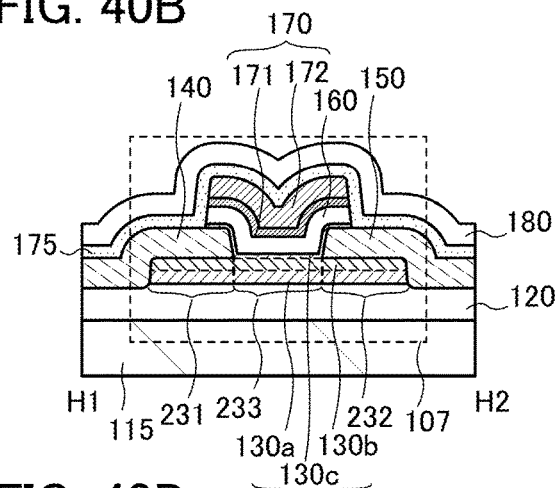
Figure 42A:
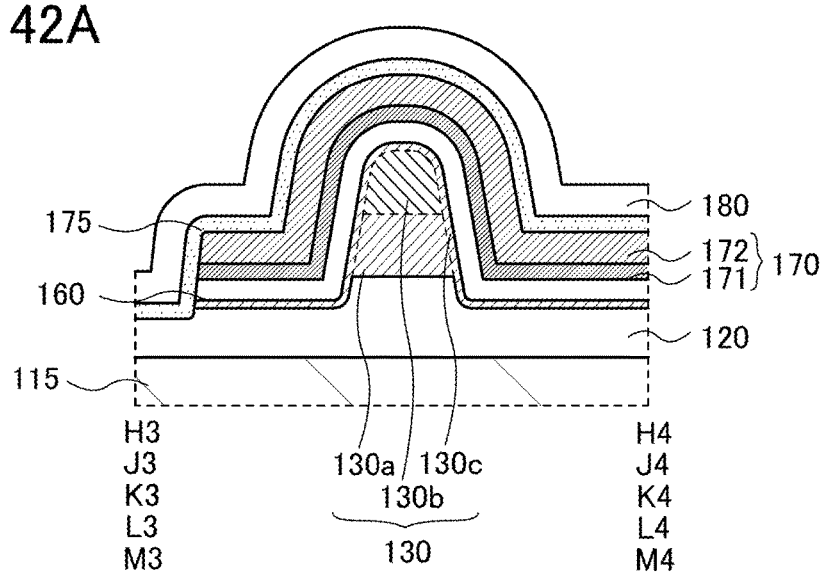
FIGS. 42A to 42D each illustrate a cross section of a transistor in a channel width direction.

The transistor in one embodiment of the present invention may have a structure illustrated in FIGS. 40A and 40B. FIG. 40A is a top view of a transistor 107. A cross section in the direction of dashed-dotted line H1-H2 in FIG. 40A is illustrated in FIG. 40B. A cross section in the direction of dashed-dotted line H3-H4 in FIG. 40A is illustrated in FIG. 42A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130*a* and 130*b* in contact with the insulating layer 120; the conductive layers 140 and 150 electrically connected to the stack; the oxide semiconductor layer 130*c* in contact with the stack and the conductive layers 140 and 150; the insulating layer 160 in contact with the oxide semiconductor layer 130*c*; the conductive layer 170 in contact with the insulating layer 160; the insulating layer 175 in contact with the conductive layers 140 and 150, the oxide semiconductor layer 130*c*, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130*a* and 130*b*) in the regions 231 and 232, that the oxide semiconductor layer 130 includes three layers (the oxide semiconductor layers 130*a* to 130*c*) in the region 233, and that part of the oxide semiconductor layer (the oxide semiconductor layer 130*c*) exists between the insulating layer 160 and the conductive layers 140 and 150.

Figure 40C:
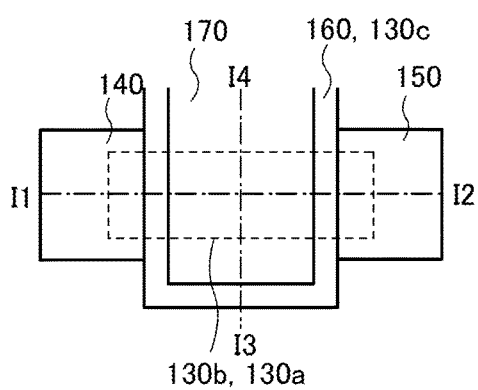
Figure 40D:
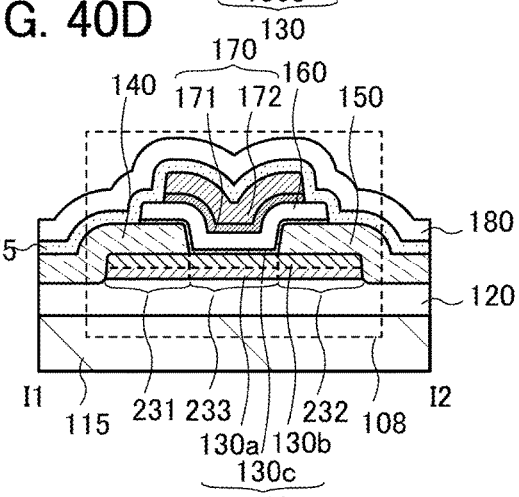
Figure 42B:
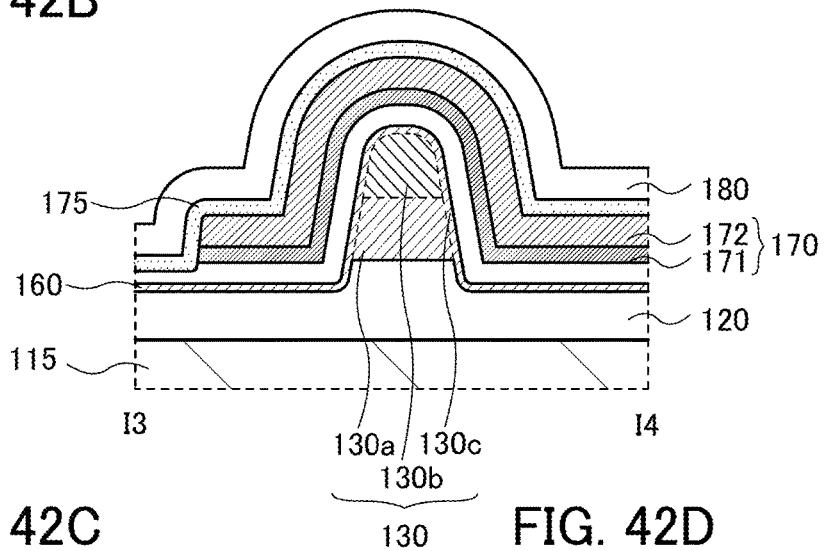

The transistor in one embodiment of the present invention may have a structure illustrated in FIGS. 40C and 40D. FIG. 40C is a top view of a transistor 108. A cross section in the direction of dashed-dotted line I1-I2 in FIG. 40C is illustrated in FIG. 40D. A cross section in the direction of dashed-dotted line I3-I4 in FIG. 40C is illustrated in FIG. 42B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130*c* are not aligned with the end portion of the conductive layer 170.

Figure 40E:
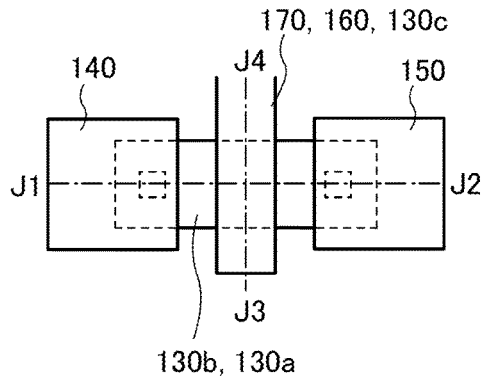
Figure 40F:
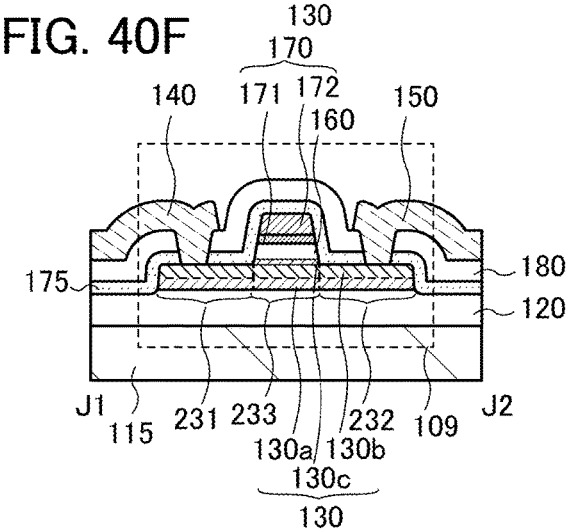

The transistor in one embodiment of the present invention may have a structure illustrated in FIGS. 40E and 40F. FIG. 40E is a top view of a transistor 109. A cross section in the direction of dashed-dotted line J1-J2 in FIG. 40E is illustrated in FIG. 40F. A cross section in the direction of dashed-dotted line J3-J4 in FIG. 40E is illustrated in FIG. 42A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130*a* and 130*b* in contact with the insulating layer 120; the oxide semiconductor layer 130*c* in contact with the stack; the insulating layer 160 in contact with the oxide semiconductor layer 130*c*; the conductive layer 170 in contact with the insulating layer 160; the insulating layer 175 covering the stack, the oxide semiconductor layer 130*c*, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130*a* and 130*b*) in the regions 231 and 232 and that the oxide semiconductor layer 130 includes three layers (the oxide semiconductor layers 130*a* to 130*c*) in the region 233.

The transistor in one embodiment of the present invention may have a structure illustrated in FIGS. 41A and 41B. FIG. 41A is a top view of a transistor 110. A cross section in the direction of dashed-dotted line K1-K2 in FIG. 41A is illustrated in FIG. 41B. A cross section in the direction of dashed-dotted line K3-K4 in FIG. 41A is illustrated in FIG. 42A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130*a* and 130*b*) in the regions 331 and 332 and that the oxide semiconductor layer 130 includes three layers (the oxide semiconductor layers 130*a* to 130*c*) in the region 333.

The transistor in one embodiment of the present invention may have a structure illustrated in FIGS. 41C and 41D. FIG. 41C is a top view of a transistor 111. A cross section in the direction of dashed-dotted line L1-L2 in FIG. 41C is illustrated in FIG. 41D. A cross section in the direction of dashed-dotted line L3-L4 in FIG. 41C is illustrated in FIG. 42A. The direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130*a* and 130*b* in contact with the insulating layer 120; the conductive layers 141 and 151 electrically connected to the stack; the oxide semiconductor layer 130*c* in contact with the stack and the conductive layers 141 and 151; the insulating layer 160 in contact with the oxide semiconductor layer 130*c*; the conductive layer 170 in contact with the insulating layer 160; the insulating layer 175 in contact with the stack, the conductive layers 141 and 151, the oxide semiconductor layer 130*c*, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130*a* and 130*b*)

in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

The transistor in one embodiment of the present invention may have a structure illustrated in FIGS. 41E and 41F. FIG. 41E is a top view of a transistor 112. A cross section in the direction of dashed-dotted line M1-M2 in FIG. 41E is illustrated in FIG. 41F. A cross section in the direction of dashed-dotted line M3-M4 in FIG. 41E is illustrated in FIG. 42A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 42C:
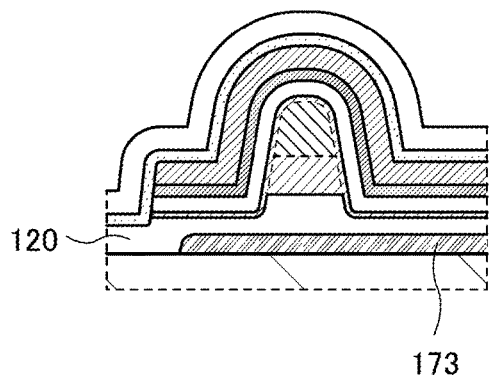
Figure 42D:
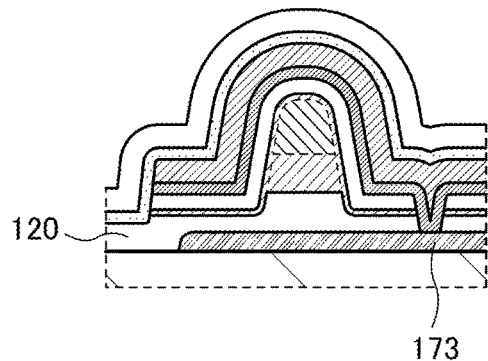
Figure 43A:
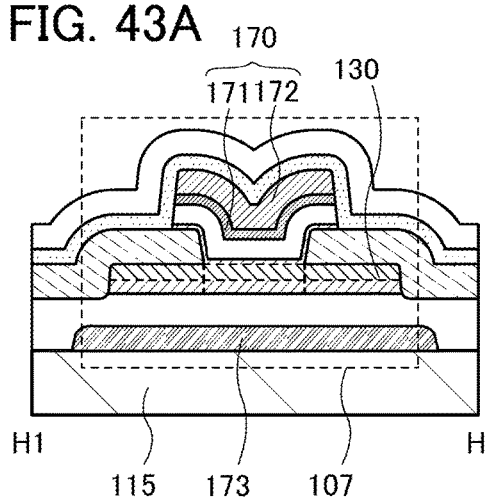
FIGS. 43A to 43F each illustrate a cross section of a transistor in a channel length direction.
Figure 43B:
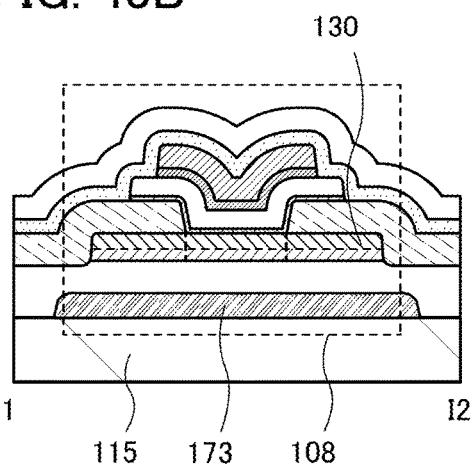
Figure 43C:
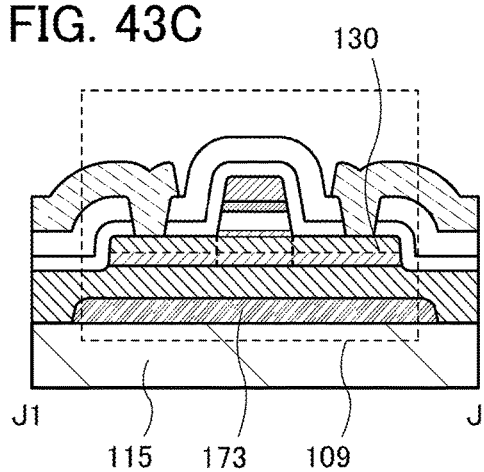
Figure 43D:
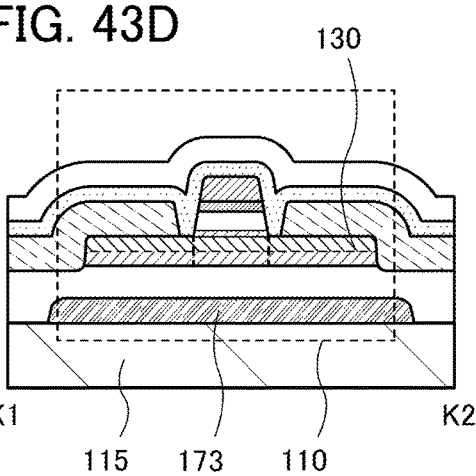
Figure 43E:
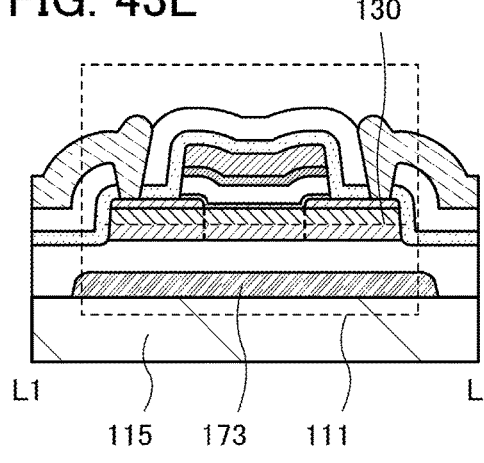
Figure 43F:
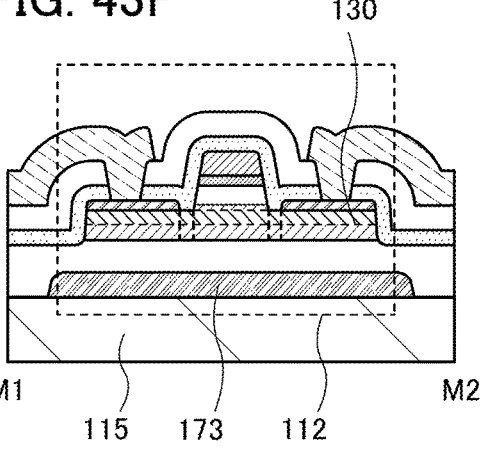

The transistor in one embodiment of the present invention may include the conductive layer 173 between the oxide semiconductor layer 130 and the substrate 115 as illustrated in cross-sectional views in the channel length direction in FIGS. 43A to 43F and cross-sectional views in the channel width direction in FIGS. 42C and 42D. When the conductive layer is used as a second gate electrode layer (back gate), the on-state current can be increased or the threshold voltage can be controlled. In the cross-sectional views in FIGS. 43A to 43F, the width of the conductive layer 173 may be shorter than that of the oxide semiconductor layer 130. Moreover, the width of the conductive layer 173 may be shorter than that of the conductive layer 170.

Figure 44A:
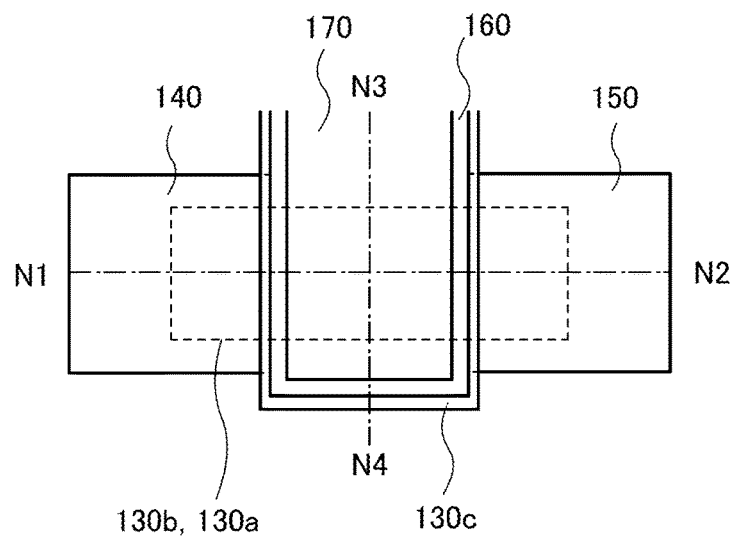
FIGS. 44A and 44B are a top view and cross-sectional views illustrating a transistor.
Figure 44B:
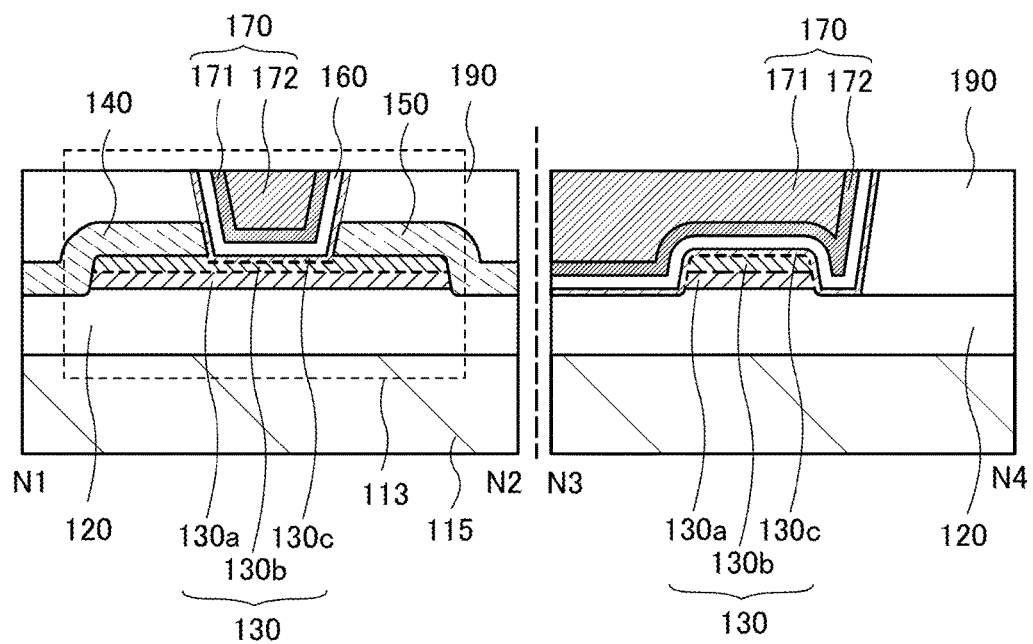

The transistor in one embodiment of the present invention may have a structure illustrated in FIGS. 44A and 44B. FIG. 44A is a top view and FIG. 44B is a cross-sectional view taken along dashed-dotted line N1-N2 and dashed-dotted line N3-N4 in FIG. 44A. Note that for simplification of the drawing, some components are not illustrated in the top view in FIG. 44A.

A transistor 113 illustrated in FIGS. 44A and 44B includes the substrate 115, the insulating layer 120 over the substrate 115, the oxide semiconductor layer 130 (the oxide semiconductor layer 130a, the oxide semiconductor layer 130b, and the oxide semiconductor layer 130c) over the insulating layer 120, the conductive layers 140 and 150 which are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130c, the insulating layer 160, and the conductive layer 170 are provided in an opening which is provided in the insulating layer 190 over the transistor 113 and reaches the oxide semiconductor layers 130a and 130b and the insulating layer 120.

The transistor 113 has a smaller region in which a conductor serving as a source electrode or a drain electrode overlaps with a conductor serving as a gate electrode than the other transistors described above; thus, the parasitic capacitance in the transistor 113 can be reduced. Therefore, the transistor 113 is preferable as a component of a circuit for which high-speed operation is needed. As illustrated in FIG. 44B, a top surface of the transistor 113 is preferably planarized by a chemical mechanical polishing (CMP) method or the like, but is not necessarily planarized.

Figure 45A:
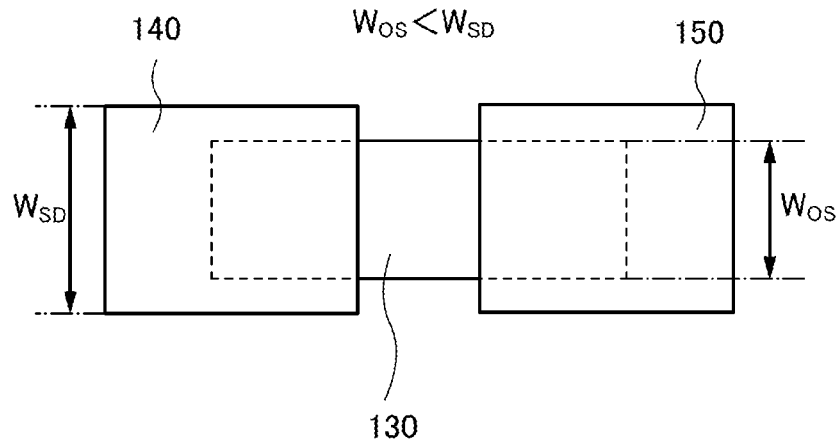
FIGS. 45A to 45C are top views illustrating a transistor.
Figure 45B:
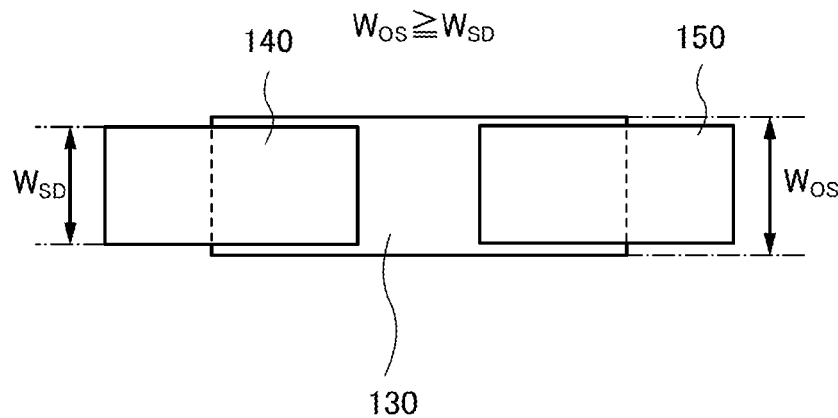
Figure 45C:
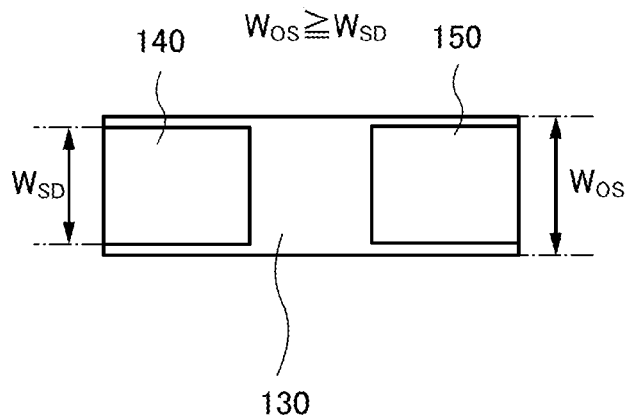

As shown in the top views in FIGS. 45A and 45B (showing only the oxide semiconductor layer 130, the conductive layer 140, and the conductive layer 150), the widths ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 45C, the conductive layers 140 and 150 may be formed only in a region that overlaps with the oxide semiconductor layer 130.

In the transistor in one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering, leading to a high on-state current. Thus, increasing the thickness of the oxide semiconductor layer 130b improves the on-state current in some cases.

With the above structure, the electrical characteristics of the transistor can be improved.

The structures described in this embodiment can be used in appropriate combination with any of the structures described in the other embodiments.

Embodiment 3

In this embodiment, components of the transistors described in Embodiment 2 will be described in detail.

As the substrate 115, a glass substrate, a quartz substrate, a semiconductor substrate, a ceramic substrate, a metal substrate with an insulated surface, or the like can be used. Alternatively, a silicon substrate provided with a transistor, a photodiode, or the like can be used, and an insulating layer, a wiring, a conductor functioning as a contact plug, and the like may be provided over the silicon substrate. Note that when p-channel transistors are formed using the silicon substrate, a silicon substrate with n⁻-type conductivity is preferably used. Alternatively, an SOI substrate including an n⁻-type or i-type silicon layer may be used. In the case where a p-channel transistor is formed on the silicon substrate, it is preferable to use a silicon substrate in which a plane where the transistor is formed is a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0\times 10^{19}$ atoms/cm$^3$ in TDS analysis. In the TDS analysis, the film surface temperature is higher than or equal to 100° C. and lower than or equal to 700° C., or higher than or equal to 100° C. and lower than or equal to 500° C. In the case where the substrate 115 is provided with another device, the insulating layer 120 also has a function of an interlayer insulating film. In that case, the insulating layer 120 is preferably subjected to planarization treatment such as chemical mechanical polishing (CMP) treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which layers corresponding to the oxide semiconductor layer 130a and the oxide semiconductor layer 130b described in this embodiment are sequentially stacked from the insulating layer 120 side is used. In such a case, the oxide semiconductor layers 130a and 130b can be replaced with each other.

In the case where the oxide semiconductor layer 130 has a layered structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layers 130a and 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 130a and 130c each contain one or more kinds of metal elements contained in the oxide semiconductor layer 130b. For example, the oxide semiconductor layers 130a and 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layer 130a and the oxide semiconductor layer 130c can be regarded as having a region serving as an insulator or a semi-insulator.

Furthermore, since the oxide semiconductor layer 130a contains one or more kinds of metal elements contained in the oxide semiconductor layer 130b, an interface state is unlikely to be formed at the interface between the oxide semiconductor layers 130a and 130b, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, variations in electrical characteristics of the transistor, such as a threshold voltage, can be reduced. Moreover, the reliability of the transistor can be improved.

Since the oxide semiconductor layer 130c contains one or more kinds of metal elements contained in the oxide semiconductor layer 130b, scattering of carriers is unlikely to occur at the interface between the oxide semiconductor layers 130b and 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layers 130a and 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio of any of the above metal elements in the oxide semiconductor layers 130a and 130c is 1.5 or more times, preferably 2 or more times, further preferably 3 or more times as large as that in the oxide semiconductor layer 130b. Any of the above metal elements is strongly bonded to oxygen and thus has a function of suppressing generation of an oxygen vacancy in the oxide semiconductor layers. That is, an oxygen vacancy is less likely to be generated in the oxide semiconductor layers 130a and 130c than in the oxide semiconductor layer 130b.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $InZnSnO_5(ZnO)_n$ (n>0, where n is an integer) may be used.

When each of the oxide semiconductor layers 130a to 130c is an In-M-Zn oxide containing at least indium, zinc, and M (M is a metal such as Al, Ti, Ga, Ge, Y, Zr, Sn, La, Ce, and Hf), in the case where the oxide semiconductor layer 130a has an atomic ratio of In to M to Zn which is $x_1:y_1:z_1$, the oxide semiconductor layer 130b has an atomic ratio of In to M to Zn which is $x_2:y_2:z_2$, and the oxide semiconductor layer 130c has an atomic ratio of In to M to Zn which is $x_3:y_3:z_3$, each of $y_1/x_1$ and $y_3/x_3$ is preferably larger than $y_2/x_2$. Each of $y_1/x_1$ and $y_3/x_3$ is 1.5 or more times, preferably 2 or more times, more preferably 3 or more times as large as $y_2/x_2$. At this time, when $y_2$ is greater than or equal to $x_2$ in the oxide semiconductor layer 130b, the transistor can have stable electrical characteristics. However, when $y_2$ is 3 or more times as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 130a and 130c are preferably less than 50 atomic % and greater than or equal to 50 atomic %, respectively, more preferably less than 25 atomic % and greater than or equal to 75 atomic %, respectively. Furthermore, in the case where Zn and O are not taken into consideration, the proportion of In and the proportion of M in the oxide semiconductor layer 130b are preferably greater than or equal to 25 atomic % and less than 75 atomic %, respectively, more preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, more preferably greater than or equal to 5 nm and less than or equal to 25 nm. The thickness of the oxide semiconductor layer 130b is greater than or equal to 3 nm and less than or equal to 200 nm, preferably greater than or equal to 5 nm and less than or equal to 150 nm, more preferably greater than or equal to 10 nm and less than or equal to 100 nm. The thickness of the oxide semiconductor layer 130c is greater than or equal to 1 nm and less than or equal to 50 nm, preferably greater than or equal to 2 nm and less than or equal to 30 nm, more preferably greater than or equal to 3 nm and less than or equal to 15 nm. In addition, the oxide semiconductor layer 130b is preferably thicker than the oxide semiconductor layer 130c.

In order that a transistor in which a channel is formed in an oxide semiconductor layer can have stable electrical characteristics, it is effective to make the oxide semiconductor layer intrinsic (i-type) or substantially intrinsic by reducing the concentration of impurities in the oxide semiconductor layer. The term "substantially intrinsic" refers to a state where an oxide semiconductor layer has a carrier density lower than $1\times10^{19}/cm^3$, lower than $1\times10^{15}/cm^3$, lower than $1\times10^{13}/cm^3$, or lower than $1\times10^{8}/cm^3$, and higher than or equal to $1\times10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer.

The impurity levels serve as traps and might cause deterioration of electrical characteristics of the transistor. Therefore, it is preferable to reduce the concentration of the impurities in the oxide semiconductor layers 130a to 130c and at interfaces between the oxide semiconductor layers.

In order to make the oxide semiconductor layer intrinsic or substantially intrinsic, the oxide semiconductor layer is controlled to have a region in which the concentration of hydrogen estimated by secondary ion mass spectrometry (SIMS) is lower than or equal to $2\times10^{20}$ atoms/$cm^3$, preferably lower than or equal to $5\times10^{19}$ atoms/$cm^3$, more preferably lower than or equal to $1\times10^{19}$ atoms/$cm^3$, still more preferably lower than or equal to $5\times10^{18}$ atoms/$cm^3$ and is higher than or equal to $1\times10^{17}$ atoms/$cm^3$. In addition, the oxide semiconductor layer is controlled to have a region in which the concentration of nitrogen is lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, still more preferably lower than or equal to $5\times10^{17}$ atoms/$cm^3$ and is higher than or equal to $5\times10^{16}$ atoms/$cm^3$.

The high concentration of silicon or carbon might reduce the crystallinity of the oxide semiconductor layer. In order not to lower the crystallinity of the oxide semiconductor layer, the oxide semiconductor layer is controlled to have a region in which the concentration of silicon is lower than $1\times10^{19}$ atoms/$cm^3$, preferably lower than $5\times10^{18}$ atoms/$cm^3$ and is higher than or equal to $1\times10^{18}$ atoms/$cm^3$. Furthermore, the oxide semiconductor layer is controlled to have a region in which the concentration of carbon is lower than $1\times10^{19}$ atoms/$cm^3$, preferably lower than $5\times10^{18}$ atoms/$cm^3$, more preferably lower than $1\times10^{18}$ atoms/$cm^3$ and is higher than or equal to $6\times10^{17}$ atoms/$cm^3$.

As described above, a transistor in which a highly purified oxide semiconductor film is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor of one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating film.

Accordingly, with the oxide semiconductor layer 130 having a layered structure including the oxide semiconductor layers 130a to 130c, a channel can be formed in the oxide semiconductor layer 130b; thus, the transistor can have high field-effect mobility and stable electrical characteristics.

In a band structure, the conduction band minimum changes continuously within the oxide semiconductor layers 130a to 130c. This can be understood also from the fact that the compositions of the oxide semiconductor layers 130a to 130c are close to one another and oxygen is easily diffused among the oxide semiconductor layers 130a to 130c. Thus, the oxide semiconductor layers 130a to 130c have a continuous physical property though they have different compositions and form a stack. In the drawings, interfaces between the oxide semiconductor layers of the stack are indicated by dotted lines.

The oxide semiconductor layer 130 in which layers containing the same main components are stacked is formed to have not only a simple layered structure of the layers but also continuous junction (here, in particular, a well structure having a U shape in which the conduction band minimum is continuously changed between the layers (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga to Zn is 1:3:2, 1:3:3, 1:3:4, 1:3:6, 1:4:5, 1:6:4, or 1:9:6 can be used for the oxide semiconductor layers 130a and 130c, and an In—Ga—Zn oxide whose atomic ratio of In to Ga to Zn is 1:1:1, 2:1:3, 5:5:6, 3:1:2, 4:2:3, or 4:2:4.1 can be used for the oxide semiconductor layer 130b. In the case where the oxide semiconductor layers 130a, 130b, and 130c are formed using the above-described oxides as sputtering targets, the atomic ratios of the oxide semiconductor layers are not necessarily consistent with those of their respective sputtering targets and may vary from those of the sputtering targets within a range of ±40%.

The oxide semiconductor layer 130b of the oxide semiconductor layer 130 serves as a well, so that a channel is formed in the oxide semiconductor layer 130b. Since the conduction band minimum is continuously changed, the oxide semiconductor layer 130 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 130a and 130c. The oxide semiconductor layer 130b can be distanced away from the trap levels owing to the existence of the oxide semiconductor layers 130a and 130c.

However, when the energy differences between the conduction band minimum of the oxide semiconductor layer 130b and the conduction band minimum of each of the oxide semiconductor layers 130a and 130c are small, an electron in the oxide semiconductor layer 130b might reach the trap level by passing over the energy differences. When the electron is trapped in the trap level, negative charge is generated at the interface with the insulating layer, so that the threshold voltage of the transistor is shifted in the positive direction.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus allows subsequent processes to be performed at relatively high temperatures. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor film. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a layered structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the these examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide increases in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film which releases ammonia more than nitrogen oxide in TDS; the amount of released ammonia is typically greater than or equal to $1 \times 10^{18}/cm^3$ and less than or equal to $5 \times 10^{19}/cm^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 2, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in on-state current.

Furthermore, in the transistor in one embodiment of the present invention in which the oxide semiconductor layer 130 has a two-layer structure or a three-layer structure, since the oxide semiconductor layer 130b where a channel is formed is provided over the oxide semiconductor layer 130a, an interface state is less likely to be formed. In the transistor in one embodiment of the present invention in which the oxide semiconductor layer 130 has a three-layer structure, since the oxide semiconductor layer 130b is positioned at the middle of the three-layer structure, the influence of an impurity that enters from upper and lower layers on the oxide semiconductor layer 130b can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide)hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O film is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 4

A structure of an oxide semiconductor film that can be used in one embodiment of the present invention will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. Furthermore, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 46A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the $InGaZnO_4$ crystal. When analysis (ϕ scan) is performed with 2θ fixed at around 56° and with the sample rotated using a normal vector to the sample surface as an axis (ϕ axis), as shown in FIG. 46B, a peak is not clearly observed. In contrast, in the case where single crystal $InGaZnO_4$ is subjected to ϕ scan with 2θ fixed at around 56°, as shown in FIG. 46C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 46D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 46E shows a diffraction pattern obtained in such a manner that an electron beam with a probe diameter of 300 nm is incident on the same sample in a direction perpendicular to the sample surface. As shown in FIG. 46E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 46E is considered to be derived from the (010) plane, the (100) plane, and the like of the $InGaZnO_4$ crystal. The second ring in FIG. 46E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 47A:
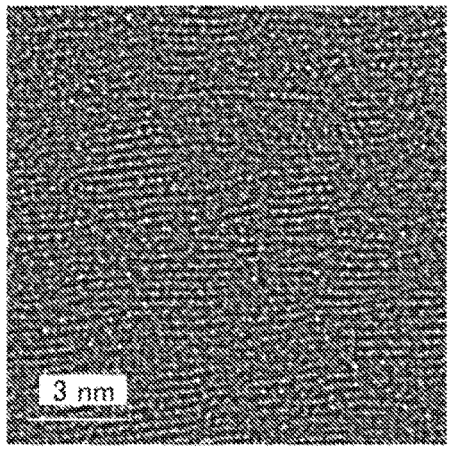
FIGS. 47A to 47E show a cross-sectional TEM image and plan-view TEM images of a CAAC-OS and images obtained through analysis thereof.

FIG. 47A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 47A shows pellets in which metal atoms are arranged in a layered manner. FIG. 47A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 47B:
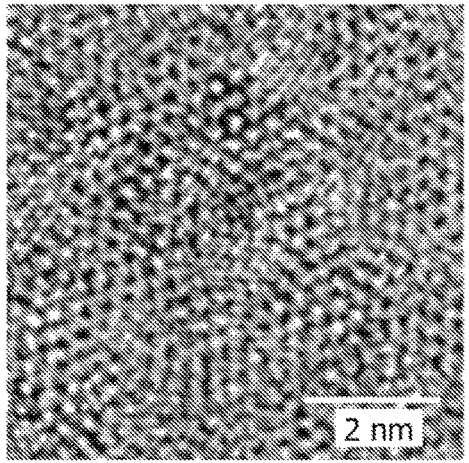
Figure 47C:
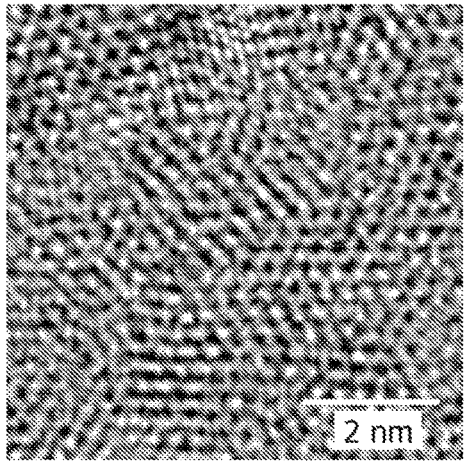
Figures 47D, 47E:
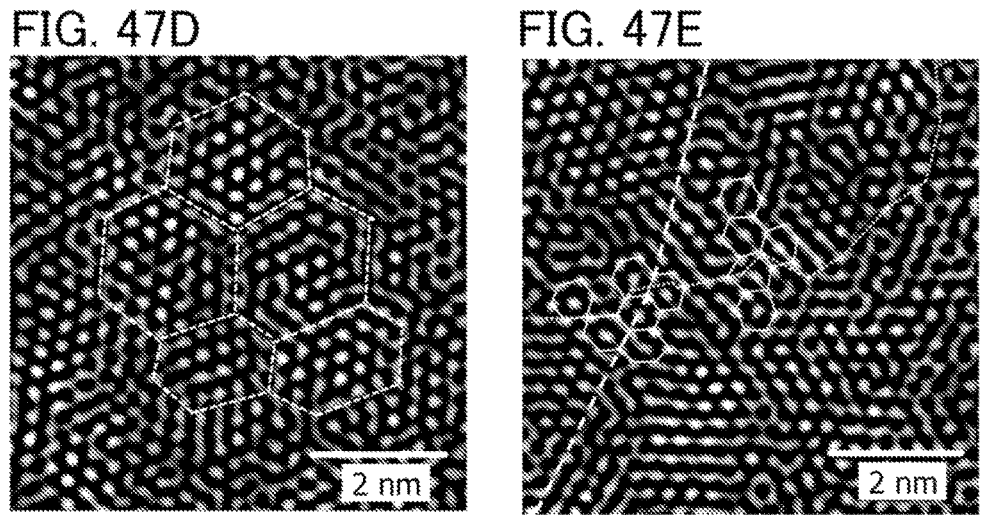

FIGS. 47B and 47C show Cs-corrected high-resolution TEM images of a plane of the CAAC-OS observed from a direction substantially perpendicular to the sample surface. FIGS. 47D and 47E are images obtained through image processing of FIGS. 47B and 47C. The method of image processing is as follows. The image in FIG. 47B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 47D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 47E, a dotted line denotes a portion between a region where a lattice arrangement is well aligned and another region where a lattice arrangement is well aligned, and a dashed line denotes the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in an oxide semiconductor might serve as carrier traps or carrier generation sources, for example. For example, oxygen vacancies in an oxide semiconductor might serve as carrier traps or serve as carrier generation sources when hydrogen is captured therein.

A CAAC-OS having small amounts of impurities and oxygen vacancies is an oxide semiconductor with a low carrier density (specifically, lower than $8\times10^{11}/cm^3$, preferably lower than $1\times10^{11}/cm^3$, more preferably lower than $1\times10^{10}/cm^3$, and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, a CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 48A:
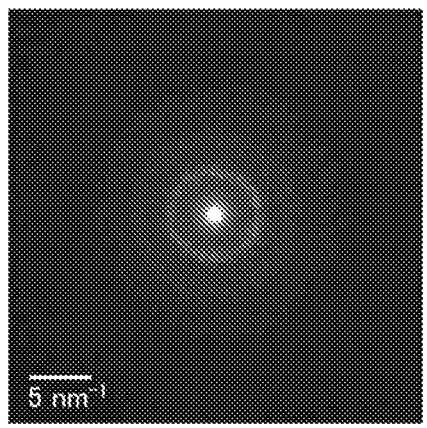
FIGS. 48A to 48D show electron diffraction patterns and a cross-sectional TEM image of an nc-OS.
Figure 48B:
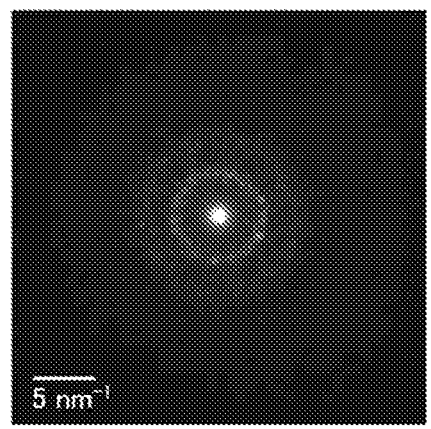

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 48A is observed. FIG. 48B shows a diffraction pattern (a nanobeam electron diffraction pattern) obtained when an electron beam with a probe diameter of 1 nm is incident on the same sample. As shown in FIG. 48B, a plurality of spots are observed in a ring-like region. In other words, ordering in an nc-OS is not observed with an electron beam with a probe diameter of 50 nm but is observed with an electron beam with a probe diameter of 1 nm.

Figure 48C:
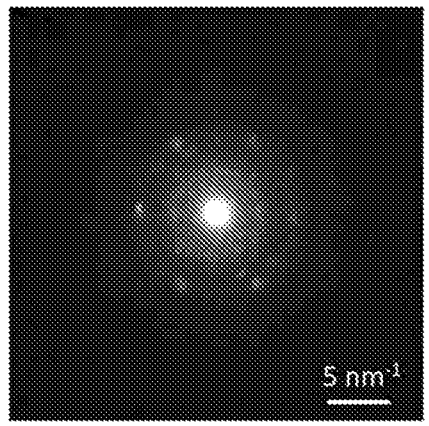

Furthermore, an electron diffraction pattern in which spots are arranged in an approximately hexagonal shape is observed in some cases as shown in FIG. 48C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 48D:
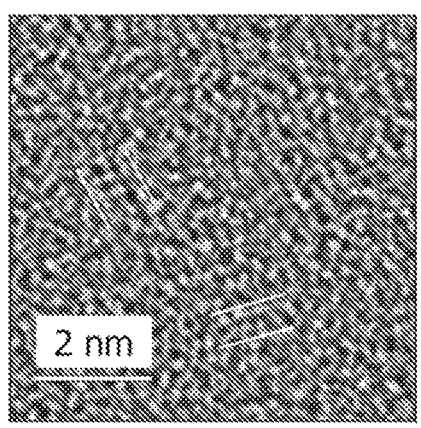

FIG. 48D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 48D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS has a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

FIGS. 49A and 49B are high-resolution cross-sectional TEM images of an a-like OS. FIG. 49A is the high-resolution cross-sectional TEM image of the a-like OS at the start of the electron irradiation. FIG. 49B is the high-resolution cross-sectional TEM image of the a-like OS after the electron ($e^-$) irradiation at $4.3 \times 10^8$ $e^-/nm^2$. FIGS. 49A and 49B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 50:
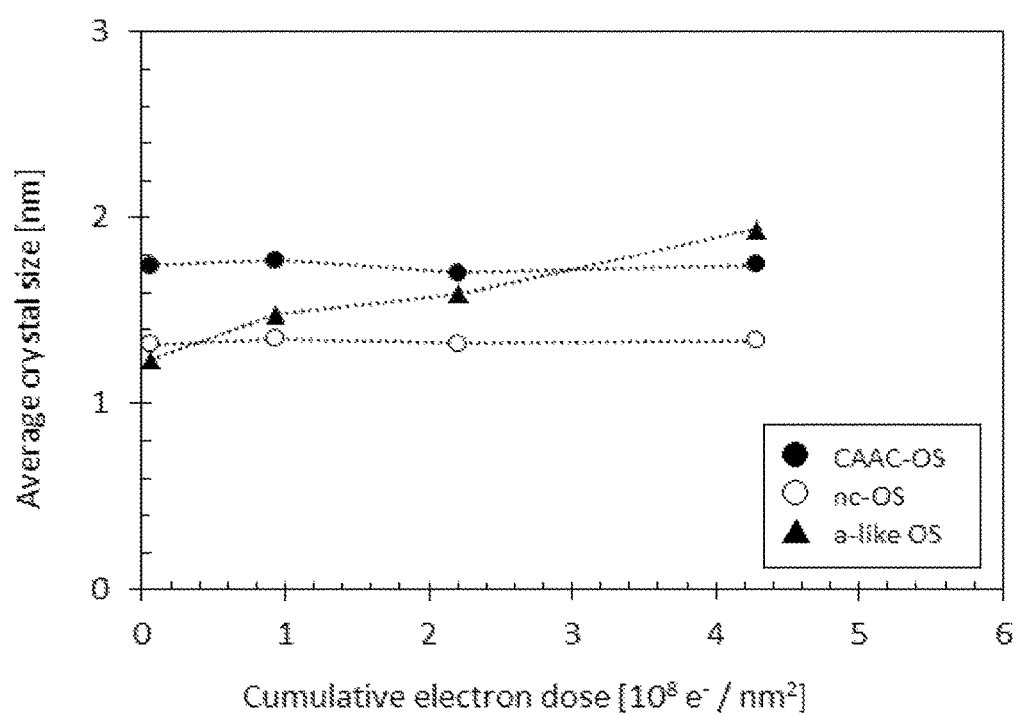
FIG. 50 shows a change in a crystal part of an In—Ga—Zn oxide induced by electron irradiation.

FIG. 50 shows change in the average size of crystal parts (at 22 points to 30 points) in each sample. Note that the crystal part size corresponds to the length of a lattice fringe. FIG. 50 indicates that the crystal part size in the a-like OS increases with an increase in the cumulative electron dose in obtaining TEM images, for example. As shown in FIG. 50, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 50, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

The structures described in this embodiment can be used in appropriate combination with any of the structures described in the other embodiments.

Embodiment 5

In this embodiment, examples of a package and a module each including an image sensor chip will be described. For the image sensor chip, the structure of an imaging device of one embodiment of the present invention can be used.

Figure 51A:
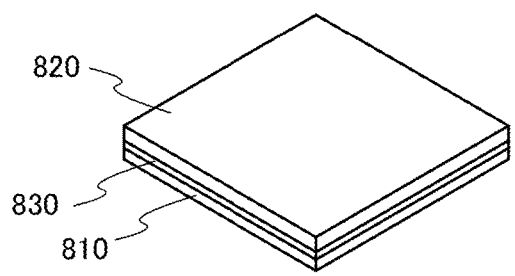
FIGS. 51A to 51D are perspective views and a cross-sectional view of a package including an imaging device.

FIG. 51A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 51B:
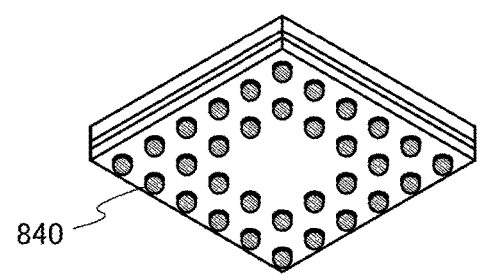

FIG. 51B is an external perspective view showing the bottom surface side of the package. On the bottom surface of the package, ball grid array (BGA) including solder balls as bumps 840 is formed. Although BGA is employed here, land grid array (LGA), pin grid array (PGA), or the like may be alternatively employed.

Figure 51C:
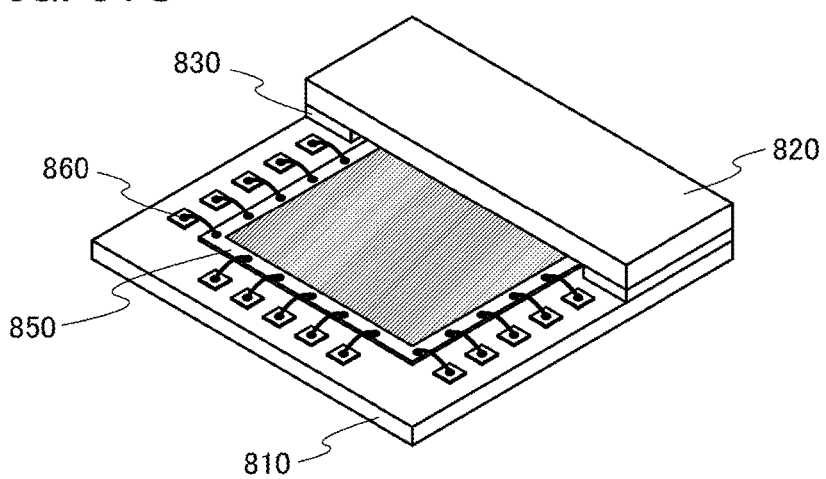
Figure 51D:
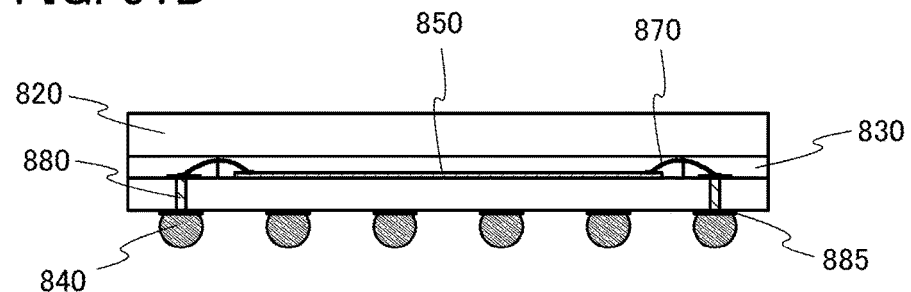

FIG. 51C is a perspective view of the package, in which the cover glass 820 and the adhesive 830 are partly illustrated. FIG. 51D is a cross-sectional view of the package. Electrode pads 860 are formed over the package substrate 810, and electrically connected to the bumps 840 through through-holes 880 and lands 885. The electrode pads 860 are electrically connected to electrodes of the image sensor chip 850 through wires 870.

FIG. 52A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, a system in package (SiP) is formed.

FIG. 52B is an external perspective view showing the bottom surface side of the camera module. On the bottom surface and four side surfaces of the package substrate 811, mounting lands 841 are provided; this structure can be called a quad flat no-lead package (QFN). Although QFN is employed here, quad flat package (QFP), the above BGA, or the like may be alternatively employed.

FIG. 52C is a perspective view of the module, in which the lens cover 821 and the lens 835 are partly illustrated. FIG. 52D is a cross-sectional view of the camera module. The lands 841 are partly used as the electrode pads 861. The electrode pads 861 are electrically connected to electrodes of the image sensor chip 851 and the IC chip 890 through wires 871.

The image sensor chip can be easily mounted on the package having the above structure, and can be incorporated into a variety of electronic devices.

The structures described in this embodiment can be used in appropriate combination with any of the structures described in the other embodiments.

Embodiment 6

Examples of an imaging device of one embodiment of the present invention and an electronic device provided with the imaging device include display devices, personal computers, image memory devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 53A to 53E illustrate specific examples of these electronic devices.

Figure 53A:
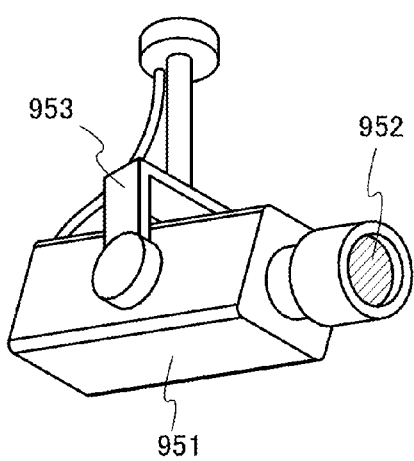
FIGS. 53A to 53E illustrate electronic devices.

FIG. 53A illustrates a monitoring camera, which includes a housing 951, a lens 952, a support portion 953, and the like. The imaging device of one embodiment of the present invention can be included as a component for obtaining an image in the monitoring camera. Note that a "monitoring camera" is a common name and does not limit the uses. For example, a device that has a function of a monitoring camera can also be called a camera or a video camera.

Figure 53B:
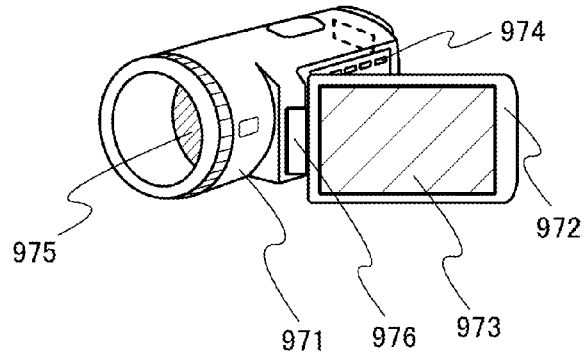

FIG. 53B illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The imaging device of one embodiment of the present invention can be included as a component for obtaining an image in the video camera.

Figure 53C:
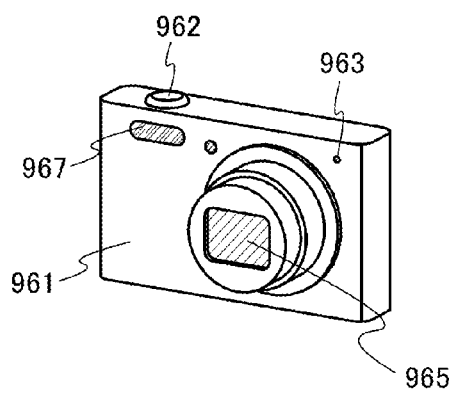

FIG. 53C illustrates a digital camera, which includes a housing 961, a shutter button 962, a microphone 963, a light-emitting portion 967, a lens 965, and the like. The imaging device of one embodiment of the present invention can be included as a component for obtaining an image in the digital camera.

Figure 53D:
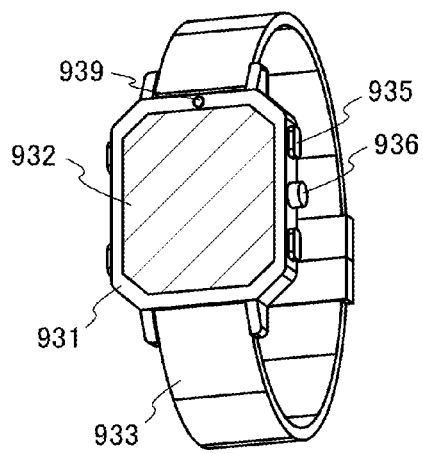

FIG. 53D illustrates a wrist-watch-type information terminal, which includes a housing 931, a display portion 932, a wristband 933, operation buttons 935, a winder 936, a camera 939, and the like. The display portion 932 may be a touch panel. The imaging device of one embodiment of the present invention can be included as a component for obtaining an image in the information terminal.

Figure 53E:
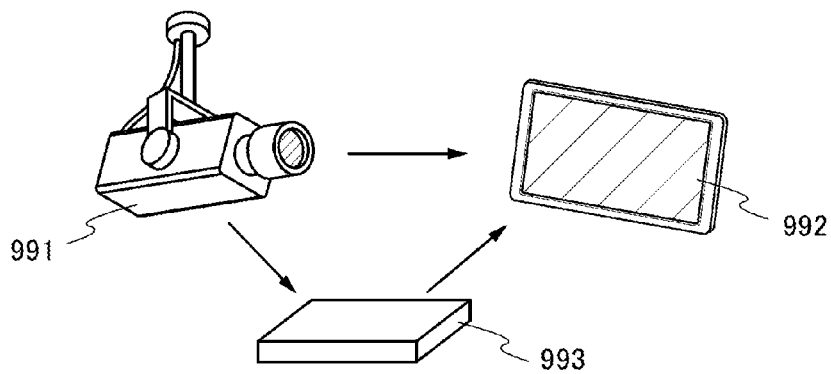

FIG. 53E illustrates an example of a system using the monitoring camera in FIG. 53A. A monitoring camera 991 is connected to a display device 992, so that an obtained image can be displayed on the display device 992. The monitoring camera 991 is connected to a memory device 993, so that data of an obtained image can be recorded in the memory device 993. The memory device 993 is connected to the display device 992, so that the image data recorded in the memory device 993 can be displayed on the display device 992. These components can be controlled with a personal computer or the like.

This embodiment can be combined with any of the other embodiments in this specification as appropriate.

This application is based on Japanese Patent Application serial no. 2015-118829 filed with Japan Patent Office on Jun. 12, 2015, the entire contents of which are hereby incorporated by reference.

What is claimed is:

1. An imaging device comprising:
a pixel;
a first circuit configured to convert an analog signal from the pixel into a digital signal;
a second circuit;
a third circuit configured to generate a first clock signal with a first frequency in a first mode and a second clock signal with a second frequency in a second mode; and
a fourth circuit configured to control frequency of a clock signal,
wherein the first circuit is configured to operate with the first clock signal to generate a first data in the first mode,
wherein the first circuit is configured to operate with the second clock signal to generate a second data in the second mode,
wherein the second circuit is configured to detect a difference between the first data and the second data,
wherein the first circuit comprises a counter circuit,
wherein the counter circuit comprises as many output terminals as a bit number of an output,
wherein the second circuit comprises:
a fifth circuit comprising a first input terminal, a second input terminal and a first output terminal, the fifth circuit configured to retain a logic signal supplied to the second input terminal and to output the logic signal from the first output terminal; and
a sixth circuit comprising a third input terminal, a fourth input terminal and a second output terminal,
wherein the fifth circuit operates in accordance with a logic signal supplied to the first input terminal,
wherein the sixth circuit is configured to output a first logic signal from the second output terminal when a logic signal supplied to the third input terminal corresponds to a logic signal supplied to the fourth input terminal, and to output a second logic signal from the second output terminal when the logic signal supplied to the third input terminal is different from the logic signal supplied to the fourth input terminal, wherein the first input terminal is electrically connected to the output terminal of the counter circuit for the most significant bit, wherein the first output terminal is electrically connected to the third input terminal, wherein the fourth input terminal is electrically connected to the output terminal of the counter circuit for a lower-order bit than the most significant bit, and wherein the second output terminal is electrically connected to the fourth circuit.

2. An imaging device comprising:

a pixel;

a first circuit configured to convert an analog signal from the pixel into a digital signal;

a second circuit; and a third circuit configured to generate a first clock signal with a first frequency in a first mode and a second clock signal with a second frequency in a second mode, wherein the first circuit is configured to operate with the first clock signal to generate a first data in the first mode, wherein the first circuit is configured to operate with the second clock signal to generate a second data in the second mode, wherein the second circuit is configured to detect a difference between the first data and the second data, wherein the third circuit comprises a first transistor, a second transistor, a third transistor, a fourth transistor and a seventh circuit, wherein a gate of the first transistor is electrically connected to one of a source and a drain of the third transistor, wherein a gate of the second transistor is electrically connected to one of a source and a drain of the fourth transistor, wherein the other of the source and the drain of the third transistor is electrically connected to the other of the source and the drain of the fourth transistor, wherein the seventh circuit comprises:
 a fifth input terminal electrically connected to a wiring suppling a first potential;
 a sixth input terminal electrically connected to one of a source and a drain of the first transistor;
 a seventh input terminal electrically connected to one of a source and a drain of the second transistor;
 an eighth input terminal;
 a third output terminal electrically connected to the eighth input terminal;
 an inverter circuit;
 a fifth transistor; and
a sixth transistor, wherein the third output terminal is electrically connected to the first circuit, wherein an output terminal of the inverter circuit is electrically connected to one of a source and a drain of the fifth transistor, wherein the output terminal of the inverter circuit is electrically connected to one of a source and a drain of the sixth transistor, wherein the other of the source and the drain of the fifth transistor is electrically connected to the other of the source and the drain of the sixth transistor, wherein a power supply potential input terminal of the inverter circuit functions as the fifth input terminal, wherein a gate of the fifth transistor functions as the sixth input terminal, wherein a gate of the sixth transistor functions as the seventh input terminal, wherein an input terminal of the inverter circuit functions as the eighth input terminal, and wherein the other of the source and the drain of the fifth transistor and the other of the source and the drain of the sixth transistor function as the third output terminal.

3. The imaging device according to claim 2, wherein an odd number of stages of the seventh circuits are connected in series, wherein the odd number is three or more, and wherein the eighth input terminal of the seventh circuit in the first stage is electrically connected to the third output terminal of the seventh circuit in the final stage.

4. The imaging device according to claim 2, further comprising a buffer circuit, wherein the third output terminal is electrically connected to an input terminal of the buffer circuit, and wherein an output terminal of the buffer circuit is electrically connected to the first circuit.

5. The imaging device according to claim 2, wherein each of the third transistor and the fourth transistor comprises an oxide semiconductor in an active layer, wherein the oxide semiconductor comprises In, Zn and M, and wherein M is Al, Ti, Ga, Sn, Y, Zr, La, Ce, Nd or Hf.

6. An imaging device comprising:

a pixel;

a first circuit configured to convert an analog signal into a digital signal, the first circuit electrically connected to the pixel;

a second circuit configured to detect a difference between image data of a first frame and image data of a second frame, the second circuit electrically connected to the first circuit;

a third circuit configured to control frequency of a clock signal, the third circuit electrically connected to the second circuit; and a fourth circuit comprising a first transistor, a second transistor, a third transistor, a fourth transistor and a seventh circuit, the fourth circuit electrically connected to the third circuit, wherein the fourth circuit is electrically connected to the first circuit, wherein a gate of the first transistor is electrically connected to one of a source and a drain of the third transistor, wherein a gate of the second transistor is electrically connected to one of a source and a drain of the fourth transistor, wherein the other of the source and the drain of the third transistor is electrically connected to the other of the source and the drain of the fourth transistor, wherein the seventh circuit comprises:
 an inverter circuit comprising a power supply potential input terminal, an input terminal and an output terminal;
 a fifth transistor; and
 a sixth transistor, wherein a gate of the fifth transistor is electrically connected to one of a source and a drain of the first transistor, wherein a gate of the sixth transistor is electrically connected to one of a source and a drain of the second transistor, wherein the output terminal of the inverter circuit is electrically connected to one of a source and a drain of the fifth transistor, wherein the output terminal of the inverter circuit is electrically connected to one of a source and a drain of the sixth transistor, wherein the input terminal of the inverter circuit is electrically connected to the other of the source and the drain of the fifth transistor, wherein the other of the source and the drain of the fifth transistor is electrically connected to the other of the source and the drain of the sixth transistor, and wherein the input terminal of the inverter circuit is electrically connected to the output terminal of the inverter circuit.

7. The imaging device according to claim 6, wherein an odd number of stages of the seventh circuits are connected in series, and wherein the odd number is three or more.

8. The imaging device according to claim 6, further comprising a buffer circuit, wherein the other of the source and the drain of the fifth transistor and the other of the source and the drain of the sixth transistor are electrically connected to an input terminal of the buffer circuit, and wherein an output terminal of the buffer circuit is electrically connected to the first circuit.

9. The imaging device according to claim 6, wherein each of the third transistor and the fourth transistor comprises an oxide semiconductor, wherein the oxide semiconductor comprises In, Zn, M and O, and wherein M is Al, Ti, Ga, Sn, Y, Zr, La, Ce, Nd or Hf.

10. The imaging device according to claim 6, wherein the pixel comprises a seventh transistor, an eighth transistor, a ninth transistor, a tenth transistor and a photoelectric conversion element, wherein one electrode of the photoelectric conversion element is electrically connected to one of a source and a drain of the seventh transistor, wherein the other of the source and the drain of the seventh transistor is electrically connected to one of a source and a drain of the eighth transistor, wherein the other of the source and the drain of the seventh transistor is electrically connected to one electrode of a capacitor, wherein the other of the source and the drain of the seventh transistor is electrically connected to a gate of the ninth transistor, and wherein one of a source and a drain of the ninth transistor is electrically connected to one of a source and a drain of the tenth transistor.

11. The imaging device according to claim 10, wherein the photoelectric conversion element comprises a photoelectric conversion layer, and wherein the photoelectric conversion layer comprises selenium or a compound comprising selenium.

12. An electronic device comprising:

the imaging device according to claim 6;

a display device; and a memory device.

* * * * *